United States Patent
Lim et al.

(10) Patent No.: US 11,062,775 B2
(45) Date of Patent: *Jul. 13, 2021

(54) NONVOLATILE MEMORY DEVICE AND STORAGE DEVICE INCLUDING NONVOLATILE MEMORY DEVICE

(71) Applicant: SAMSUNG ELECTRONICS CO., LTD., Suwon-si (KR)

(72) Inventors: Bongsoon Lim, Seoul (KR); Jung-Yun Yun, Seoul (KR); Ji-Suk Kim, Seoul (KR); Sang-Won Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,539

(22) Filed: Apr. 13, 2020

(65) Prior Publication Data
US 2020/0243140 A1 Jul. 30, 2020

Related U.S. Application Data

(63) Continuation of application No. 15/351,550, filed on Nov. 15, 2016, now Pat. No. 10,658,040.

(30) Foreign Application Priority Data

Nov. 26, 2015 (KR) .......................... 10-2015-0166120

(51) Int. Cl.
*G11C 16/10* (2006.01)
*G11C 16/34* (2006.01)
(Continued)

(52) U.S. Cl.
CPC .............. *G11C 16/10* (2013.01); *G11C 16/08* (2013.01); *G11C 16/26* (2013.01); *G11C 16/3459* (2013.01)

(58) Field of Classification Search
None
See application file for complete search history.

(56) References Cited

U.S. PATENT DOCUMENTS 5,519,847 A * 5/1996 Fandrich .............. G11C 7/1039
365/185.33
6,145,050 A 11/2000 Kaki et al.
(Continued)

FOREIGN PATENT DOCUMENTS

KR 20030052943 A 6/2003
KR 20150090369 A 8/2015

*Primary Examiner* — James G Norman
(74) *Attorney, Agent, or Firm* — Volentine, Whitt & Francos, PLLC

(57) ABSTRACT

A storage device includes a nonvolatile memory device and a controller. The controller provides the nonvolatile memory device with first data, an address, and a program start command and provides the nonvolatile memory device with second data after the program start command is provided the nonvolatile memory device. The nonvolatile memory device is configured to initiate a program operation, which is based on the first data, in response to the program start command and to continue to perform, based on the first data and the second data, the program operation when the second data is provided to the nonvolatile memory device. The nonvolatile memory device is configured to perform a program and a verification read of a first program loop based on the first data, the verification read of the first program loop being performed using one verification voltage.

20 Claims, 49 Drawing Sheets

(51) Int. Cl.
  *G11C 16/26* (2006.01)
  *G11C 16/08* (2006.01)

(56) References Cited

U.S. PATENT DOCUMENTS

| | | |
|---|---|---|
| 6,687,158 B2 | 2/2004 | Yano |
| 6,728,826 B2 | 4/2004 | Kaki et al. |
| 7,042,770 B2 | 5/2006 | Lee et al. |
| 7,243,185 B2 | 7/2007 | See et al. |
| 7,679,133 B2 | 3/2010 | Son et al. |
| 8,041,882 B2 | 10/2011 | Jachalsky et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,730,737 B2 | 5/2014 | Roohparvar |
| 2003/0117856 A1 | 6/2003 | Lee et al. |
| 2004/0141402 A1 | 7/2004 | Kim |
| 2005/0055481 A1 | 3/2005 | Chou et al. |
| 2006/0126390 A1* | 6/2006 | Gorobets ............ G11C 11/5628 365/185.22 |
| 2006/0133145 A1 | 6/2006 | Park et al. |
| 2007/0061538 A1 | 3/2007 | Chang et al. |
| 2008/0205161 A1 | 8/2008 | Kang |
| 2008/0250202 A1 | 10/2008 | Conley et al. |
| 2009/0121271 A1 | 5/2009 | Son et al. |
| 2011/0216603 A1 | 9/2011 | Han et al. |
| 2012/0051143 A1 | 3/2012 | Yoon et al. |
| 2013/0279262 A1 | 10/2013 | Yoon et al. |
| 2014/0211563 A1 | 7/2014 | Chang et al. |
| 2014/0219020 A1 | 8/2014 | Kwak et al. |

\* cited by examiner

FIG. 34

|  | E_P1 | | | E_P2 | | |
|---|---|---|---|---|---|---|
|  | DL1 | DL2 | FL | DL1 | DL2 | FL |
| Under VF | 0 | – | 0 | 0 | – | 0 |
| Over VF and under VFY1 | 0 | – | 1 | 0 | – | 1 |
| Over VFY1 | 1 | – | 1 | 1 | – | 1 |

FIG. 39

| Target State | Original Data | | | Inhibited Data | | |
|---|---|---|---|---|---|---|
| | DL1 | DL2 | DL3 | DL1 | DL2 | DL3 |
| E | 1 | - | - | 1 | - | - |
| P1 | 0 | - | - | 1 | - | - |
| P2 | 0 | - | - | 1 | - | - |
| P3 | 0 | - | - | 1 | - | - |
| P4 | 0 | - | - | 1 | - | - |
| P5 | 1 | - | - | 1 | - | - |
| P6 | 1 | - | - | 1 | - | - |
| P7 | 1 | - | - | 1 | - | - |

E: Initially Inhibited

P1–P4: Inhibited by VFY1

P5–P7: Initially Inhibited

FIG. 41

| Target State | Original Data | | | Inhibited Data | | |
|---|---|---|---|---|---|---|
| | DL1 | DL2 | DL3 | DL1 | DL2 | DL3 |
| E | 1 | 1 | – | 1 | 1 | – |
| P1 | 0 | 1 | – | 1 | 1 | – |
| P2 | 0 | 0 | – | 1 | 0 | – |
| P3 | 0 | 0 | – | 1 | 0 | – |
| P4 | 0 | 1 | – | 1 | 1 | – |
| P5 | 1 | 1 | – | 1 | 1 | – |
| P6 | 1 | 0 | – | 1 | 0 | – |
| P7 | 1 | 0 | – | 1 | 0 | – |

P1–P4 Inhibited Data DL1 column: } Restored

FIG. 42

| Target State | Original Data | | | Inhibited Data | | | |
|---|---|---|---|---|---|---|---|
| | DL1 | DL2 | DL3 | DL1 | DL2 | DL3 | |
| E | 1 | 1 | – | 1 | 1 | – | ← Initially Inhibited |
| P1 | 0 | 1 | – | 1 | 1 | – | ← Inhibited by VFY1 |
| P2 | 0 | 0 | – | 1 | 1 | – | } Inhibited by VFY2 |
| P3 | 0 | 0 | – | 1 | 1 | – | |
| P4 | 0 | 1 | – | 1 | 1 | – | ← Inhibited by VFY1 |
| P5 | 1 | 1 | – | 1 | 1 | – | ← Initially Inhibited |
| P6 | 1 | 0 | – | × | × | × | } Programmed beyond VFY2 |
| P7 | 1 | 0 | – | × | × | × | |

FIG. 44

| Target State | Original Data | | | Inhibited Data | | |
|---|---|---|---|---|---|---|
| | DL1 | DL2 | DL3 | DL1 | DL2 | DL3 |
| E | 1 | 1 | 1 | 1 | 1 | 1 |
| P1 | 0 | 1 | 1 | 1 | 1 | 1 |
| P2 | 0 | 0 | 1 | 1 | 1 | 1 |
| P3 | 0 | 0 | 0 | 1 | 1 | 0 |
| P4 | 0 | 1 | 0 | 1 | 1 | 0 |
| P5 | 1 | 1 | 0 | 1 | 1 | 0 |
| P6 | 1 | 0 | 0 | | | |
| P7 | 1 | 0 | 1 | | | |

Restored

FIG. 48
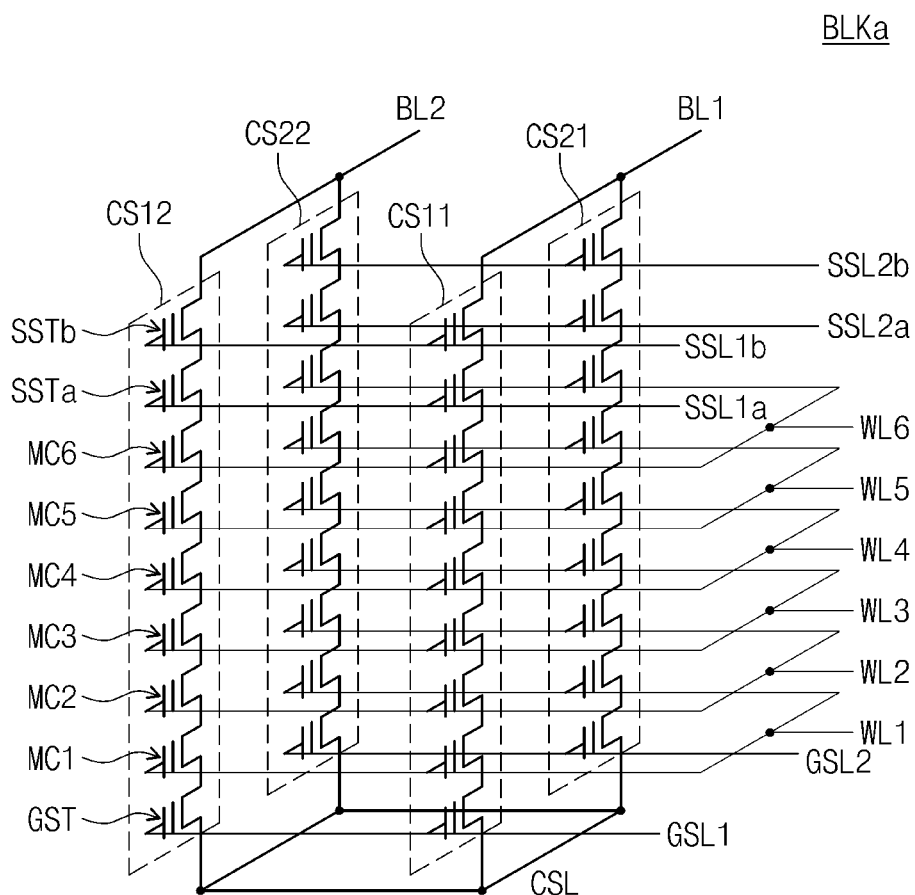
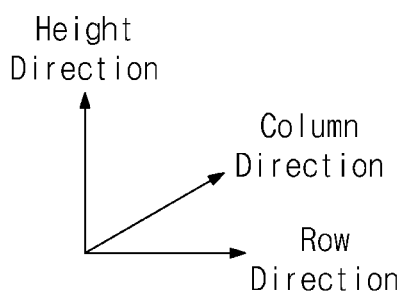

NONVOLATILE MEMORY DEVICE AND STORAGE DEVICE INCLUDING NONVOLATILE MEMORY DEVICE

CROSS-REFERENCE TO RELATED APPLICATIONS

This is a Continuation of U.S. application Ser. No. 15/351,550, filed Nov. 15, 2016, and issued as U.S. Pat. No. 10,658,040 on May 19, 2020, and a claim of priority under 35 U.S.C. § 119 is made to Korean Patent Application No. 10-2015-0166120 filed Nov. 26, 2015, in the Korean Intellectual Property Office, the entire contents of which are hereby incorporated by reference.

BACKGROUND

Embodiments of the disclosure disclosed herein relate to a semiconductor memory, and in particular, to a nonvolatile memory device and a storage device including the nonvolatile memory device.

A storage device refers to a device which stores data, such as a computer, a smart phone, or a smart pad, under control of a host device. The storage device includes a device, which stores data on a magnetic disk, such as a hard disk drive (HDD), or a device, which stores data on a semiconductor memory, in particular, a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

The operating speed of the host device, which communicates with the storage device, such as a computer, a smart phone, or a smart pad is improved as semiconductor manufacturing technologies develop. Furthermore, the size of content used in the storage device and a host device of the host device is increasing. For this reason, the storage device with improved operating speed is being continuously required.

SUMMARY

Embodiments of the disclosure provide a nonvolatile memory device with improved operating speed and a storage device including the nonvolatile memory device.

One aspect of embodiments of the disclosure is directed to provide a storage device. The storage device includes a nonvolatile memory device and a controller configured to provide the nonvolatile memory device with first data, an address, and a program start command and to provide the nonvolatile memory device with second data after the program start command is provided to the nonvolatile memory device. The nonvolatile memory device is configured to initiate a program operation, which is based on the first data, in response to the program start command and to continue to perform, based on the first data and the second data, the program operation when the second data is provided to the nonvolatile memory device. The program operation includes a plurality of program loops, each of which includes a verification read repeated using different verification voltages and a dump in which the result of the verification read is applied to program data of each memory cell. The nonvolatile memory device is configured to perform a program and a verification read of a first program loop based on the first data, the verification read of the first program loop being performed using one verification voltage.

Another aspect of embodiments of the disclosure is directed to provide a nonvolatile memory device. The nonvolatile memory device includes a memory cell array having a plurality of memory cells, a page buffer circuit connected with the plurality of memory cells through bit lines and configured to store first data received from an external device, and a row decoder connected with the plurality of memory cells through word lines and configured to initiate, based on the first data, a program operation with respect to memory cells selected from the plurality of memory cells together with the page buffer circuit when the first data is loaded on the page buffer circuit. The page buffer circuit is configured to further store second data received from the external device after the program operation starts. When the second data is loaded on the page buffer circuit, the page buffer circuit and the row decoder circuit are configured to continue to perform the program operation based on the first data and the second data. The program operation includes a plurality of program loops, each of which includes a verification read repeated using different verification voltages and a dump in which the result of the verification read is applied to program data of each memory cell. The nonvolatile memory device is configured to perform a program and a verification read of a first program loop based on the first data, the verification read of the first program loop being performed using one verification voltage.

Another aspect of embodiments of the disclosure is directed to provide a storage device having a nonvolatile memory device and a memory controller that controls memory access operations of the nonvolatile memory device. The memory controller provides the nonvolatile memory device with an address, first data corresponding to the address, and a program start command. The nonvolatile memory device, in response to receiving the first data, address and program start command, executes a first programming operation in which a programming voltage corresponding to the first data is applied to a memory cell of the nonvolatile memory device that is identified by the address. The memory controller provides the nonvolatile memory device with second data corresponding to the address while executing the first programming operation.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 33 and 34 show an example in which bits of first data latches are restored using a force read result;

FIGS. 38 to 44 show an example in which threshold voltages of memory cells and bits stored in latches are changed while a program loop is repeated;

FIG. 48 is a circuit diagram illustrating a memory block according to an embodiment of the disclosure;

DETAILED DESCRIPTION

Below, embodiments of the disclosure will be described in detail with reference to the attached drawings to the extent that the scope and spirit of the disclosure is easily implemented by a person of ordinary skill in the art to which the disclosure belongs.

Figure 1:
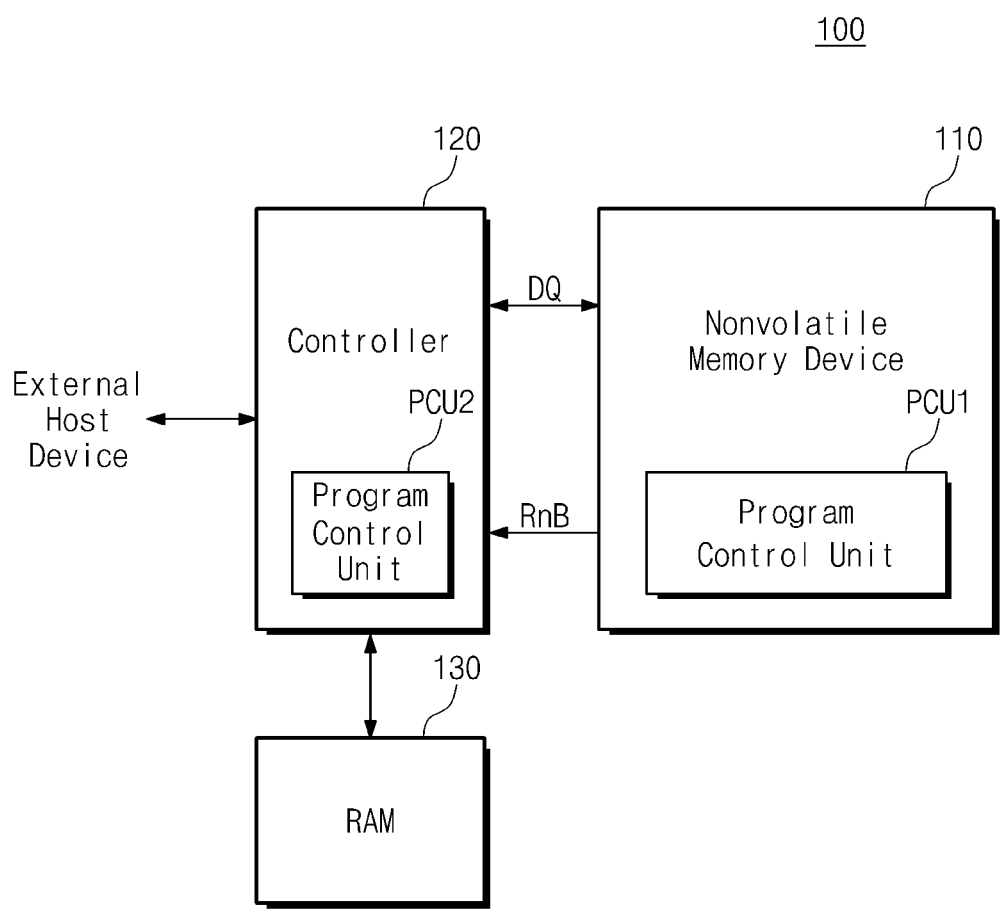
FIG. 1 is a block diagram illustrating a storage device according to an embodiment of the disclosure.

FIG. 1 is a block diagram illustrating a storage device 100 according to an embodiment of the disclosure. Referring to FIG. 1, a storage device 100 may include a nonvolatile memory device 110, a controller 120, and a random access memory (RAM) 130.

The nonvolatile memory device 110 may include a plurality of nonvolatile memory cells and may be configured to perform a program operation, a read operation, and an erase operation with respect to the nonvolatile memory cells under control of the controller 120. The nonvolatile memory device 110 may receive a command and an address from the controller 120 through an input/output channel and may exchange data with the controller 120. The nonvolatile memory device 110 may provide to the controller 120 a ready/busy signal RnB indicating whether the nonvolatile memory device 110 is able to process a request of the controller 120. For example, when being at a ready state in which the nonvolatile memory device 1100 is able to process a request of the controller 120, the nonvolatile memory device 110 may set the ready/busy signal RnB to a high level. For example, when being at a busy state in which the nonvolatile memory device 1100 is performing an internal operation, the nonvolatile memory device 110 may set the ready/busy signal RnB to a low level.

The nonvolatile memory device 110 may include a program control unit PCU1 which is configured to control a program operation in response to a request of the controller 120. The program control unit PCU1 may perform the program operation in response to a request of the controller 120. A program operation which is controlled by the program control unit PCU1 will be described with reference to FIG. 2.

The controller 120 may control the nonvolatile memory device 110 in response to control of an external host device (not illustrated). For example, the controller 120 may control a program operation, a read operation, and an erase operation of the nonvolatile memory device 110. The controller 120 may provide a command and an address to the nonvolatile memory device 110 through input/output lines DQ and may exchange data with the nonvolatile memory device 110 through the input/output lines DQ. The controller 120 may control the nonvolatile memory device 110 based on the ready/busy signal provided from the nonvolatile memory device 110.

The controller 120 may include a program control unit PCU2. The program control unit PCU2 may request a program operation from the nonvolatile memory device 110 and may control the program operation. A program operation which is controlled by the program control unit PCU2 will be described with reference to FIG. 2.

The controller 120 may use the RAM 130 as a working memory, a buffer memory, or a cache memory. For example, the controller 120 may store data received from the external host device in the RAM 130, may provide the data stored in the RAM 130 to the nonvolatile memory device 110, and may request a program operation from the nonvolatile memory device 110. The controller 120 may request a read operation from the nonvolatile memory device 110, may store data received from the nonvolatile memory device 110 in the RAM 130, and may output the data stored in the RAM 130 to the external host device.

Figure 2:
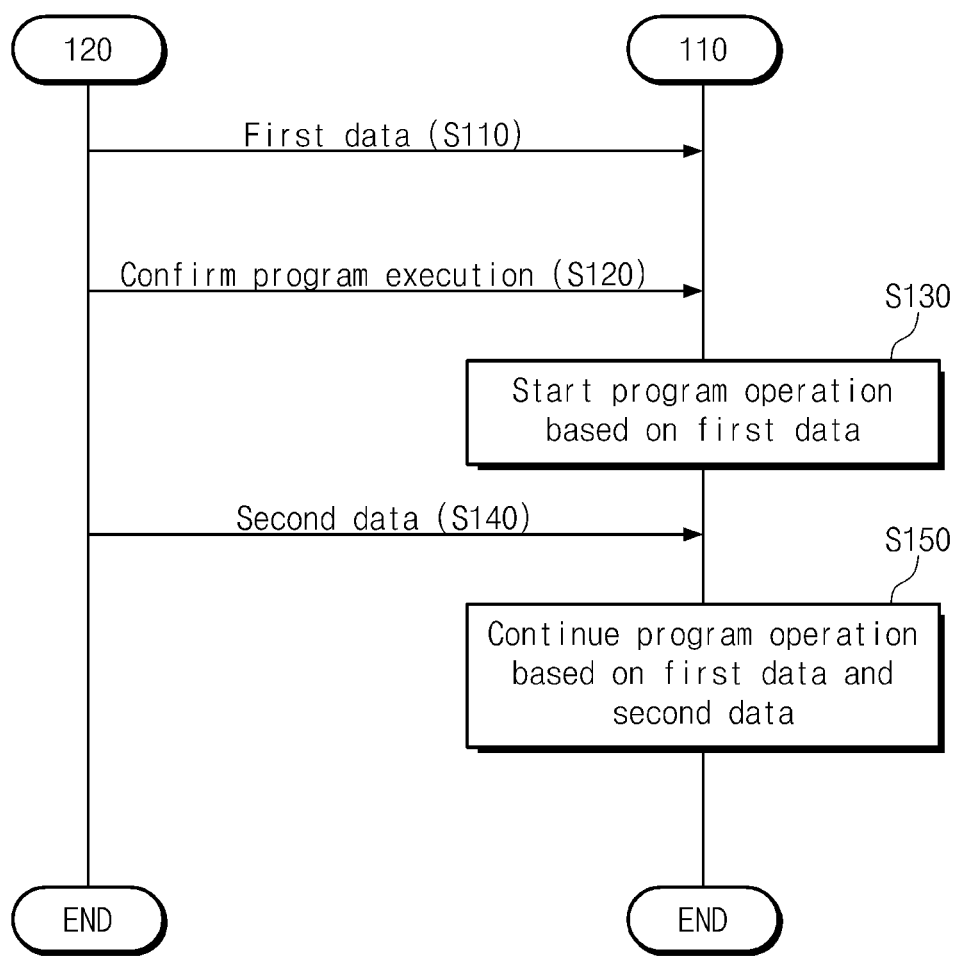
FIG. 2 is a flowchart illustrating a program operation performed by a program control unit of a nonvolatile memory device and a program control unit of a controller.

FIG. 2 is a flowchart illustrating a program operation performed by a program control unit PCU1 of a nonvolatile memory device 110 and a program control unit PCU2 of a controller 120. Referring to FIGS. 1 and 2, in step S110, the controller 120 may provide first data to the nonvolatile memory device 110. For example, the first data may be a portion of data to be programmed at memory cells through a program operation. For example, the first data may include data corresponding to at least one logical page among logical pages belonging to one physical page.

After the controller 120 provides the first data to the nonvolatile memory device 110, in step S120, the program control unit PCU2 of the controller 120 may confirm program execution. Before all the data to be programmed through a program operation is transmitted, the program control unit PCU2 may request the nonvolatile memory device 110 to initiate the program operation.

As the program execution is confirmed, in step S130, the program control unit PCU1 of the nonvolatile memory device 110 may initiate the program operation based on the first data. After the program operation starts, the program control unit PCU1 of the nonvolatile memory device 110 may switch a state of the ready/busy signal from a busy state to a ready state to notify the controller 120 that it may receive additional data.

In step S140, the program control unit PCU2 of the controller 120 may provide second data to the nonvolatile memory device 110 while the program operation is performed on the nonvolatile memory device 110. For example, the second data may be the rest of the data to be programmed at memory cells through a program operation. For example, the second data may include data corresponding to at least one logical page among logical pages belonging to one physical page.

As the second data is received, in step S150, the nonvolatile memory device 110 may continue to perform the program operation based on the first data and the second data. For example, the nonvolatile memory device 110 may continue to perform the program operation, which is initiated in step S130, based on the first data and the second data.

According to embodiments of the disclosure, the program operation may start after a portion of data to be programmed through the program operation, that is, the first data is sent to the nonvolatile memory device 110. The rest of the data to be programmed, that is, the second data may be provided to the nonvolatile memory device 110 while the program operation is performed. Accordingly, a time when the second data is provided to the nonvolatile memory device 110 may be shadowed, thereby reducing a time take to perform a program operation of the storage device 100.

In an embodiment, step S110 and step S150 may be continuously performed. The controller 120 may provide the first data (step S110) and may provide the second data (S140) just as a program operation starts (S120 and S130). Even though the nonvolatile memory device 110 sets the ready/busy signal RnB to a ready state after the first data is provided thereto and the program operation starts, the controller 120 may not allow other access operations except providing the second data. For example, there may be prohibited access operations, which the controller 120 requests of the nonvolatile memory device 110, such as another program operation, a read operation, or an erase operation between providing the first data (step S110) and providing the second data (step S140). For example, there may be allowed control operations such as an operation in which the controller 120 resets the nonvolatile memory device 110, an operation in which the controller 120 requests the nonvolatile memory device 110 to stop operating, and an operation in which the controller 120 requests status read for verifying a status of the nonvolatile memory device 110.

Figure 3:
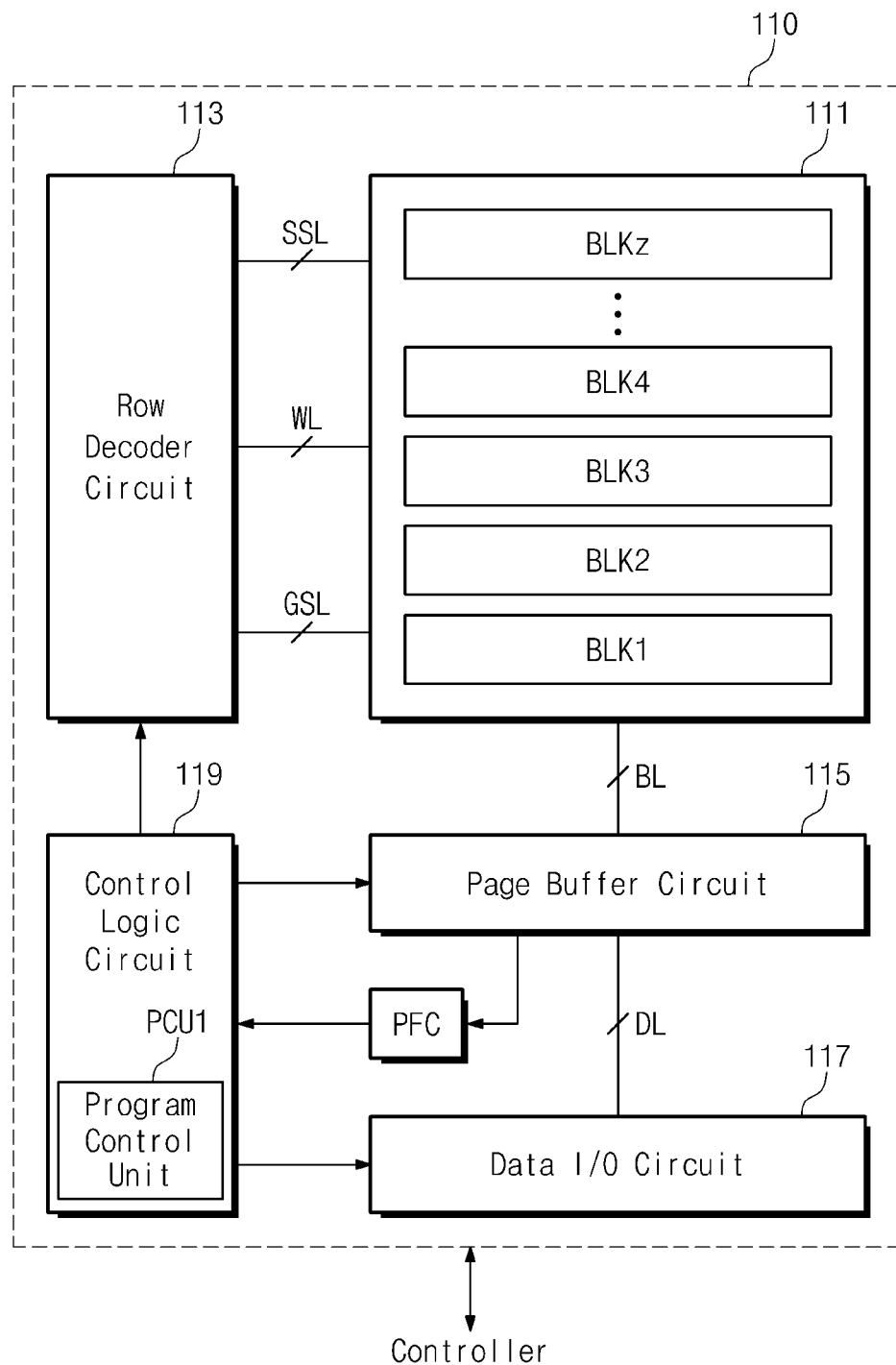
FIG. 3 is a block diagram illustrating a nonvolatile memory device according to an embodiment of the disclosure.

FIG. 3 is a block diagram illustrating a nonvolatile memory 110 according to an embodiment of the disclosure. Referring to FIG. 1, the nonvolatile memory device 110 may include a memory cell array 111, a row decoder circuit 113, a page buffer circuit 115, a pass-fail check circuit PFC, a data input/output circuit 117, and a control logic circuit 119.

The memory cell array 111 may include a plurality of memory cells BLK1 to BLKz. Each of the memory blocks BLK1 to BLKz may include a plurality of memory cells. Each of the memory blocks BLK1 to BLKz may be connected to the row decoder circuit 113 through at least one string selection line SSL, a plurality of word lines WL, and at least one ground selection line GSL. Each of the memory blocks BLK1 to BLKz may be connected to the page buffer circuit 115 through a plurality of bit lines BL. The memory blocks BLK1 to BLKz may be connected in common to the plurality of bit lines BL. Memory cells in the memory blocks BLK1 to BLKz may have the same structure.

In an embodiment, each of the memory blocks BLK1 to BLKz may be a unit of an erase operation. An erase operation of memory cells in the memory cell array 111 may be carried out by the memory block. The memory cells belonging to a memory block may be erased at the same time. In another embodiment, each memory block may be divided into a plurality of sub-blocks. Each of the sub-blocks may be an erase unit.

In an embodiment, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

In an embodiment, each memory block may include a plurality of physical pages, each of which includes a plurality of memory cells. A physical page may refer to a program unit. Memory cells of a physical page may be simultaneously programmed. A physical page may include two or more logical pages. Bits to be programmed at memory cells of a physical page may constitute logical pages. First bits to be programmed at memory cells of a physical page may constitute a first logical page. K-th bits (K being a positive integer) to be programmed at the memory cells of the physical page may constitute a k-th logical page.

The row decoder circuit 113 may be connected to the memory cell array 111 through a plurality of ground selection lines GSL, the plurality of word lines WL, and a plurality of string selection lines SSL. The row decoder circuit 113 may operate according to control of the control logic circuit 119. The row decoder circuit 113 may decode an address received from the controller 120 through an input/output channel and may allow voltages to be applied to the string selection lines SSL, the word lines WL, and the ground selection lines GSL based on the decoded address.

For example, during a program operation, the row decoder circuit 113 may apply a program voltage (e.g., VPGM) to a selected word line in a memory block selected by an address and a pass voltage (e.g., VPASS) to unselected word lines in the selected memory block. During a read operation, the row decoder circuit 113 may apply a selection read voltage (e.g., VRD) to the selected word line and a non-selection read voltage (e.g., VREAD) to the unselected word lines in the selected memory block. During an erase operation, the row decoder circuit 113 may apply an erase voltage (e.g., a ground voltage or a low voltage of which the level is similar to that of the ground voltage) to word lines in a memory block selected by an address.

The page buffer circuit 115 may be connected to the memory cell array 111 through the bit lines BL. The page buffer circuit 115 may be connected to the data input output circuit 117 through a plurality of data lines DL. The page buffer circuit 115 may operate under control of the control logic circuit 119.

During a program operation, the page buffer circuit 115 may store data to be programmed in memory cells. The page buffer circuit 115 may apply voltages to the bit lines BL based on the stored data. For example, the page buffer circuit 115 may function as a write driver. During a read operation or a verification read, the page buffer circuit 115 may sense voltages on the bit lines BL and may store the sensed results therein. For example, the page buffer circuit 115 may function as a sense amplifier.

During a verification, the pass-fail check circuit PFC may receive the sensed result from the page buffer circuit 115. The pass-fail check circuit PFC may determine a pass or fail based on the received sensed results. For example, during a program verification, the page buffer circuit 115 may count the number of on-cells turned on. When the number of on-cells is greater than or equal to a threshold value, the PFC may determine verification fail. When the number of on-cells is smaller than the threshold value, the PFC may determine verification pass. For example, during an erase verification, the page buffer circuit 115 may count the number of off-cells. When the number of off-cells is greater than or equal to a threshold value, the PFC may determine verification fail. When the number of on-cells is smaller than the threshold value, the PFC may determine verification pass. The pass or fail determination result may be provided to the control logic circuit 119.

The data input/output circuit 117 may be connected to the page buffer circuit 115 through the data lines DL. The data input/output circuit 117 may output data, which is read by the page buffer circuit 115, to the controller 120 through the input/output channel and may provide data, which is received from the controller 120 through the input/output channel, to the page buffer circuit 115.

The control logic circuit 119 may receive a command from the controller 120 through the input/output channel and may receive a control signal therefrom through a control channel. The input/output channel may include input/output lines DQ, and the control channel may include a line through which the ready/busy signal RnB is transmitted. The control logic circuit 119 may receive a command, which is provided through the input/output channel, in response to the control signal, may route an address, which is provided through the input/output channel, to the row decoder circuit 113, and may route data, which is provided through the input/output channel, to the data input/output circuit 117. The control logic circuit 119 may decode the received command and may control the nonvolatile memory device 110 based on the decoded command.

In an embodiment, the control logic circuit 119 may generate a data strobe signal DQS based on a read enable signal/RE received from the controller 120 through the input/output channel. The data strobe signal DQS thus generated may be outputted to the controller 120 through the control channel. During a program operation, the control logic circuit 119 may receive the data strobe signal DQS from the controller 120 through the control channel.

Under control of the control logic circuit 119, a program operation, an erase operation, and a read operation may be performed with respect to memory cells of each memory block. The program operation may include a plurality of program loops. A program loop may be repeated until the program operation is determined as being pass.

Each program loop may include a program and a verification. In the program, the page buffer circuit 115 may apply voltages to bit lines BL based on data to be programmed. For example, a ground voltage or a low voltage of which the level is similar to that of the ground voltage may be applied to a bit line corresponding to a memory cell of which the threshold voltage is to be increased, and a power supply voltage or a positive voltage of which the level is similar to that of the power supply voltage may be applied to a memory cell (e.g., a memory cell to be program inhibited) of which the threshold voltage does not need to increase. The row decoder circuit 113 may apply a program voltage to a word line connected to selected memory cells and may apply a pass voltage to the remaining word lines. In the verification, a result of the program operation performed in the program may be verified. The verification may include a verification read and a pass-fail determination. During the verification read, the page buffer circuit 115 may apply a power supply voltage or a positive voltage of which the level is similar to that of the power supply voltage, to the bit lines BL or bit lines corresponding to memory cells to be verified. The row decoder circuit 113 may apply a verification voltage to a word line connected to the memory cells to be verified and may apply read pass voltages to the remaining word lines, respectively. The result of the verification read may be sensed by the page buffer circuit 115, and the sensed result may be provided to the PFC. During the pass-fail determination, the pass-fail check circuit PFC may determine whether or not of pass or fail based on the result of the verification read.

In an embodiment, during a program operation of the nonvolatile memory device 110, the nonvolatile memory device 110 may continuously receive all bits to be programmed at memory cells of a selected physical page of the memory cell array 111 and may complete programming of the selected physical page through a program operation based on the continuously received bits. That the programming is completed may mean that all bits to be programmed at a corresponding physical page are programmed to have a readable state and additional programming of the corresponding physical page is prohibited.

A read operation may be similar to a verification read. During the read operation, the page buffer circuit 115 may apply a power supply voltage or a positive voltage of which the level is similar to that of the power supply voltage to the bit lines BL or bit lines corresponding to memory cells to be verified. The row decoder circuit 113 may apply a read voltage to a word line connected to memory cells to be read and may apply read pass voltages to the remaining word lines. The result of the read operation may be sensed by the page buffer circuit 115 and may be outputted through the data input/output circuit 117.

An erase operation may include a plurality of erase loops. The erase loop may be repeated until the erase operation is passed. Each erase loop may include an erase and a verification. During the erase, the row decoder circuit 113 may apply a ground voltage or a low voltage of which the level is similar to that of the ground voltage, to word lines connected to selected memory cells. An erase voltage may be applied to channels of the selected memory cells through a substrate. During the verification, the result of the erase operation performed in the erase result may be verified. The verification may include a verification read and a pass-fail determination. During the verification read, the page buffer circuit 115 may apply a power supply voltage or a positive voltage of which the level is similar to that of the power supply voltage to the bit lines BL or bit lines corresponding to memory cells to be verified. The row decoder circuit 113 may apply an erase verification voltage to word lines connected to memory cells to be verified. The result of the verification read may be sensed by the page buffer circuit 115, and the sensed result may be provided to the PFC. During the pass-fail determination, pass-fail check circuit PFC may determine whether or not of pass or fail based on the result of the verification read.

The program control unit PCU1 may control the row decoder circuit 113, the page buffer circuit 115, and the data input/output circuit 117 such that a program operation is performed according to a method described with reference to FIG. 2.

Figure 4:
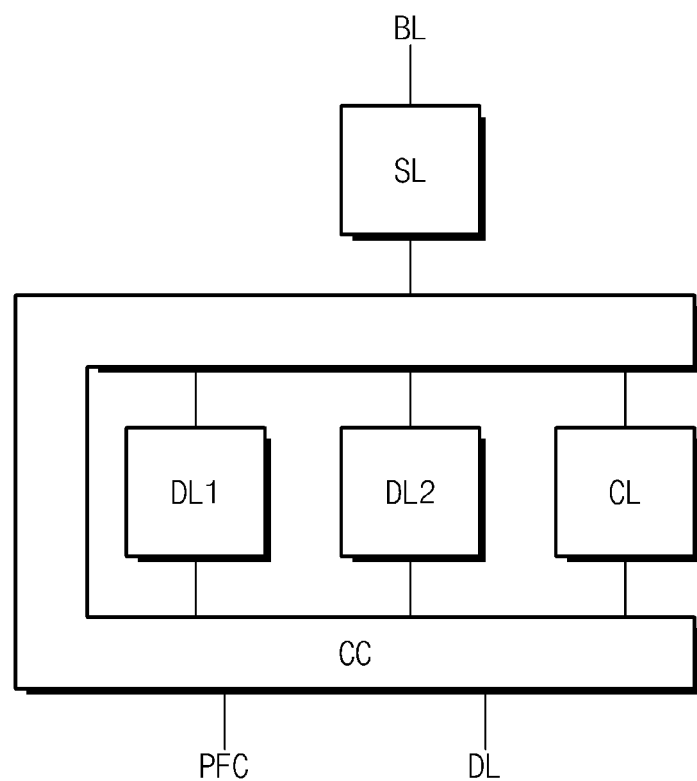
FIG. 4 is a block diagram illustrating a page buffer circuit according to an embodiment of the disclosure.

FIG. 4 is a block diagram illustrating a page buffer circuit 115 according to an embodiment of the disclosure. In an embodiment, elements corresponding to a bit line BL are illustrated in FIG. 4. Referring to FIGS. 3 and 4, the page buffer circuit 115 may include a control circuit CC, a cache latch CL, data latches DL1 and DL2, and a sense latch SL.

The control circuit CC may be connected to a data line DL and a bit line BL. The control circuit CC may load data, which is transmitted through the data line DL, on the cache latch CL. The control circuit CC may dump the data loaded on the cache latch CL onto one of the data latches DL1 and DL2 in response to control of the control logic circuit 119. The control circuit CC may set the sense latch SL based on data loaded on the data latches DL1 and DL2 or data loaded on the data latches DL1 and DL2 and the cache latch CL. The bit line BL may be set up according to a value set to the sense latch SL.

The sense latch SL may be set according to a voltage of the bit line BL. The control circuit CC may set the data latches DL1 and DL2 or the latches DL1, DL2, and CL based on a value set to the sense latch SL. The control circuit CC may output data, which is set to the data latches DL1 and DL2 or is set to the data latches DL1 and DL2 and the cache latch CL, to the data line DL or the pass-fail check circuit PFC.

In an embodiment, the number of data latches DL1 and DL2 or the number of latches DL1, DL2, and CL may be determined according to the number of bits to be programmed at each memory cell of each memory block, that is, according to the number of logical pages belonging to one physical page.

Figure 5:
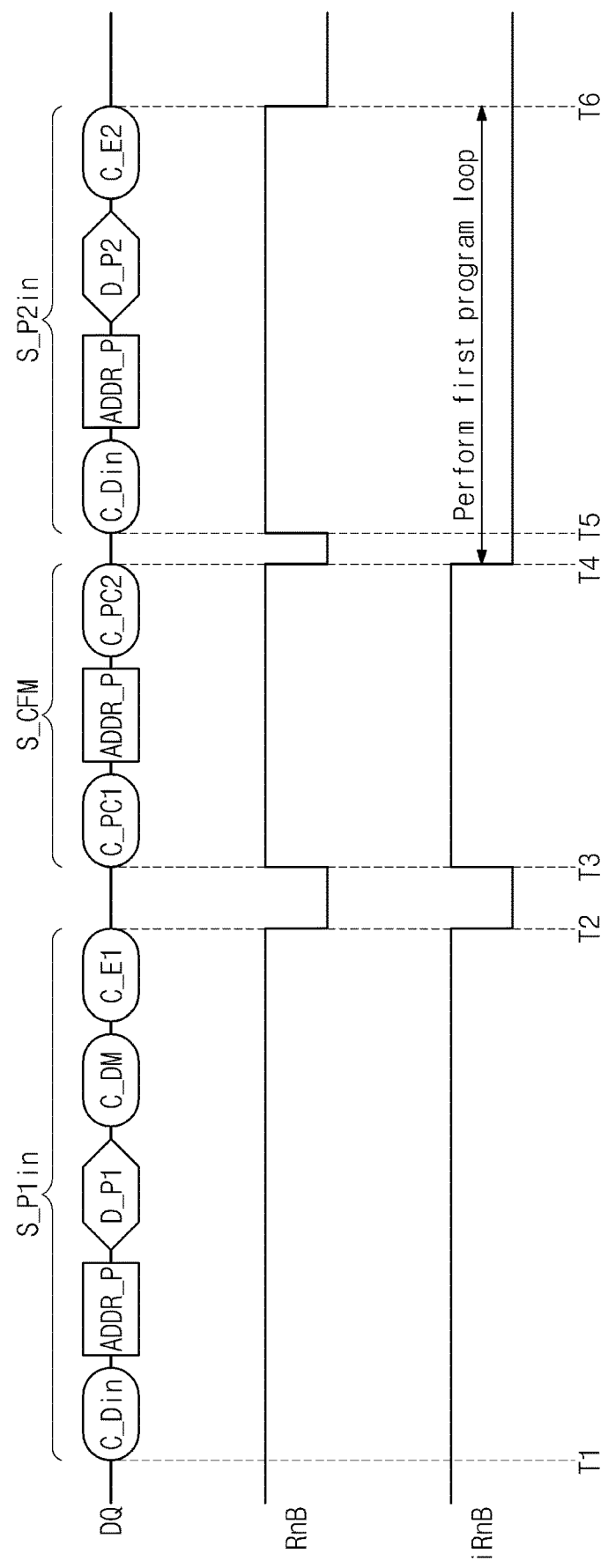
FIGS. 5 and 6 are timing diagrams illustrating a program operation according to an embodiment of the disclosure, when viewed from input/output lines and a ready/busy signal.
Figure 6:
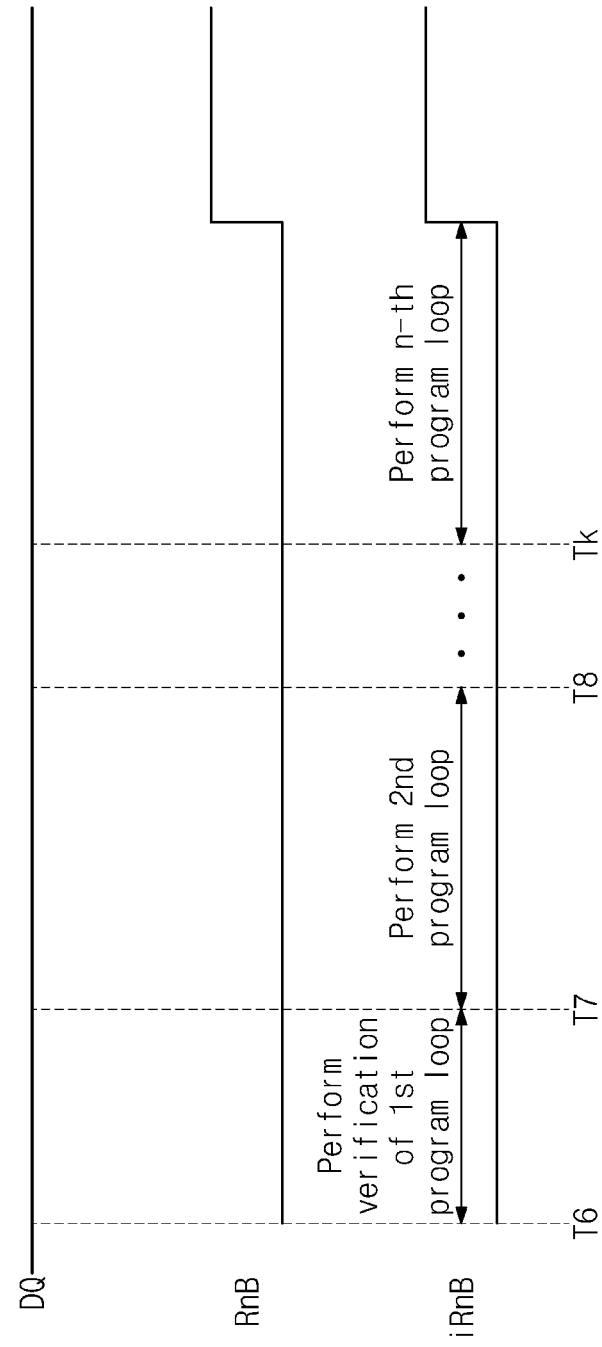

FIGS. 5 and 6 are timing diagrams illustrating a program operation according to an embodiment of the disclosure, when viewed from input/output lines DQ and a ready/busy signal RnB. Referring to FIGS. 1, 3, 4, and 5, at T1, the controller 120 may transmit a first sequence S_P1in through the input/output lines DQ. For example, the controller 120 may transmit a data input command C_Din, an address ADDR_P, first data D_P1, a dump command C_DM, and an end command C_E1. The data input command C_Din may be "80h" indicating that data to be programmed is received. The address ADDR_P may indicate memory cells at which data is to be programmed, for example, an address of a physical page. The first data D_P1 may be data of one among logical pages belonging to a physical page corresponding to the address ADDR_P. The dump command C_DM may be a command for requesting the dump of data and may be "C0h". The end command C_E1 may be "11h" indicating that data of a first logical page is completely transmitted.

While the first input sequence S_P1in progresses, the nonvolatile memory device 110 may maintain the ready/busy signal RnB at a ready state of a high level. An internal ready/busy signal iRnB may indicate whether an operation is performed in the nonvolatile memory device, independently of the ready/busy signal RnB that the nonvolatile memory device 110 outputs to the controller 120. While the first input sequence S_P1in progresses, the internal ready/busy signal iRnB may be maintained at a ready state of a high level.

In the first input sequence S_P1in, the first data D_P1 provided from the controller 120 to the nonvolatile memory device 110 through the input/output lines DQ may be stored in the cache latches CL. When receiving the dump command C_DM and the end command C_E1 through the input/output lines DQ, the nonvolatile memory device 110 may dump the first data D_P1 loaded on the cache latches CL onto the first data latches DL1 or the second data latches DL2. As the nonvolatile memory device 110 dumps the first data D_P1, a state of the internal ready/busy signal iRnB of the nonvolatile memory device 110 may be changed from the ready state of the high level to a busy state of a low level at T2. A state of the ready/busy signal RnB may be changed from the ready state of the high level to the busy state of the low level. When the first data D_P1 is completely dumped, at T3, a state of each of the internal ready/busy signal iRnB and the ready/busy signal RnB may be changed from the busy state of the low level to the ready state of the high level.

The controller 120 may perform a confirm sequence S_CFM as the ready/busy signal RnB transitions to the ready state of the high level at T3. For example, the controller 120 may sequentially provide a first confirm command C_PC1, an address ADDR_P, and a second confirm command C_PC2 through the input/output lines DQ. The first confirm command C_PC1 may indicate a start of the confirm sequence S_CFM and may be "88h". The address ADDR_P may indicate memory cells at which a program operation is to be performed, for example, an address of a physical page. The second confirm command C_PC2 may indicate an end of the confirm sequence S_CFM and may be "15h".

As the confirm sequence S_CFM is received through the input/output lines DQ, at T4, the nonvolatile memory device 110 may initiate programming of a first program loop. The internal ready/busy signal iRnB of the nonvolatile memory device 110 may transition to the busy state of the low level. When the programming of the first program loop starts, the nonvolatile memory device 110 may make the ready/busy signal RnB transition to the busy state of the low level. When the control circuit CC and the cache latch CL are ready to receive data during the program of the first program loop, at T5, the nonvolatile memory device 110 may make the ready/busy signal RnB transition to the ready state of the high level.

The controller 120 may perform a second data input sequence S_P2in as the ready/busy signal RnB transitions to the ready state of the high level at T5. For example, the controller 120 may sequentially provide a data input command C_Din, an address ADDR_P, second data D_P2, and an end command C_E2 to the nonvolatile memory device 110. As in the first data input sequence S_P1in, the controller 120 may provide the second data D_P2 to the nonvolatile memory device 110 in the second data input sequence S_P2in. The second data D_P2 may be data of a second logical page to be programmed at memory cells corresponding to the address ADDR_P. Furthermore, the controller 120 may provide the end command C_E2 to the nonvolatile memory device 110 without providing the dump command C_DM to the nonvolatile memory device 110. The end command C_E2 may be "12h" indicating that data of a second logical page is completely transmitted.

Referring to FIGS. 1 and 3 to 6, when the end command C_E2 is received through the input/output lines DQ, at T6, all data to be programmed at memory cells corresponding to the address ADDR_P may be loaded on the page buffer circuit 115. Accordingly, the nonvolatile memory device 110 may continuously perform the program operation by making the ready/busy signal RnB transition to the busy state of the low level. For example, the nonvolatile memory device 110 may perform a verification of the first program loop. For example, after receiving all data to be programmed, the nonvolatile memory device 110 may perform a verification read and a pass-fail check.

As the program operation is continuously performed, between T7 and T8, the nonvolatile memory device 110 may perform a second program loop based on the first data D_P1 and the second D_P2. At Tk, the program operation may end as the nonvolatile memory device 110 performs an n-th program loop. When the program operation ends, each of the internal ready/busy signal iRnB and the ready/busy signal RnB of the nonvolatile memory device 110 may transition to the ready state of the high level.

In an embodiment, the second data D_P2 may be able to be required in performing the verification of the first program loop. According to embodiments of the disclosure, the program operation of the first program loop may be performed in parallel with an operation of transmitting the second data D_P2, and the verification operation of the first program loop may be performed after the second data D_P2 is provided to the nonvolatile memory device 110. This will be more fully described with reference to FIGS. 8 and 9.

Figure 7:
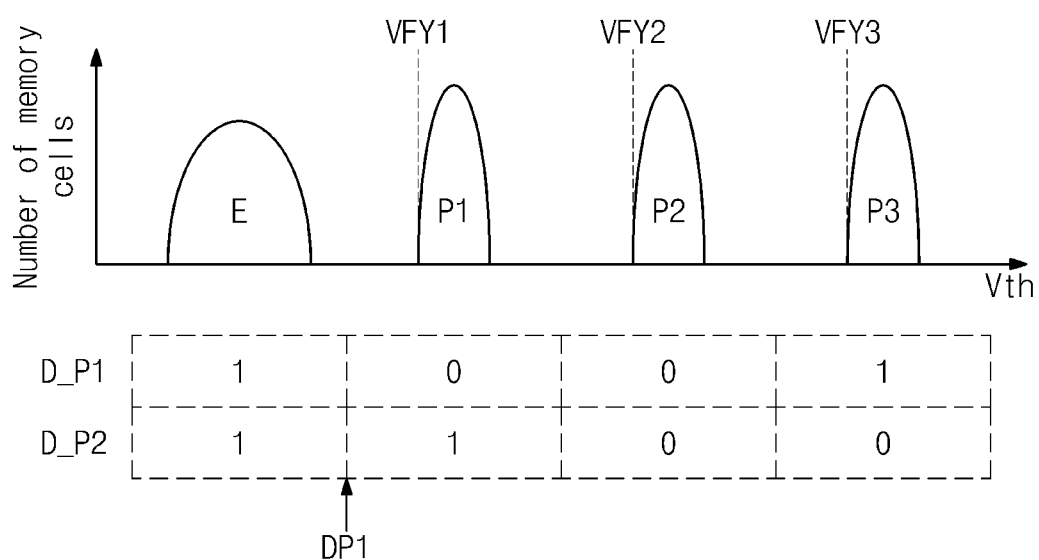
FIG. 7 illustrates an example in which threshold voltages of memory cells are distributed according to data programmed at the memory cells.

FIG. 7 illustrates an example in which threshold voltages of memory cells are distributed according to data programmed at the memory cells. In FIG. 7, the abscissa represents a threshold voltage, and the ordinate represents the number of memory cells. That is, threshold voltage distributions of memory cells programmed are illustrated in FIG. 7.

Referring to FIG. 7, when a bit of the first data D_P1 is "1" and a bit of the second data D_P2 is "1", a memory cell may maintain an erase state even though a program operation is performed. When a bit of the first data D_P1 is "0" and a bit of the second data D_P2 is "1", a memory cell may have a first program state P1 after a program operation is performed. The first program state P1 may be verified using a first verification voltage VFY1. When a bit of the first data D_P1 is "0" and a bit of the second data D_P2 is "0", a memory cell may have a second program state P2 after a program operation is performed. The second program state P2 may be verified using a second verification voltage VFY2. When a bit of the first data D_P1 is "1" and a bit of the second data D_P2 is "0", a memory cell may have a third program state P3 after a program operation is performed. The third program state P3 may be verified using a third verification voltage VFY3.

According to an embodiment of the disclosure, when a transmission time of the second data D_P2 is shadowed, the program operation of the first program loop may be performed in parallel with an operation of transmitting the second data D_P2, and the verification operation of the first program loop may be performed after the second data D_P2 is provided to the nonvolatile memory device 110. That the verification operation of the first program loop is performed after the second data D_P2 is transmitted will be more fully described with reference to FIGS. 8 and 9.

According to an embodiment of the disclosure, to shadow a transmission time of the second data D_P2, the controller 120 may be configured to select data, which has a determination point DP1 between a state (e.g., the erase state E) corresponding to the lowest threshold voltage range and a state (e.g., the first program state P1) corresponding to a threshold voltage range following the lowest threshold voltage range, as the first data D_P1 to be provided for the first time. The determination point DP1 may indicate a point where values of bits the most adjacent are different from each other. For example, in the first data D_P1, the erase state E may correspond to "1", and the first program state P1 may correspond to "0". Accordingly, the first data D_P1 may be selected as data to be provided for the first time. The determination point DP1 will be more fully described with reference to FIGS. 10 to 16.

Figure 8:
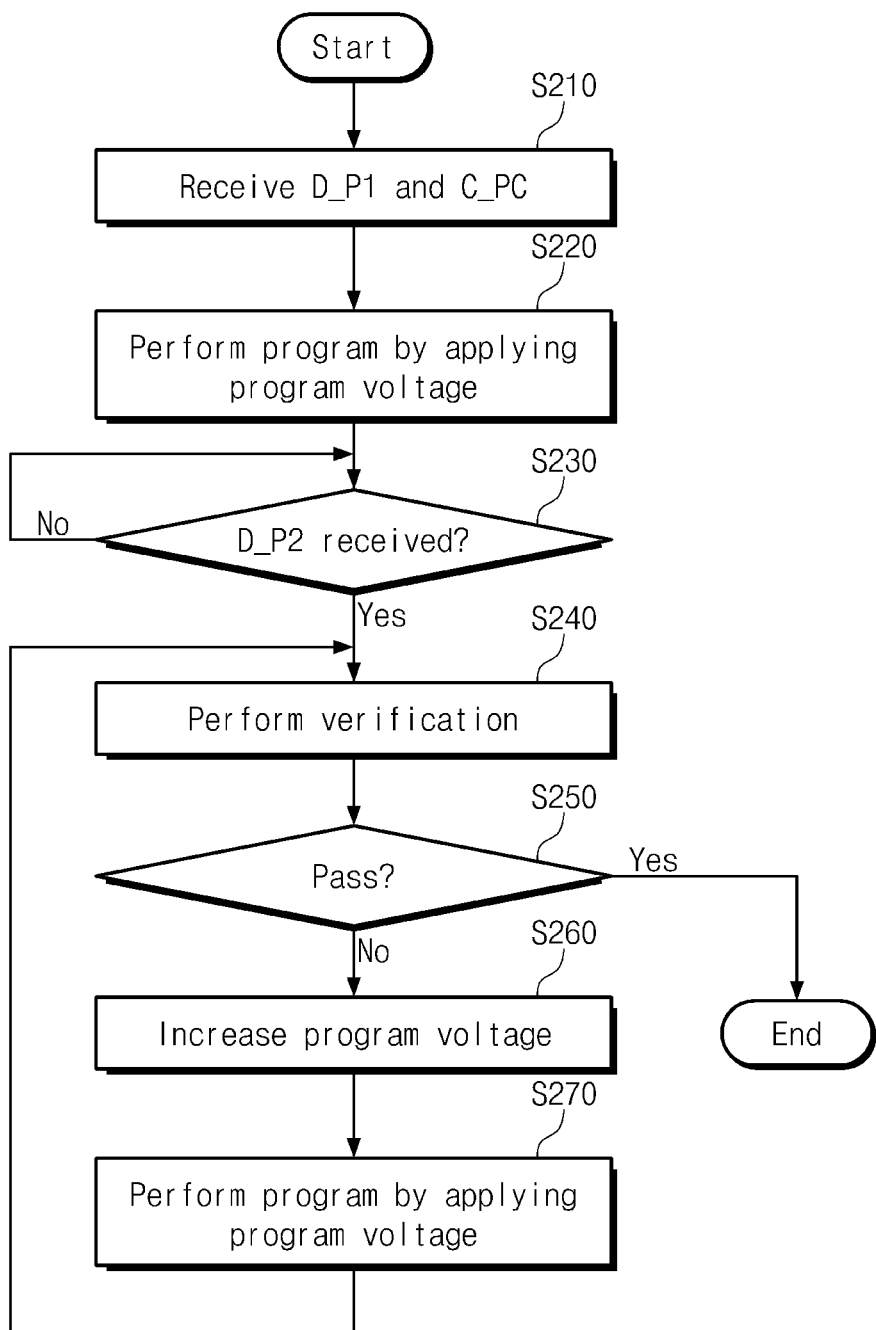
FIG. 8 is a flowchart illustrating the procedure for performing a program method, according to an embodiment of the disclosure.

FIG. 8 is a flowchart illustrating the procedure for performing a program method, according to an embodiment of the disclosure. Referring to FIGS. 1, 3, and 8, in step S210, the nonvolatile memory device 110 may receive the first data D_P1 and the confirm command C_PC.

In step S220, the nonvolatile memory device 110 may perform a program by applying a program voltage to a word line connected to selected memory cells. In step S230, the nonvolatile memory device 110 may stop the program operation and may wait until the second data D_P2 is received.

If the second data D_P2 is received, in step S240, the nonvolatile memory device 110 may perform verification. If the result of the verification is pass, as determined in step S250, the program operation may end. If the result of the verification is fail, as determined in step S250, the procedure proceeds to step S260, in which the program voltage increases. In step S270, the program may be performed by applying the program voltage to the selected word line. Afterwards, the procedure proceeds to step S240 to perform the verification again.

Figure 9:
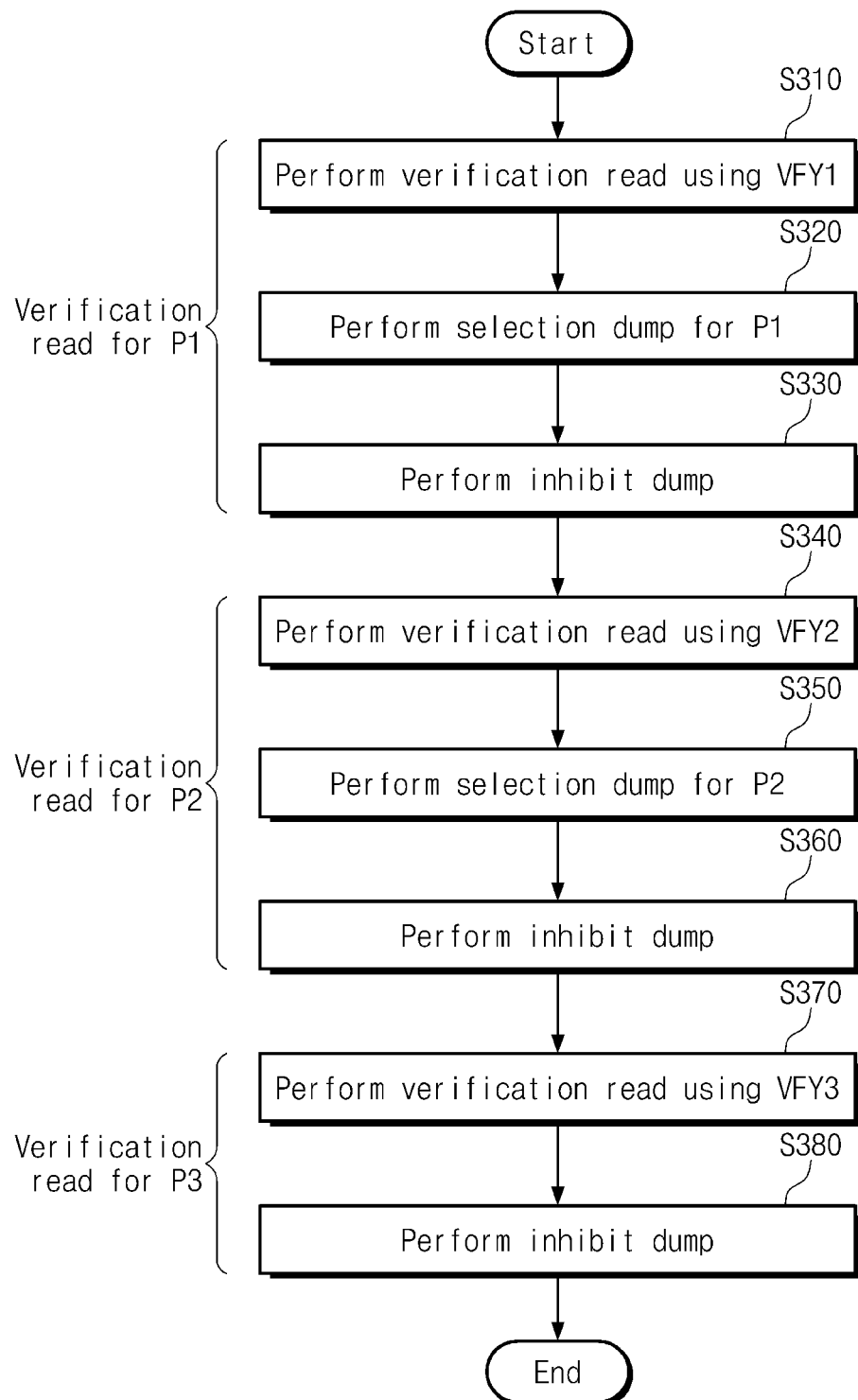
FIG. 9 is a flowchart illustrating a method in which verification read is performed upon verification.

FIG. 9 is a flowchart illustrating a method in which verification read is performed upon verification. Referring to FIGS. 1, 3, 4, and 9, in steps S310 to S330, a verification read may be performed with respect to the first program state P1. In step S310, the nonvolatile memory device 110 may perform a verification read by applying a first verification voltage VFY1 to a word line connected to selected memory cells. The verification read result may be stored in the sense latches SL. In step S320, a selection dump may be performed with respect to the first program state P1. For example, the control circuit CC may initialize the verification read result stored in the sense latch SL connected to a corresponding bit line where data stored in data latches DL1 and DL2 or data stored in the data latches DL1 and DL2 and the cache latch CL connected to the corresponding bit line indicates the second program state P2 or the third program state P3. For example, the control circuit CC may initialize the sense latch SL such that the verification read result stored therein indicates fail. In step S330, an inhibit dump may be performed. For example, the control circuit CC may store information indicating pass into the data latches DL1 and DL2 associated with sense latches, each of which stores a value corresponding to pass from among sense latches SL, or in the data latches DL1 and DL2 and the cache latch CL associated therewith.

In steps S340 to S360, a verification read may be performed with respect to the second program state P2. In step S340, the nonvolatile memory device 110 may perform a verification read by applying a second verification voltage VFY2 to the word line connected to the selected memory cells. The verification read result may be stored in the sense latches SL. In step S350, a selection dump associated with the second program state P2 may be performed. For example, the control circuit CC may initialize the verification read result stored in the sense latch SL connected to a corresponding bit line where data stored in data latches DL1 and DL2 or data stored in the data latches DL1 and DL2 and the cache latch CL connected to the corresponding bit line indicates the third program state P3. For example, the control circuit CC may initialize the sense latch SL such that the verification read result indicates fail. In step S360, an inhibit dump may be performed. For example, the control circuit CC may store information indicating pass into the data latches DL1 and DL2 associated with sense latches, each of which stores a value corresponding to pass, from among sense latches SL or in the data latches DL1 and DL2 and the cache latch CL associated therewith.

In steps S370 to S380, a verification read may be performed with respect to the third program state P3. In step S370, the nonvolatile memory device 110 may perform a verification read by applying a third verification voltage VFY3 to the word line connected to the selected memory cells. The verification read result may be stored in the sense latches SL. In step S380, an inhibit dump may be performed. For example, the control circuit CC may store information indicating pass into the data latches DL1 and DL2 associated with sense latches, each of which stores a value corresponding to pass, from among the sense latches SL or in the data latches DL1 and DL2 and the cache latch CL associated therewith.

As described above, information indicating the second program state P2 and the third program state P3 is required for performing the selection dump, and corresponding information may be obtained since both the first data D_P1 and the second data D_P2 exist. Accordingly, the nonvolatile memory device 110 according to an embodiment of the disclosure may perform a program of a first program loop and may withhold a verification of the first program loop until the second data D_P2 is received.

An embodiment of the disclosure is exemplified in FIG. 9 as verification reads are sequentially performed with respect to the first to third states P1 to P3. However, when a verification of at least one of the first to third program states P1 to P3 is passed, a verification read associated with the at least one program state thus passed may be skipped.

As illustrated in FIG. 9, the selection dump of the first program state P1 (step S320) may be performed after a verification read (step S310) using the first verification voltage VFY1 is performed. Accordingly, the scope and spirit of the disclosure may be applied to the case that a verification read using the first verification voltage VFY1 of the verification of the first program loop is performed in parallel with transmission of the second data D_P2, in addition to the case that a program of the first program loop is performed in parallel with transmission of the second data D_P2.

Figure 10:
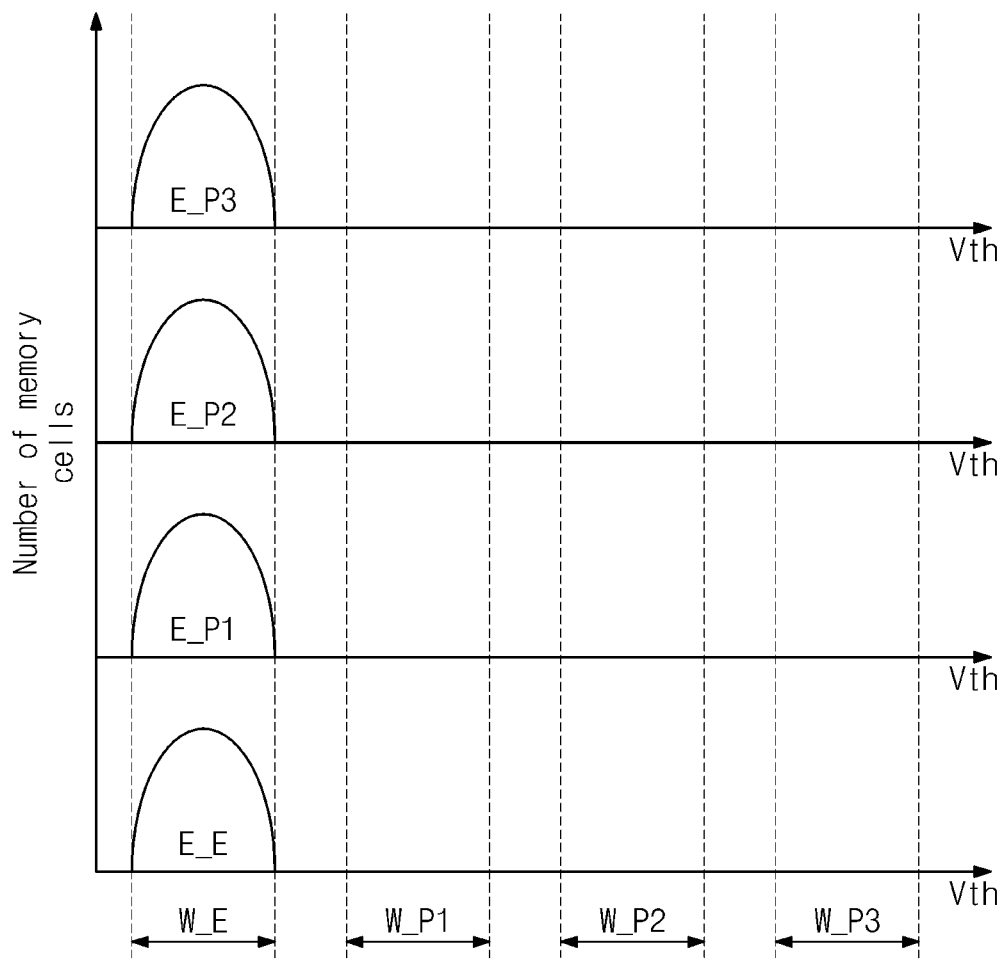
FIG. 10 illustrates threshold voltage distributions of memory cells of an erase state.

FIG. 10 illustrates threshold voltage distributions of memory cells of an erase state. In FIG. 10, the abscissa represents threshold voltages of memory cells MC, and the ordinate represents the number of memory cells MC.

Referring to FIGS. 7 and 10, a reference symbol "E_E" may indicate memory cells the erase state E of each of which is maintained during a program operation. A reference symbol "E_P1" may indicate memory cells which are programmed to the first program state P1 from the erase state E. A reference symbol "E_P2" may indicate memory cells which are programmed to the second program state P2 from the erase state E. A reference symbol "E_P3" may indicate memory cells which are programmed to the third program state P3 from the erase state E.

A reference symbol "W_E" may indicate a range of threshold voltages respectively corresponding to memory cells of the erase state E. A reference symbol "W_P1" may indicate a range of threshold voltages respectively corresponding to memory cells of the first program state P1. A reference symbol "W_P2" may indicate a range of threshold voltages respectively corresponding to memory cells of the second program state P2. A reference symbol "W_P3" may indicate a range of threshold voltages respectively corresponding to memory cells of the third program state P3.

Before the program operation is performed, memory cells E_E, E_P1, E_P2, and E_P3 may belong to a threshold voltage range W_E of the erase state E.

Figure 11:
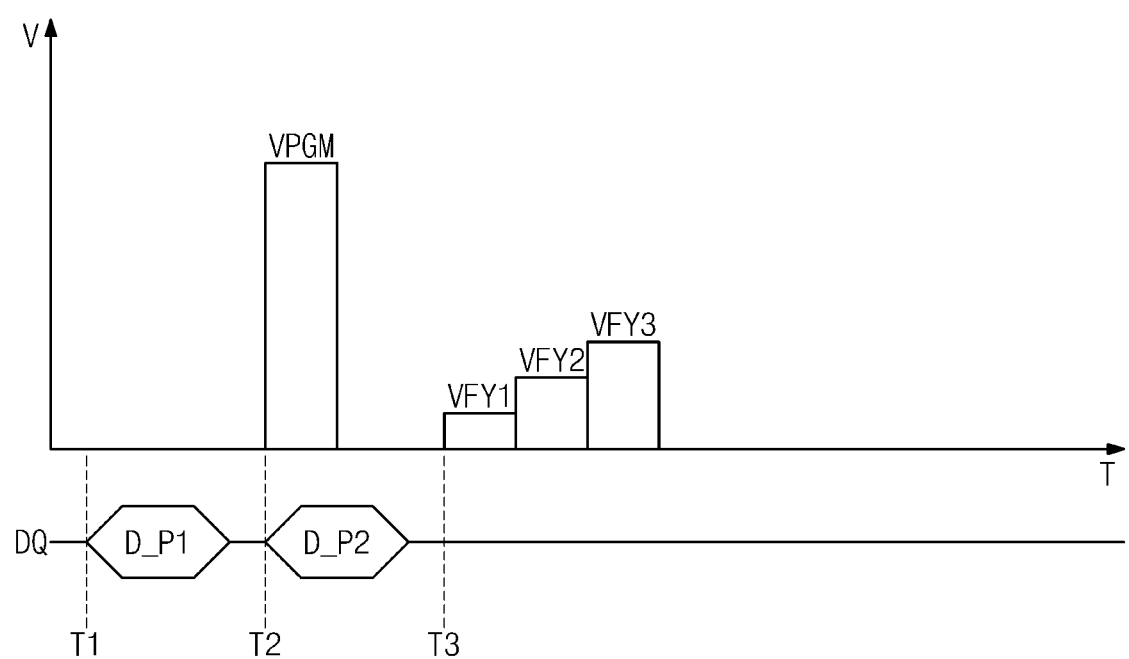
FIG. 11 shows a process in which a first program loop is performed at memory cells of FIG. 10.

FIG. 11 shows a process in which a first program loop is performed at memory cells of FIG. 10. In FIG. 11, the abscissa represents a time T, and the ordinate represents data transmitted through input/output lines DQ and a voltage V applied to a word line connected to selected memory cells.

Referring to FIGS. 3, 7, 10, and 11, at T1, first data D_P1 may be provided to the page buffer circuit 115 through the input/output lines DQ. When the first data D_P1 is completely received, the page buffer circuit 115 may set up bit lines BL based on the first data D_P1. For example, bit lines corresponding to memory cells E_E and E_P3 to be programmed (or maintained) to the erase state E and the third program state P3 may be set to be program-inhibited. Bit lines corresponding to memory cells E_P1 and E_P2 to be programmed to the first program state P1 and the second program state P2 may be set to be programmed. Afterwards, at T2, the row decoder circuit 113 may apply a program voltage VPGM to a selected word line. During a program operation in which the program voltage VPGM is applied to the selected word line, second data D_P2 may be provided to the page buffer circuit 115 through the input/output lines DQ.

When the second data D_P2 is completely received, at T3, the page buffer circuit 115 may precharge the bit lines BL. For example, before a verification read using a first verification voltage VFY1, the page buffer circuit 115 may charge bit lines, which correspond respectively to memory cells E_P1 to be programmed to the first program state P1, with a power supply voltage or a positive voltage of which the level is similar to that of the power supply voltage, respectively. The page buffer circuit 115 may charge the remaining bit lines with a ground voltage or a low voltage of which the level is similar to that of the ground voltage or may float the remaining bit lines. Afterwards, the row decoder circuit 113 may apply a first verification voltage VFY1 to the selected word line.

After the page buffer circuit 115 charges bit lines corresponding to memory cells E_P2 to be programmed to the second program state P2, the row decoder circuit 113 may apply the second verification voltage VFY2 to the selected word line. Furthermore, after the page buffer circuit 115 charges bit lines corresponding to memory cells E_P3 to be programmed to the third program state P3, the row decoder circuit 113 may apply the third verification voltage VFY3 to the selected word line.

As another example, the page buffer circuit 115 may be configured to charge all bit lines with the power supply voltage or a positive voltage, of which the level is similar to that of the power supply voltage, regardless of the program states P1 to P3 before one of the verification voltages VFY1 to VFY3 is applied to the selected word line.

Figure 12:
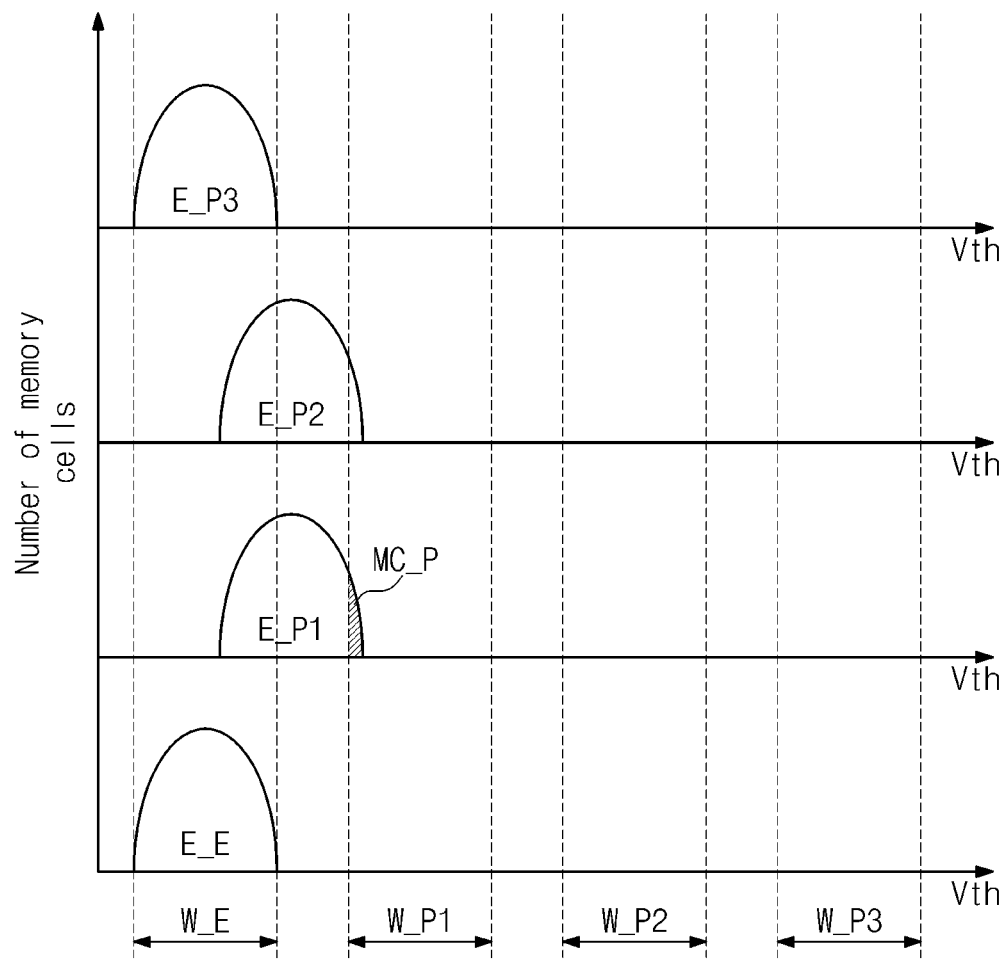
FIG. 12 shows an example of threshold voltages of memory cells changed from FIG. 10.

As the first program loop illustrated in FIG. 11 progresses, threshold voltages of memory cells illustrated in FIG. 10 may be changed as illustrated in FIG. 12. Referring to FIG. 12, threshold voltages of memory cells E_P1 and E_P2 to be programmed to the first and second program states P1 and P2 may increase. Memory cells E_P3 to be programmed to the third program state P3 may be program-inhibited according to the first data D_P1 in a first program loop, and thus threshold voltages of the memory cells E_P3 may not increase.

Figure 13:
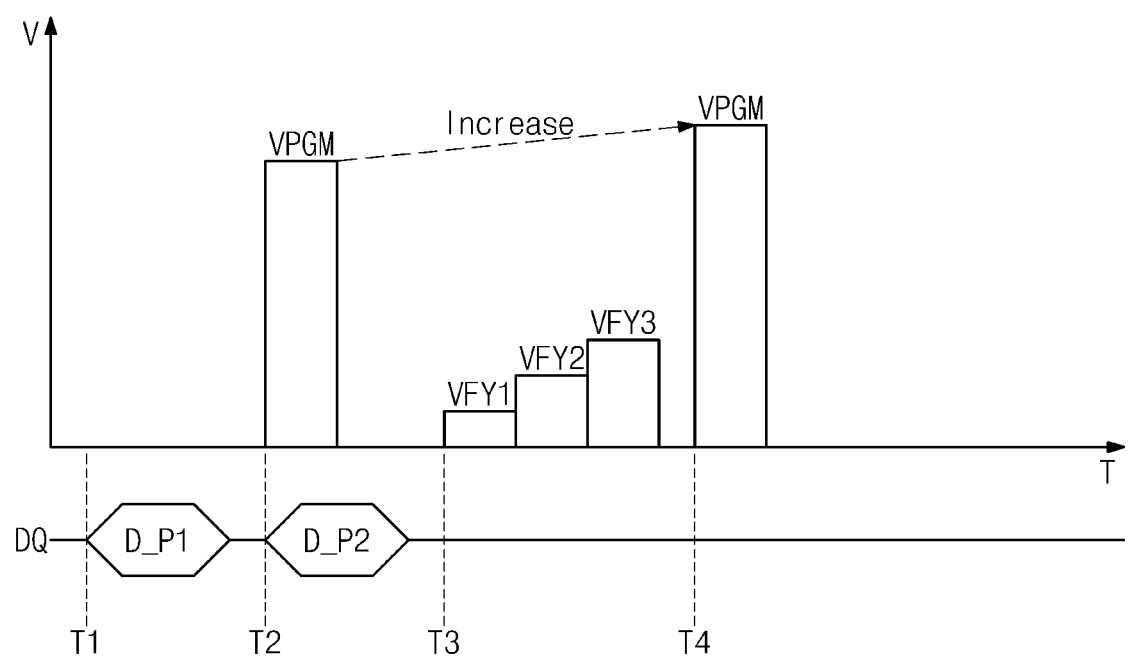
FIG. 13 shows a process in which a second program loop is performed following FIG. 11.

FIG. 13 shows a process in which a second program loop is performed following FIG. 11. Referring to FIGS. 12 and 13, threshold voltages of a part MC_P among memory cells E_P1 to be programmed to the first program state P1 may be higher than the first verification voltage VFY1, and threshold voltages of the remaining memory cells may be lower than or equal to the first verification voltage VFY1. Accordingly, the memory cells MC_P among the memory cells E_P1 may be set to "program inhibit", and the rest may be set to "program". Memory cells E_P2 and E_P3 to be programmed to the second and third program states P2 and P3 all may be at a fail state. Accordingly, the memory cells E_P2 and E_P3 may be set to "program". Afterwards, an increased program voltage VPGM may be applied to a selected word line at T4.

Figure 14:
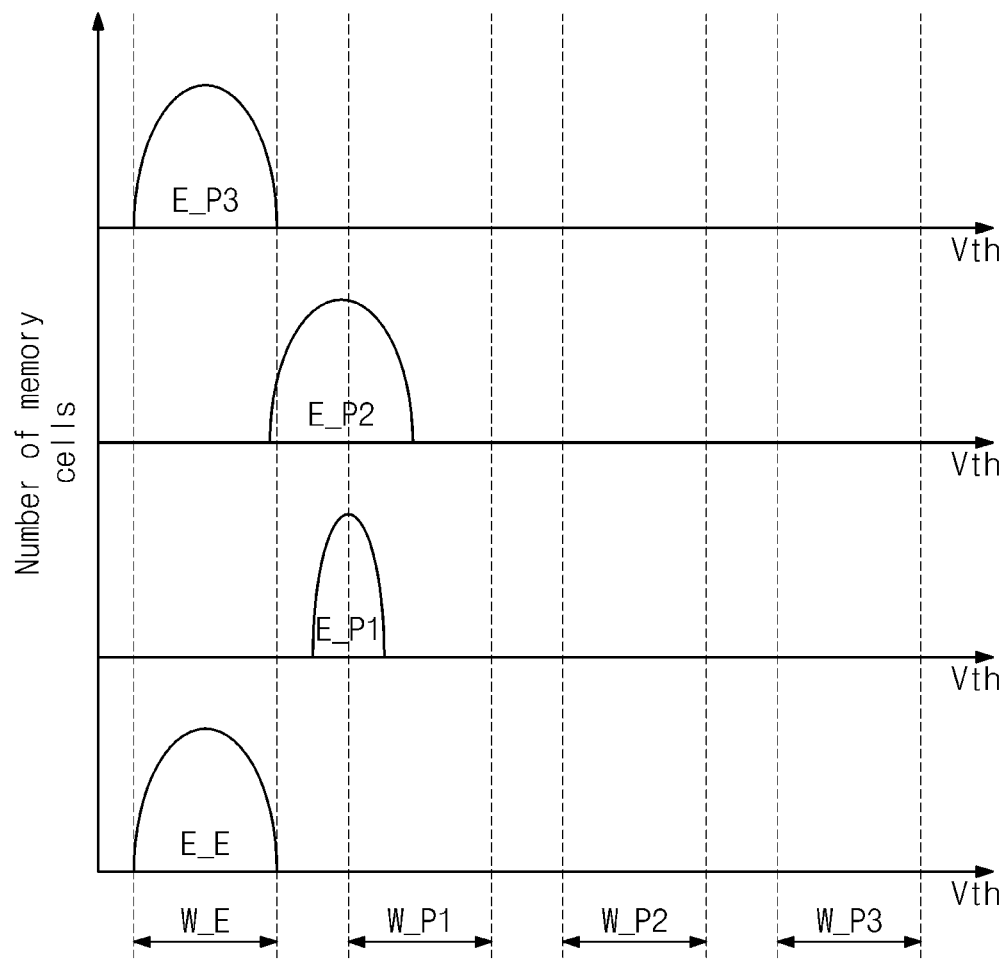
FIG. 14 shows an example of threshold voltages of memory cells changed from FIG. 12.

As the increased program voltage VPGM is applied to the selected word line, threshold voltages of memory cells illustrated in FIG. 12 may be changed as illustrated in FIG. 14. Referring to FIG. 14, threshold voltages of memory cells E_P2 and E_P3 to be programmed to the second and third program states P2 and P3 may increase. Since threshold voltages of a part MC_P among memory cells E_P1 to be programmed to the first program state P1 do not increase, a distribution width may be reduced even though threshold voltages of the memory cells E_P1 increase.

Figure 15:
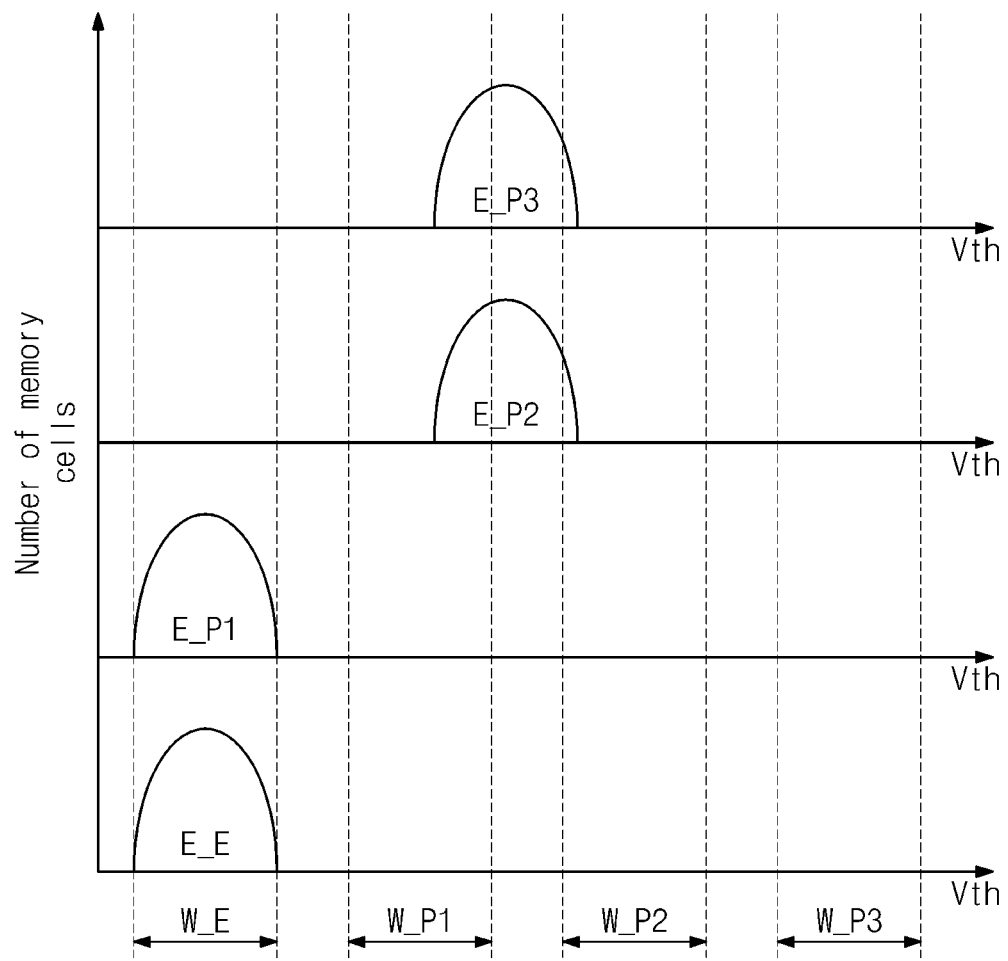
FIG. 15 shows threshold voltages of memory cells when second data is transmitted and a program of a first program loop is then performed.

FIG. 15 shows threshold voltages of memory cells when second data D_P2 is transmitted and a program of a first program loop is then performed. As illustrated in FIG. 7, in the second data D_P2, each of the erase state E and the first program state P1 may correspond to "1", and each of the second and third program states P2 and P3 may correspond to "0". Accordingly, when the first program loop is performed based on the second data D_P2, memory cells E_P2 and E_P3 to be programmed to the second and third program states E_P2 and E_P3 may be programmed, and memory cells E_P1 to be programmed to the first program state P1 may be program-inhibited. Accordingly, as illustrated in FIG. 15, threshold voltages of the memory cells E_P3 and E_P2 may increase, while threshold voltages of the memory cells E_P1 may not increase.

Figure 16:
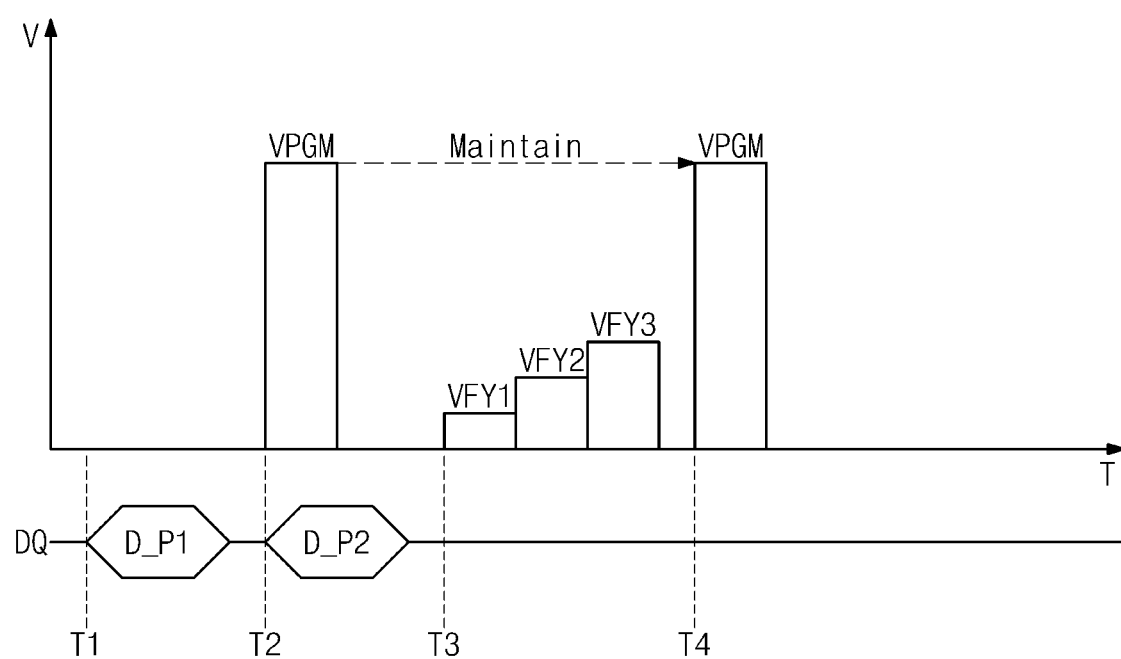
FIG. 16 is a diagram illustrating an example in which program loops of a program operation of FIG. 26 are performed.

In an embodiments of FIG. 12, when an increased program voltage is applied to a selected word line in a second program loop in a case that the first program state P1 and the second program state P2 cannot be distinguished and the memory cells MC_P cannot be program-inhibited, the memory cells MC_P illustrated in FIG. 12 may be programmed with the increased program voltage. In this case, the memory cells MC_P may be over-programmed. To prevent the memory cells MC_P from being over-programmed, as illustrated in FIG. 16, the program voltage VPGM of the second program loop may not increase. That is, if the second data D_P2 is provided to the nonvolatile memory device 110 prior to the first data D_P1 and a program operation is performed, a program loop may be performed twice using the same program voltage VPGM. Accordingly, a program time may not decrease but increase.

According to an embodiment of the disclosure, the controller 120 may be configured to provide the nonvolatile memory device 110 with data of a logical page in which a bit value of a state corresponding to the lowest threshold voltage range, for example, a bit value of the erase state E and a bit value of a state corresponding to a threshold voltage range following the lowest threshold voltage range, for example, a bit value of the first program state P1 are different from each other. Accordingly, memory cells E_P1 to be programmed to the lowest program state P1 are programmed and verified in the first program loop, and an execution time of a program loop may be shadowed by a transmission time of the second data D_P2.

As another example, to improve the reliability of memory cells, as illustrated in FIG. 15, the second data D_P2 may be loaded prior to the programming of the first data D_P1, and a program operation may start. The second data D_P2 may be loaded on the page buffer circuit 115 while a program of a first program loop of the program operation is performed based on the first data D_P1. In this case, after threshold voltages of memory cells E_P2 to be programmed to the second program state P2 and threshold voltages of memory cells E_P3 to be programmed to the third program state P3 increase as illustrated in FIG. 15, a program loop may be again performed using the same program voltage VPGM. For example, a program operation may start after a pre-program for increasing threshold voltages of memory cells E_P2 and E_P3 as illustrated in FIG. 15.

In this case, the coupling or other disturbances which the memory cells E_P1 experience when threshold voltages of the memory cells E_P2 and E_P3 increase as illustrated in FIG. 15 may be canceled while the memory cells E_P1 are programmed to the first program state P1. That is, the first data D_P1 may be loaded, and after a program operation starts, the second data D_P2 may be loaded, thereby reducing the coupling or other disturbs occurring during the program operation. This may mean that the integrity of data programmed at memory cells is improved.

Figure 17:
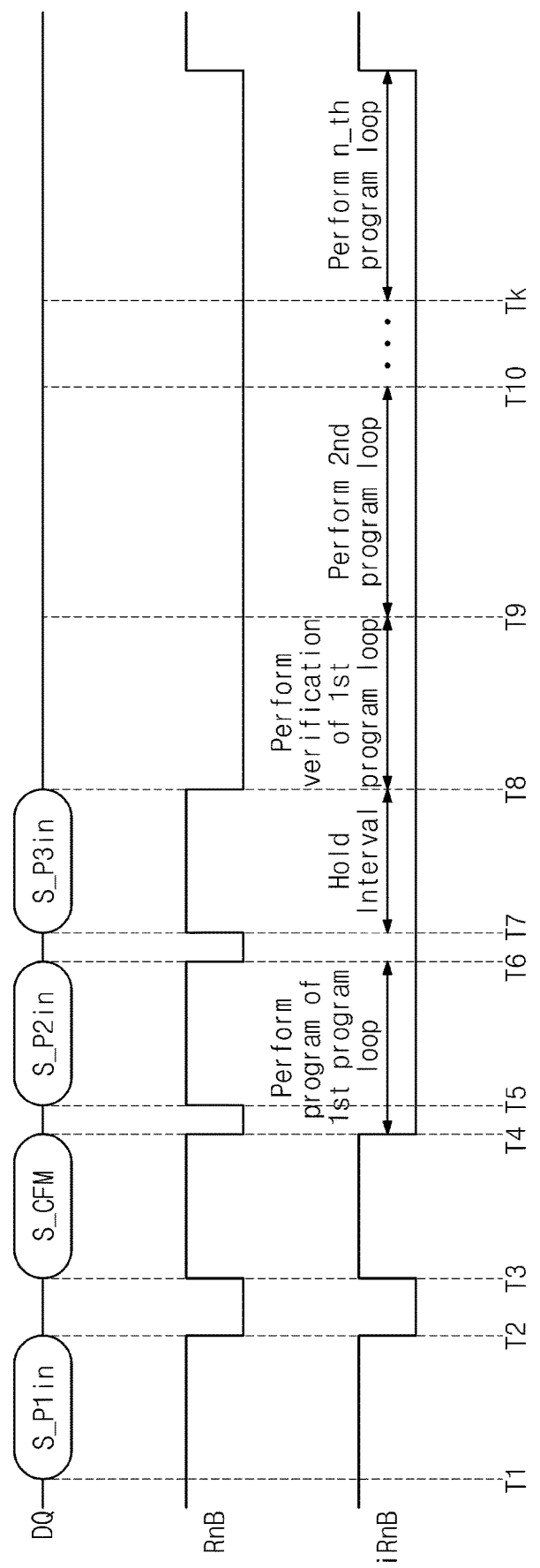
FIG. 17 shows a process in which a program operation according to an embodiment of the disclosure is performed when a physical page includes three logical pages.

FIG. 17 shows a process in which a program operation according to an embodiment of the disclosure is performed when a physical page includes three logical pages. In FIG. 17, the abscissa may indicate time. Referring to FIGS. 1, 3, and 17, at T1, the controller 120 may provide a first data input sequence S_P1in to the nonvolatile memory device 110 through the input/output lines DQ. The first data input sequence S_P1in may include data of a first logical page. The first logical page may have a determination point DP1 between the erase state E and the lowest program state P1.

At T2, the nonvolatile memory device 110 may perform dumping based on the first data input sequence S_P1in. During the dumping of the nonvolatile memory device 110, the internal ready/busy signal iRnB and the ready/busy signal RnB may transition to the busy state of the low level. When the dumping is completed, at T3, the nonvolatile memory device 110 may make the ready/busy signal RnB transition to the ready state of the high level. The internal ready/busy signal iRnB may also transition to the ready state of the high level.

As the ready/busy signal RnB transitions to the ready state of the high level, the controller 120 may provide the confirm sequence S_CFM to the nonvolatile memory device 110 through the input/output lines DQ. At T4, the nonvolatile memory device 110 may initiate a program operation, and the internal ready/busy signal iRnB and the ready/busy signal RnB may transition to the busy state of the low level. The internal ready/busy signal iRnB may be maintained at a low level until the program operation is completed, and the ready/busy signal RnB may transition to the ready state of the high level when the nonvolatile memory device 110 is ready to receive data.

As the ready/busy signal RnB transitions to the high level, at T5, the controller 120 may provide a second data input sequence S_P2in to the nonvolatile memory device 110 through the input/output lines DQ. The second data input sequence S_P2in may include data of a second logical page. While the second data input sequence S_P2in progresses, the nonvolatile memory device 110 may perform a program of the first program loop.

When the second data input sequence S_P2in is completed, the nonvolatile memory device 110 may dump the second data D_P2. While the nonvolatile memory device 110 dumps the second data D_P2, the ready/busy signal RnB may transition to the low level at time T6. When the dumping is completed, the nonvolatile memory device 110 may make the ready/busy signal RnB transition to the high level.

As the ready/busy signal RnB transitions to the high level, at T7, the controller 120 may provide a third data input sequence S_P3in to the nonvolatile memory device 110 through the input/output lines DQ. The third data input sequence S_P3in may include data of a third logical page.

In an embodiment, the nonvolatile memory device 110 may have a hold interval in which a program operation is held, until a program of a first program loop is performed and data of all logical pages is received.

When the third data input sequence S_P3in is completed, at T8, the nonvolatile memory device 110 may perform a verification of the first program loop. Afterwards, the nonvolatile memory device 110 may perform a second program loop between T9 and T10. At Tk, the nonvolatile memory device 110 may perform an n-th program loop and may end the program operation.

In an embodiment, the hold interval may occur in the case where two bits are programmed at a memory cell and in the case where loading of second data is not completed even after a program of the first program loop is completed. For example, until loading of second data is completed after a program of a first program loop is completed, the nonvolatile memory device 110 may have a hold interval in which another operation is not performed while waiting for the loading of the second data.

The scope and spirit of the disclosure may not be limited to the case that one physical page includes two or three logical pages. For example, the scope and spirit of the disclosure may be expanded to include the case that m logical pages (m being a positive integer) are included in one physical page. For example, the scope and spirit of the disclosure may be expanded to include the case that m bits are programmed at one physical page. A program operation may start after data of at least one page is provided to the nonvolatile memory device 110. For example, a program of a first program loop may be performed at the nonvolatile memory device 110. A program operation may continue after data of the remaining logical pages is provided to the nonvolatile memory device 110. For example, a verification of the first program loop and the remaining program loops following the first program loop may be performed.

In the above-described embodiments, an embodiment of the disclosure is exemplified as two bits are programmed at each memory cell. However, the scope and spirit of the disclosure may not be limited thereto.

Figure 18:
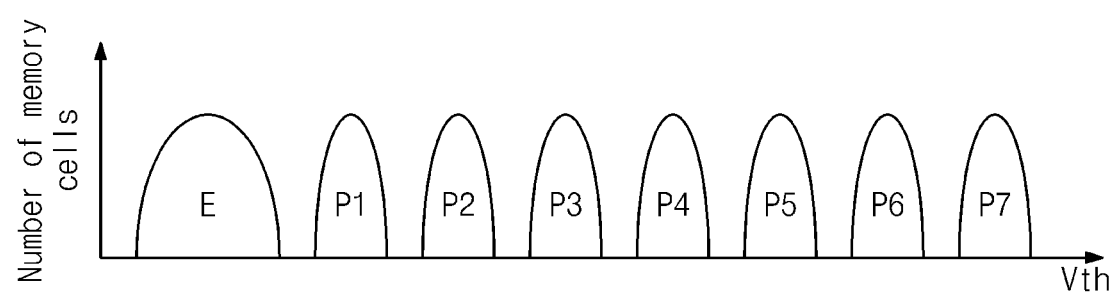
FIG. 18 is a diagram illustrating threshold voltages of memory cells when three bits are programmed at each memory cell.
Figure 19:
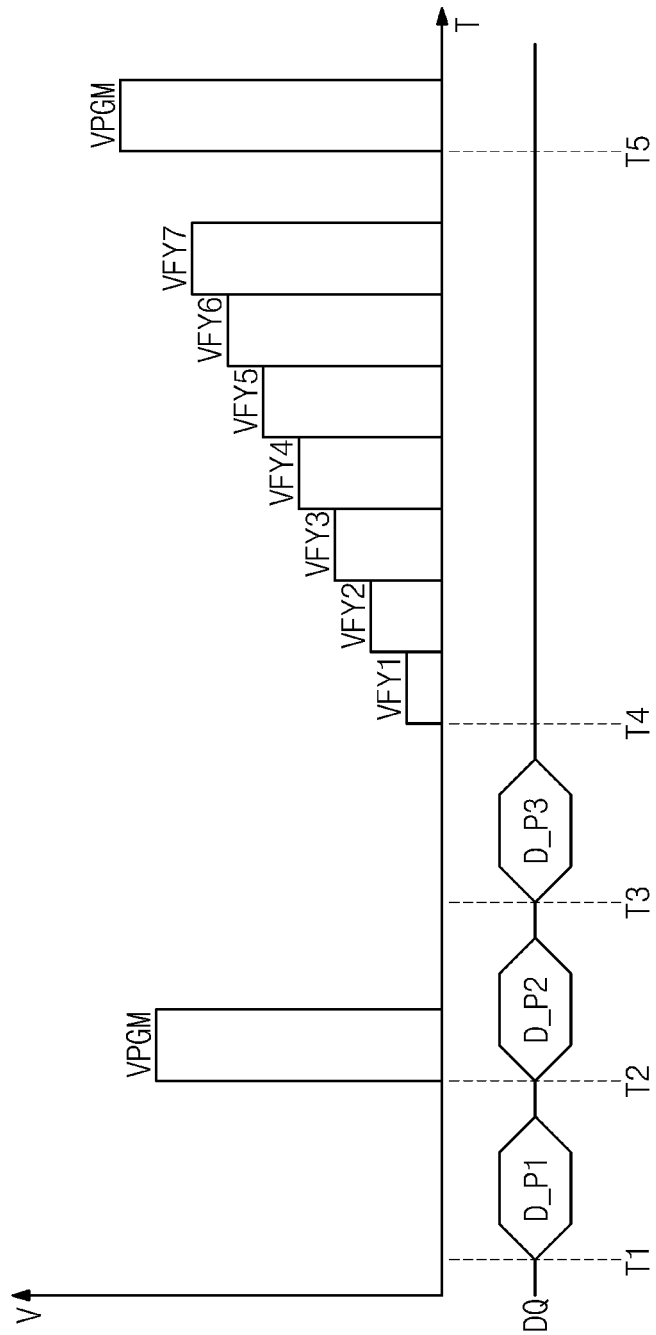
FIG. 19 shows a process in which a first program loop is performed when three bits are programmed at each memory cell.

FIG. 18 is a diagram illustrating threshold voltages of memory cells MC when three bits are programmed at each memory cell. FIG. 19 shows a process in which a first program loop is performed when three bits are programmed at each memory cell. In FIG. 18, the abscissa represents a threshold voltage, and the ordinate represents the number of memory cells. In FIG. 19, the abscissa represents time T, and the ordinate represents data transmitted through input/output lines DQ and a voltage V applied to a word line connected to selected memory cells.

Referring to FIGS. 3, 18, and 19, each memory cell may have one of an erase state E and first to seventh program states P1 to P7. To program memory cells, data D_P1, D_P2, and D_P3 corresponding to three pages may be loaded on the page buffer circuit 115. Three data latches DL (refer to FIG. 4) may be connected to one bit line BL. Three bits corresponding to, respectively, three pages may be loaded on three data latches DL, respectively.

In an embodiment, as described with reference to FIGS. 7, 12, 13, and 14, data of a page in which a bit corresponding to the erase state E and a bit corresponding to the first program state P1 are different from each other may be first of all loaded on the page buffer circuit 115 as the first data D_P1. Data D_P2 and D_P3 of the remaining two pages may be loaded on the page buffer circuit 115 while a program of a first program loop of a program operation is performed.

In an embodiment, as described with reference to FIGS. 7, 15, and 16, data of a page in which a bit corresponding to the erase state E and a bit corresponding to the first program state P1 are equal to each other may be first of all loaded on the page buffer circuit 115 as the first data D_P1 at time T1. For example, data of a page in which a bit of the seventh program state P7 (e.g., the highest program state) or the sixth program state P6 (e.g., a lower program state just adjacent to the highest program state) indicates not program-inhibit but program may be first of all loaded on the page buffer circuit 115 as the first data D_P1. Data D_P2 and D_P3 of the remaining two pages may be loaded on the page buffer circuit 115 at times T2 and T3, respectively, while a program of a first program loop of a program operation is performed. Verify operations VFY1-VFY7 may be executed at time T4, and a subsequent programming operation executed at time T5.

In an embodiment, the programming of memory cells may be completed through one program operation from an erase state. That programming is completed may mean that all bits to be written at memory cells are written and additional programming associated with the memory cells is inhibited. The scope and spirit of the disclosure may be applied to the case that memory cells are programmed through one program operation or the case that programming is completed when a program operation is repeated twice or more.

Figure 20:
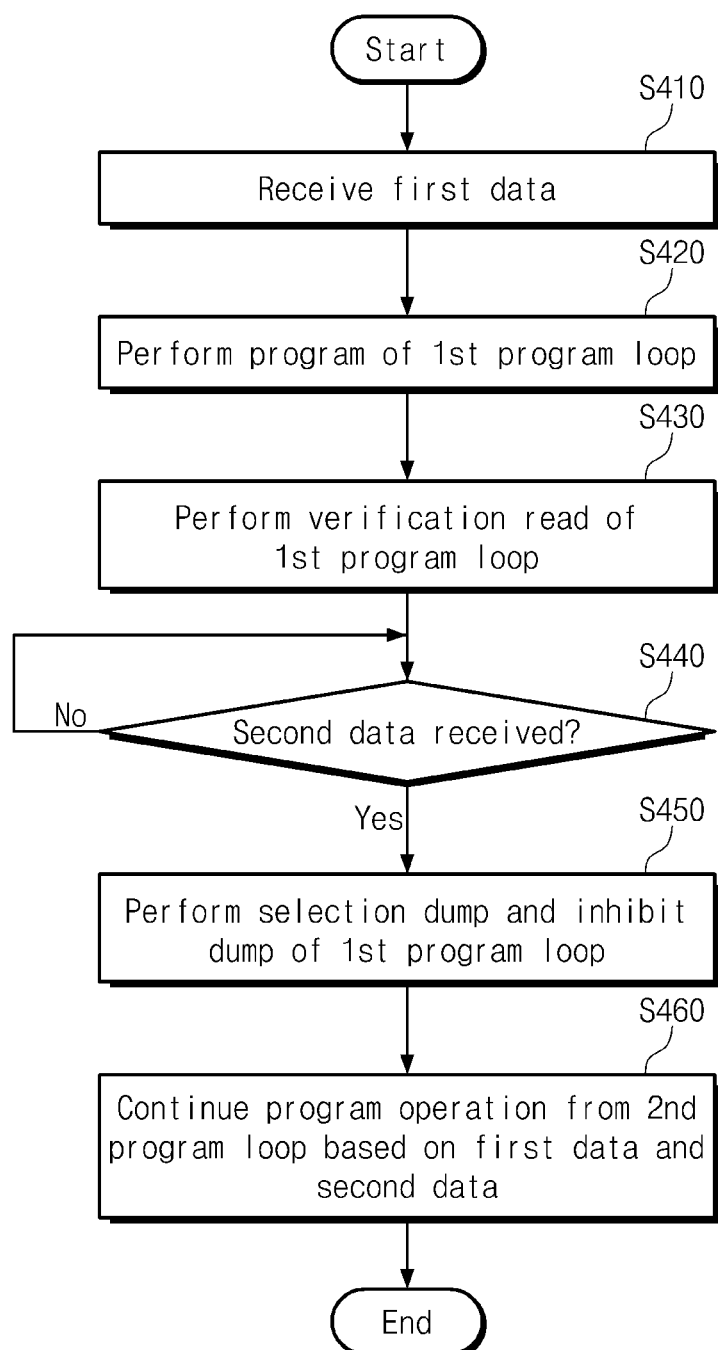
FIG. 20 is a flowchart illustrating an operating method of a nonvolatile memory device according to an embodiment of the disclosure.

FIG. 20 is a flowchart illustrating an operating method of a nonvolatile memory device 110 according to an embodiment of the disclosure. Referring to FIGS. 1, 3, 7, and 20, in step S410, the nonvolatile memory device 110 may receive first data from the controller 120. For example, data of a page may be loaded on the page buffer circuit 115 through the data input/output circuit 117. First data may have a determination point DP1 between the erase state E and the lowest program state P1.

In step S420, the nonvolatile memory device 110 may perform a program of a first program loop of a program operation. In step S430, the nonvolatile memory device 110 may perform a verification read of the first program loop.

In step S440, whether second data is received may be determined. For example, whether data of a second page or data of the remaining pages is loaded on the page buffer circuit 115 may be determined. When second data is not loaded on the page buffer circuit 115 until a program and a verification read of the first program loop are performed, the nonvolatile memory device 110 may stop the program operation and may wait until the second data is received. In an embodiment, since the first data has a determination point between the erase state E and the lowest program state P1, threshold voltages of memory cells corresponding to the lowest program state P1 may increase. Accordingly, the verification read performed using the first verification voltage VFY1 corresponding to the lowest program state P1 may be valid.

In step S450, the nonvolatile memory device 110 may perform a selection dump and an inhibit dump of the first program loop. As described with reference to FIG. 9, the second data may be required to perform the selection dump and the inhibit dump. Accordingly, the nonvolatile memory device 110 may perform the selection dump and inhibit dump of the first program loop after the second data is loaded on the page buffer circuit 115.

In step S460, the nonvolatile memory device 110 may continue to perform the program operation based on the first data and the second data.

Compared with a program operation of FIG. 8, the program operation of the nonvolatile memory device 110 may further include a verification read which is performed based on the first data. When the second data is received, the nonvolatile memory device 110 may perform a selection dump and an inhibit dump associated with the verification read result using the first data and the second data. Accordingly, a time taken to load the second data on the page buffer circuit 115 may be shadowed by a time taken to perform the verification read.

Figure 21:
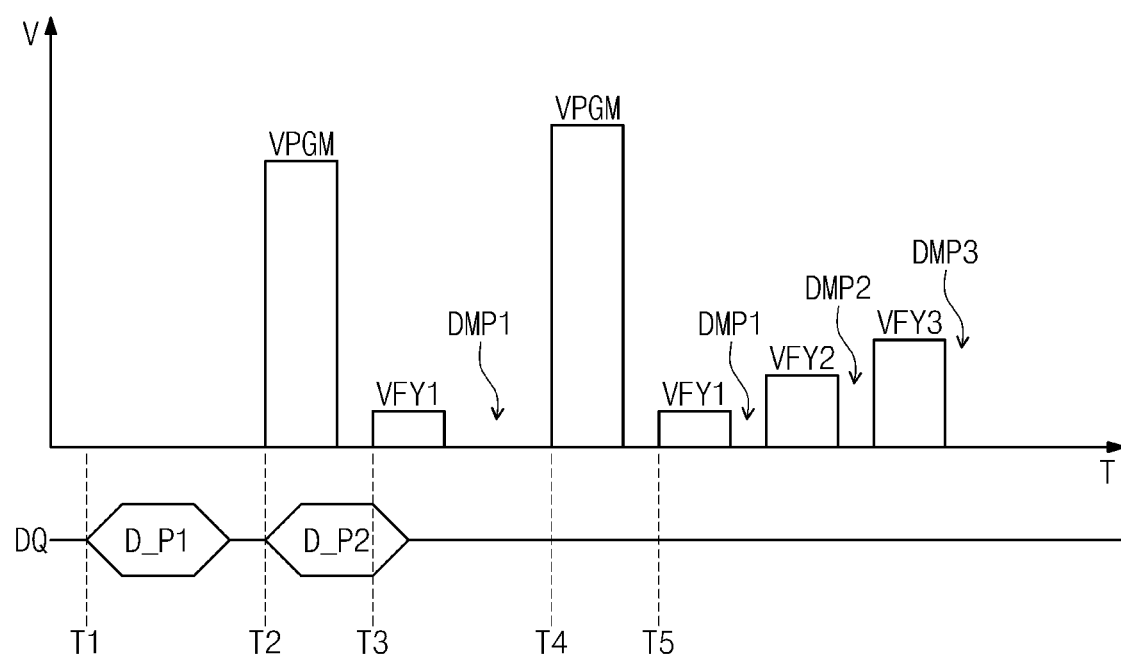
FIG. 21 shows a process in which a first program loop of a program operation illustrated in FIG. 20 is performed.

FIG. 21 shows a process in which a first program loop of a program operation illustrated in FIG. 20 is performed. In FIG. 21, the abscissa represents time T, and the ordinate represents data transmitted through input/output lines DQ and a voltage V applied to a word line connected to selected memory cells.

Referring to FIGS. 3 and 21, at T1, first data D_P1 may be provided to the page buffer circuit 115 through the input/output lines DQ. When the first data D_P1 is completely received, the page buffer circuit 115 may set up bit lines BL based on the first data D_P1. At T2, the row decoder circuit 113 may apply a program voltage VPGM to a selected word line. At T3, the page buffer circuit 115 may precharge bit lines BL, and the row decoder circuit 113 may apply a first verification voltage VFY1 to the selected word line. During the programming in which the program voltage VPGM is applied to the selected word line and the first verification voltage VFY1 is applied thereto, second data D_P2 may be provided to the page buffer circuit 115 through the input/output lines DQ.

First dump DMP1 may be performed when the second data D_P2 is loaded on the page buffer circuit 115 and a verification read using the first verification voltage VFY1 is completed. The first dump DMP1 may include a selection dump for selecting the verification read results corresponding to memory cells to be programmed to program states associated with the first verification voltage VFY1. The first dump DMP1 may further include an inhibit dump which is performed to apply the verification read results selected by the selection dump to data latches DL (refer to FIG. 4) of the page buffer circuit 115.

Afterwards, at T4, a second program loop may be performed based on the first data D_P1 and the second D_P2. In the second program loop, programming in which the program voltage VPGM is applied at time T4 and verification reads in which the first to third verification voltages VFY1 to VFY3 are applied may be performed at time T5. After the first verification voltage VFY1 is applied and before the second verification voltage VFY2 is applied, there may be performed a first dump DMP1 including a selection dump in which a verification read result associated with the first verification voltage VFY1 is selected and an inhibit dump in which the selected verification read result is applied. After the second verification voltage VFY2 is applied and before the third verification voltage VFY3 is applied, there may be performed a second dump DMP2 including a selection dump DMP2 in which a verification read result associated with the second verification voltage VFY2 is selected and an inhibit dump in which the selected verification read result is applied. After the third verification voltage VFY3 is applied, there may be performed a third dump DMP3 including an inhibit dump in which a verification read result is applied.

Figure 22:
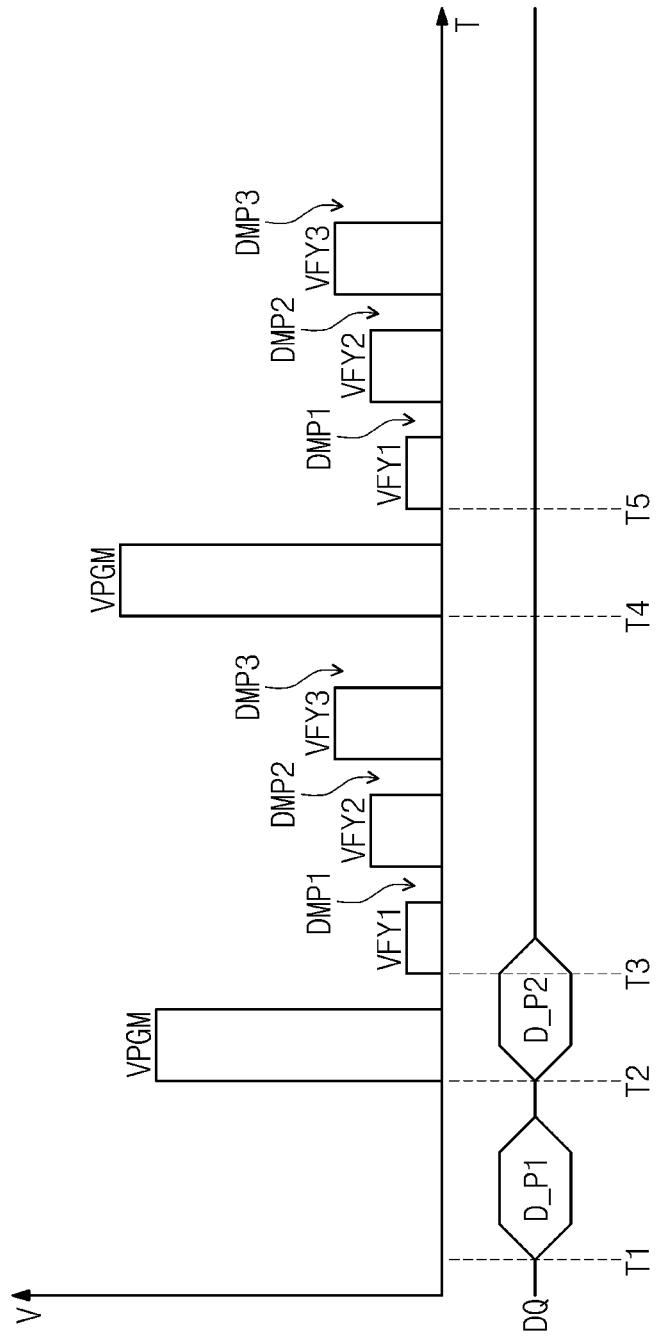
FIG. 22 shows an example in which verification reads are performed using first to third verification voltages in a first program loop.

In an embodiment, since the probability that a program inhibit occurs at a program state associated with the second verification voltage VFY2 and a program state associated with the third verification voltage VFY3 in the first program loop is very low, verification reads using the second verification voltage VFY2 and the verification voltage VFY3 may be skipped in the first program loop. However, the scope and spirit of the disclosure may not be limited thereto. For example, as illustrated in FIG. 22, verification reads using the first to third verification voltages VFY1 to VFY3 and first to third dumps DMP1-DMP3 may be performed in the first program loop.

Figure 23:
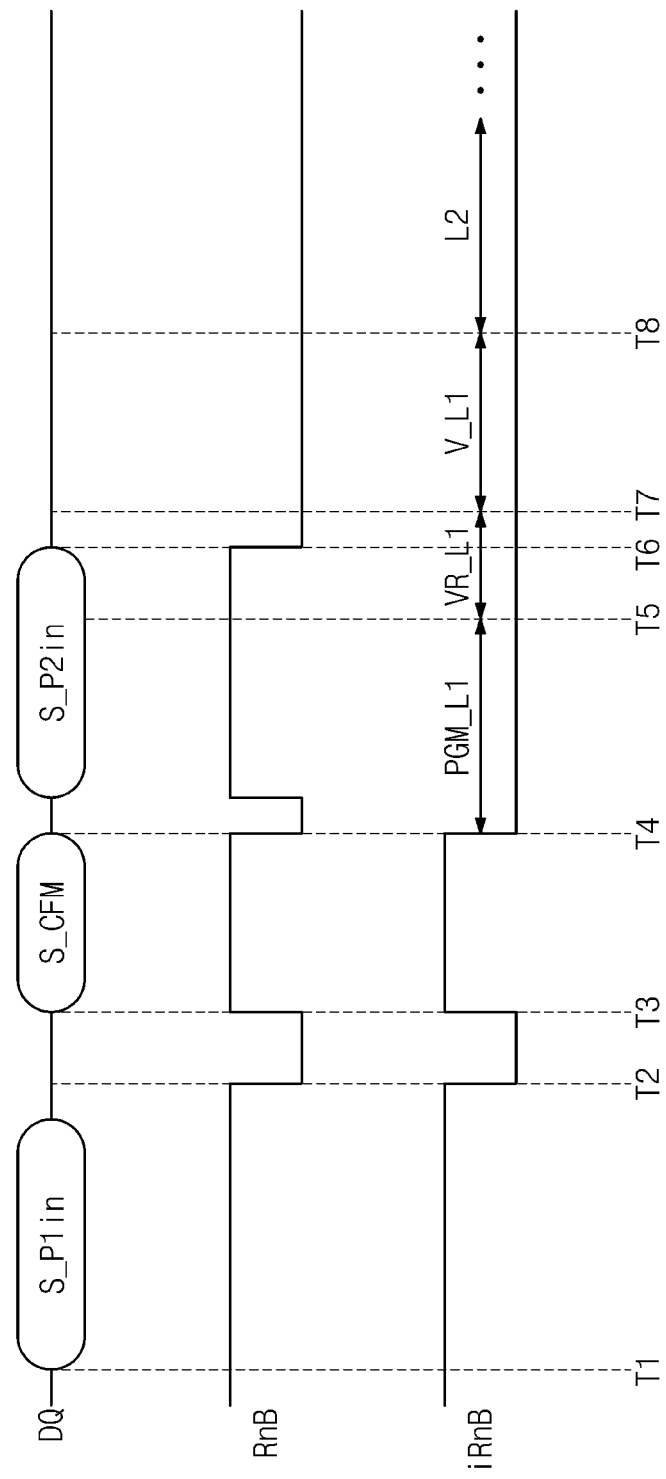
FIG. 23 is a timing diagram illustrating a process in which program loops of a program operation of FIG. 20 are performed.

FIG. 23 is a timing diagram illustrating a process in which program loops of a program operation of FIG. 20 are performed. In FIG. 23, the abscissa may indicate time. Referring to FIGS. 1, 3, 7, 20, and 23, at T1, the controller 120 may provide a first data input sequence S_P1in to the nonvolatile memory device 110 through the input/output lines DQ. The first data input sequence S_P1in may include data of a first logical page. The first logical page may have a determination point DP1 between the erase state E and the lowest program state P1.

At T2, the nonvolatile memory device 110 may perform dumping based on the first data input sequence S_P1in. During the dumping of the nonvolatile memory device 110, the internal ready/busy signal iRnB and the ready/busy signal RnB may transition to the busy state of the low level. When the dumping is completed, at T3, the nonvolatile memory device 110 may make the ready/busy signal RnB transition to the ready state of the high level. The internal ready/busy signal iRnB may also transition to the ready state of the high level.

As the ready/busy signal RnB transitions to the ready state of the high level at time T3, the controller 120 may provide the confirm sequence S_CFM to the nonvolatile memory device 110 through the input/output lines DQ. At T4, the nonvolatile memory device 110 may initiate a program operation, and the internal ready/busy signal iRnB and the ready/busy signal RnB may transition to the busy state of the low level. The internal ready/busy signal iRnB may be maintained at a low level until the program operation is completed, and the ready/busy signal RnB may transition to the ready state of the high level when the nonvolatile memory device 110 is ready to receive data.

As the ready/busy signal RnB transitions to the high level, the controller 120 may provide a second data input sequence S_P2in to the nonvolatile memory device 110 through the input/output lines DQ. The second data input sequence S_P2in may include data of a second logical page. While the second data input sequence S_P2in progresses, in the first program loop, the nonvolatile memory device 110 may perform program PGM_L1 and a verification read VR_L1 using the first verification voltage VFY1 at T4 and at T5, respectively.

As the second data input sequence S_P2in ends at T6, the ready/busy signal RnB may transition to a high state from a low state. When the verification read VR_L1 of the first program loop ends at T7, the remaining verification V_L1 of the first program loop may be performed. For example, as illustrated in FIG. 21, the remaining verification V_L1 may include a first dump DMP1 and pass-fail check. For example, as illustrated in FIG. 22, the remaining verification V_L1 may include a first dump DMP1, a verification read using the second verification voltage VFY2, a second dump DMP2, a verification read using the third verification voltage VFY3, a third dump DMP3, and pass-fail check.

Afterwards, a second program loop L2 may be performed at T8, and a program operation may continue.

Figure 24:
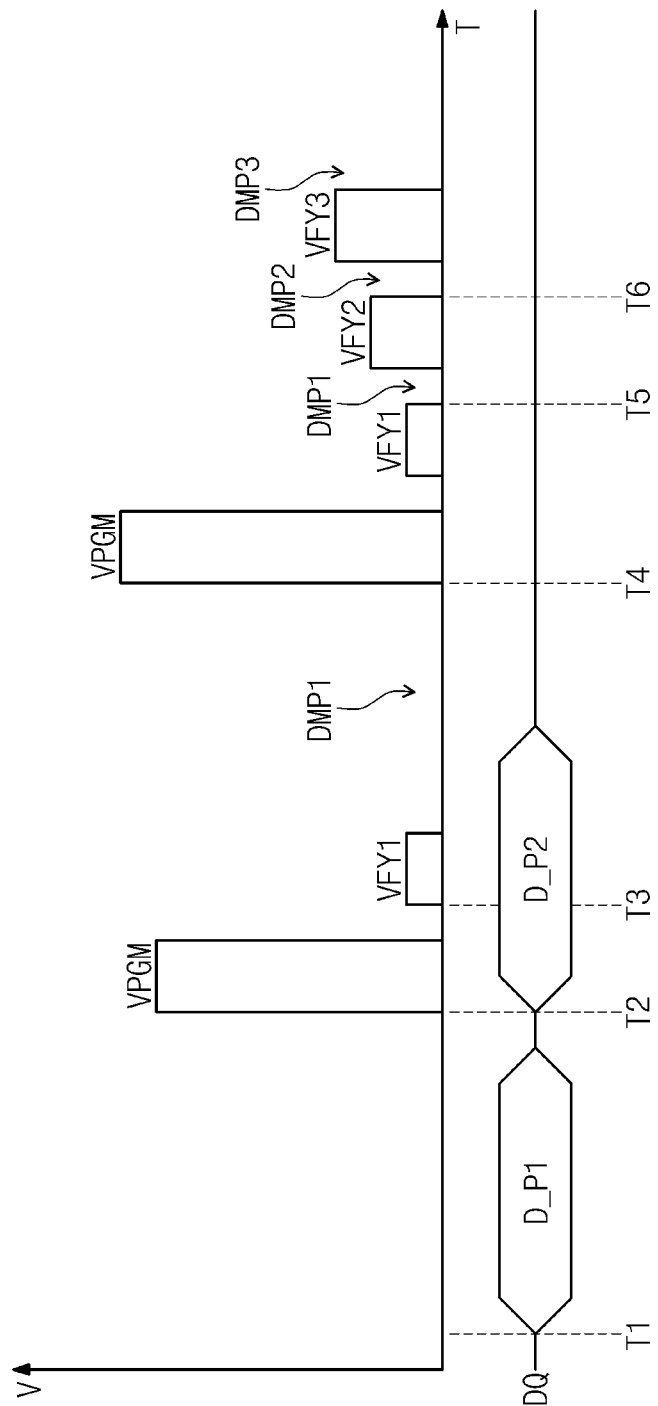
FIG. 24 shows an example in which a first dump is delayed when a time for a data input sequence increases.

FIG. 24 shows an example in which a first dump is delayed when a time for a data input sequence increases. In FIG. 24, the abscissa represents time T, and the ordinate represents data transmitted through input/output lines DQ and a voltage V applied to a word line connected to selected memory cells.

A time when the first data D_P1 is loaded and a time when the second data D_P2 is loaded are illustrated in FIG. 24 as being longer than those of FIG. 21. For example, the second data D_P2 may continue even after a verification read using a first verification voltage VFY1 is completed. The first dump DMP1 may be delayed until the second data D_P2 is completely loaded. For example, the first data DMP1 may be delayed until a verification read using the first verification voltage VFY1 is completed.

Figure 25:
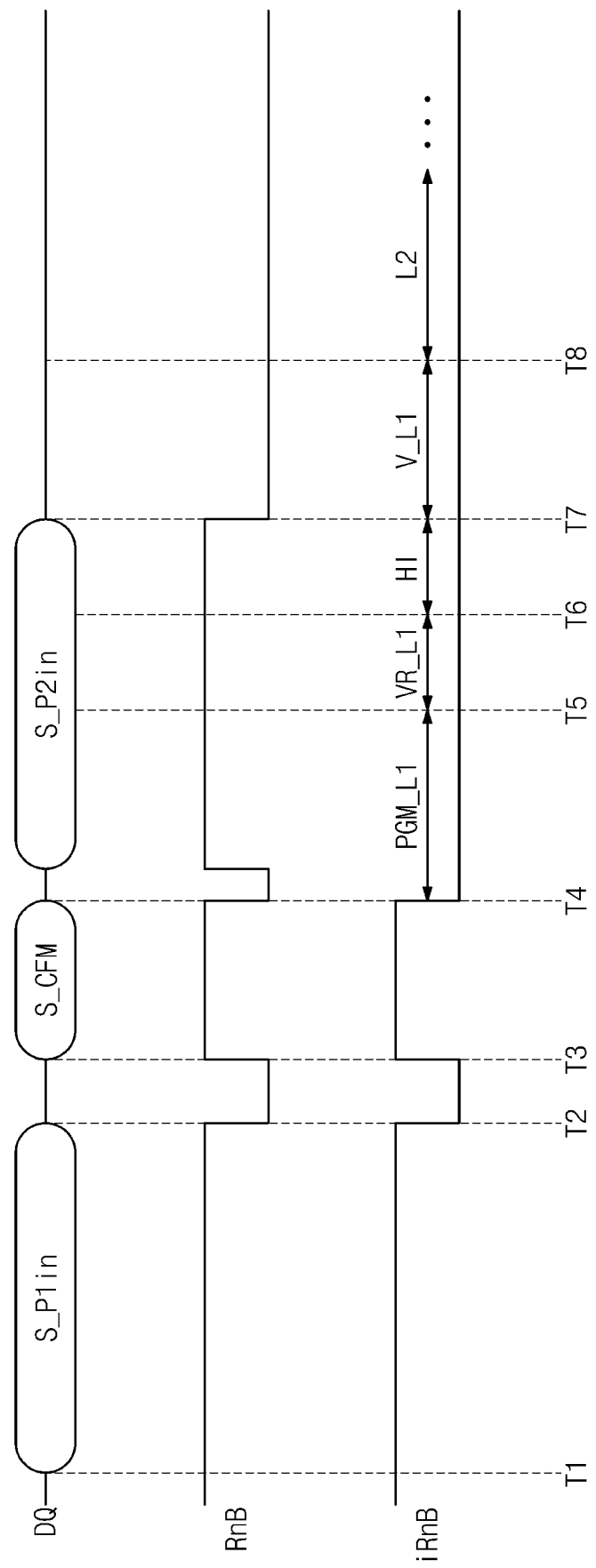
FIG. 25 shows an example in which a hold interval is generated due to an increase in a loading time of data.

FIG. 25 shows an example in which a hold interval is generated due to an increase in a loading time of data. In FIG. 25, the abscissa may indicate time. A time for the first data input sequence S_P1in and a time for the second data input sequence S_P2in are illustrated in FIG. 25 as being longer than those of FIG. 23. For example, the second data input sequence S_P2in may continue even after, with regard to a first program loop, program PGM_L1 and a verification read VR_L1 using a first verification voltage VFY1 are completed. For example, the second data input sequence S_P2in may continue up to T7. Between T6 and T7, the nonvolatile memory device 110 may have a hold interval HI in which there is not performed any other operation besides the second data input sequence S_P2in.

When the second data input sequence S_P2in is completed, the remaining verification V_L1 of the first program loop may be performed at T7, and a second program loop L2 may be performed at T8.

In an embodiment, as described with reference to FIG. 17, even though a time for a data input sequence does not increase, the hold interval may be generated when the number of data input sequences increases.

Figure 26:
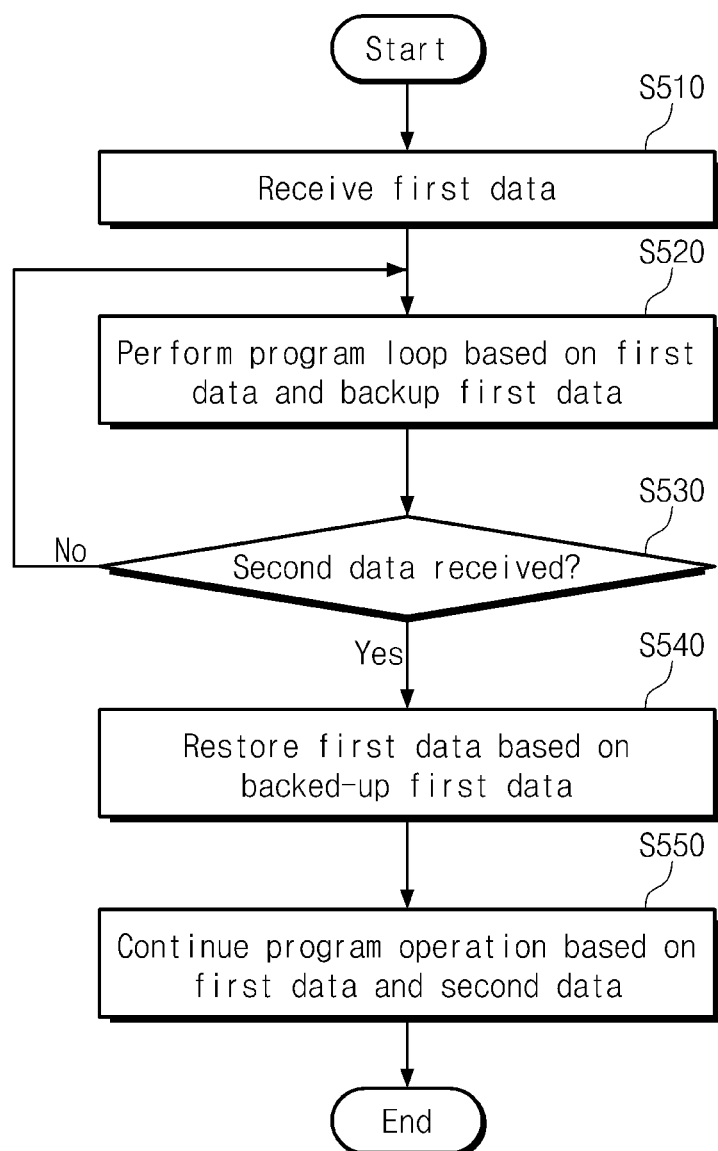
FIG. 26 is a flowchart illustrating an application of an operating method of a nonvolatile memory device according to an embodiment of the disclosure.

FIG. 26 is a flowchart illustrating an application of an operating method of a nonvolatile memory device according to an embodiment of the disclosure. Referring to FIGS. 1, 3, 7, and 26, in step S510, the nonvolatile memory device 110 may receive first data from the controller 120. For example, data of a page may be loaded on the page buffer circuit 115 through the data input/output circuit 117. First data may have a determination point DP1 between the erase state E and the lowest program state P1.

In step S520, the nonvolatile memory device 110 may perform a program loop based on the first data and may back-up the first data. In an embodiment, the program loop may include a verification read using the first verification voltage VFY1 corresponding to a determination point DP1 and partial dump in which a part of a verification read result is applied to data latches DL (refer to FIG. 4) based on the first data. The partial dump may include an inhibit dump in which the verification read result is applied to data latches DL. In an embodiment, since a program and a verification read are performed based on the first data, with second data not loaded, the partial dump may not include a selection dump.

In step S530, the nonvolatile memory device 110 may repeat a program loop of step S520 until the second data is loaded.

As the second data is completely loaded, in step S540, the nonvolatile memory device 110 may restore the first data based on the backed-up first data. For example, the nonvolatile memory device 110 may restore data of data latches DL of memory cells, which are not memory cells to be verified using the first verification voltage VFY1, from among memory cells program-inhibited by the first verification voltage VFY1.

In step S550, the nonvolatile memory device 110 may continue to perform the program operation based on the first data and the second data.

Figure 27:
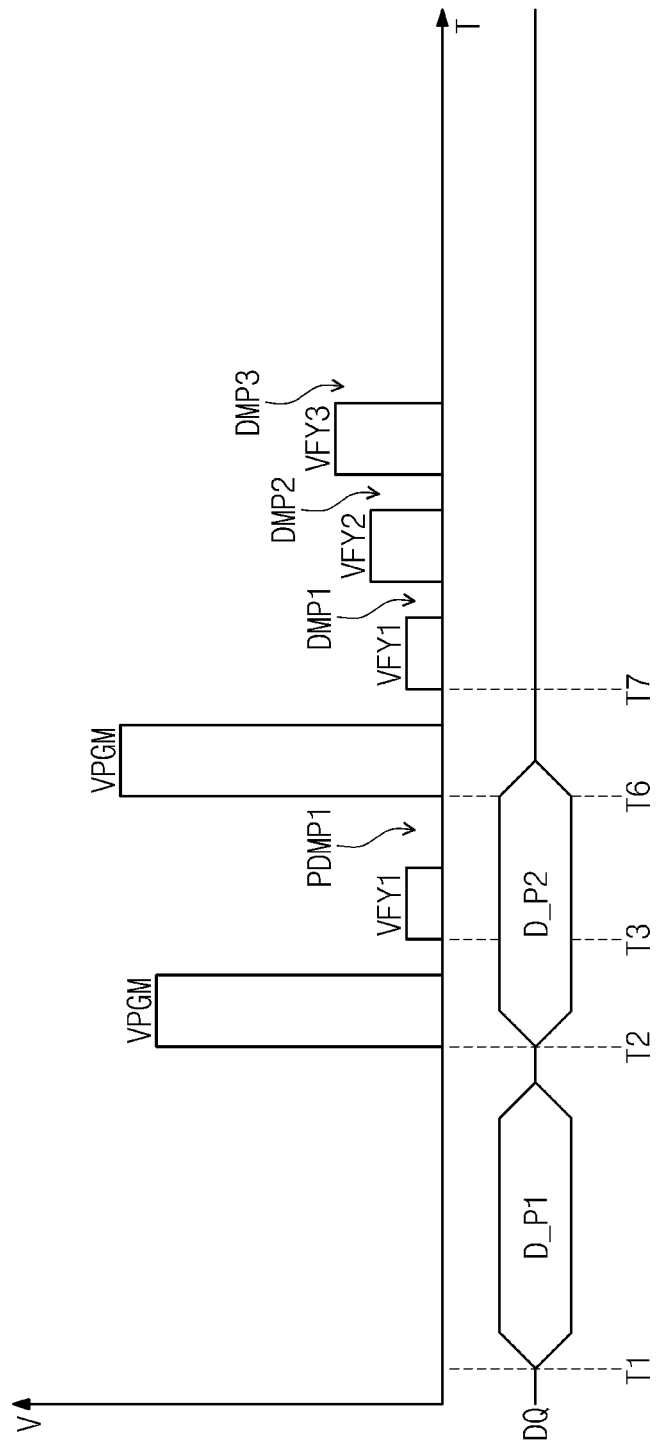
FIG. 27 is a diagram illustrating an example in which program loops of a program operation of FIG. 26 are performed.

FIG. 27 is a diagram illustrating an example in which program loops of a program operation of FIG. 26 are performed. In FIG. 27, the abscissa represents time T, and the ordinate represents data transmitted through input/output lines DQ and a voltage V applied to a word line connected to selected memory cells.

Referring to FIGS. 3, 26, and 27, at T1, first data D_P1 may be provided to the page buffer circuit 115 through the input/output lines DQ. A first program loop may be performed when the first data D_P1 is completely received. For example, the page buffer circuit 115 may set up bit lines BL based on the first data D_P1. At T2, the row decoder circuit 113 may apply a program voltage VPGM to a selected word line. At T3, the page buffer circuit 115 may precharge bit lines BL, and the row decoder circuit 113 may apply a first verification voltage VFY1 to the selected word line. Afterwards, first partial dump PDMP1 may be performed.

Second data D_P2 may not be completely loaded until the first program loop is completed. At this time, the nonvolatile memory device 110 may initiate a second program loop without waiting for loading of the second data D_P2. For example, a program voltage VPGM may be applied to the selected word line at T6.

In an embodiment, the second data D_P2 may be completely loaded while a program of the second program loop is performed. The nonvolatile memory device 110 may restore data of data latches DL (refer to FIG. 4) using backup data of the first data and the second data. The nonvolatile memory device 110 may perform verification reads using first to third verification voltages VFY1 to VFY3 and first to third dumps DMP1 to DMP3, based on the first data and the second data at time T7.

In an embodiment, in FIG. 27, an embodiment of the disclosure is exemplified as the second data D_P2 is applied to the program operation immediately without delay when the second data D_P2 is completely loaded during the execution of a program loop. However, the second data D_P2 may be applied to the program operation from a next program loop after a program loop being executed is completed. For example, the nonvolatile memory device 110 may perform a verification read using the first verification voltage VFY1 and the first partial dump PDMP1 and may end the second program loop. Afterwards, the nonvolatile memory device 110 may perform the program and verification using the first data and the second data, from a third program loop.

Figure 28:
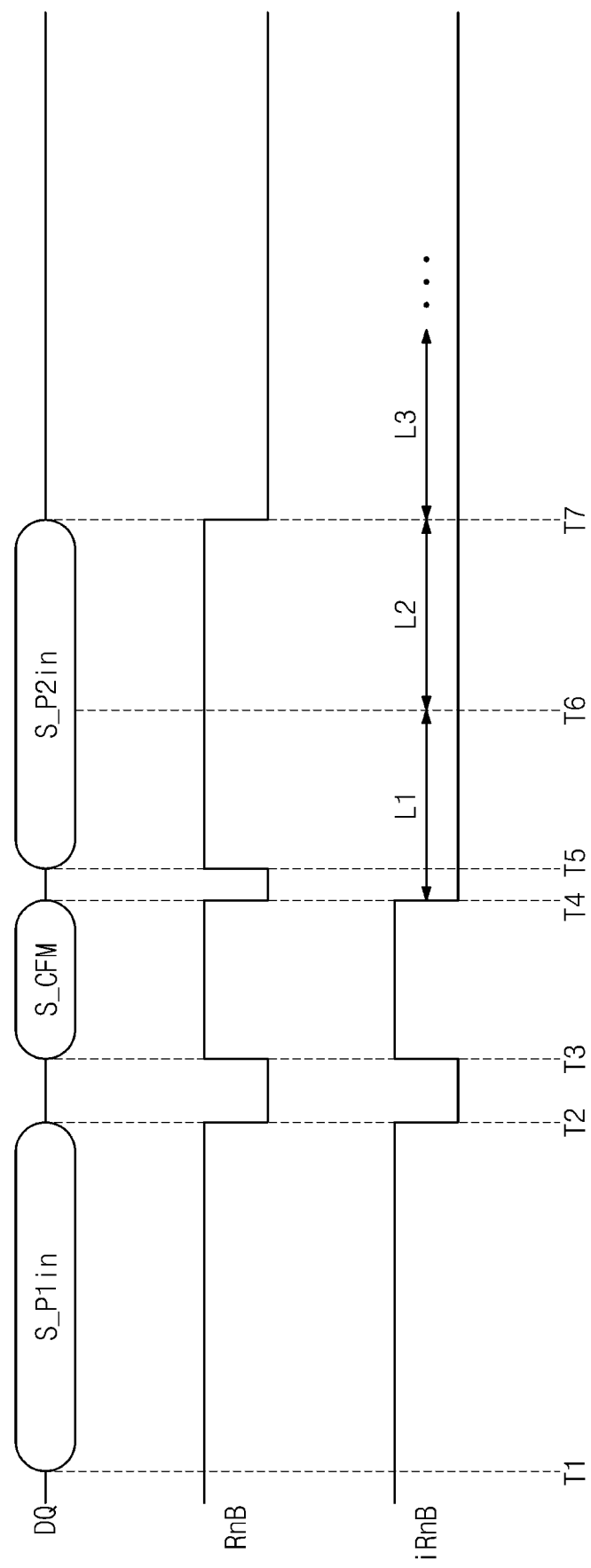
FIG. 28 is a timing diagram illustrating a process in which program loops of a program operation of FIG. 26 are performed.

FIG. 28 is a timing diagram illustrating a process in which program loops of a program operation of FIG. 26 are performed. In FIG. 28, the abscissa may indicate time. Referring to FIGS. 1, 3, 7, 26, and 28, at T1, the controller 120 may provide a first data input sequence S_P1in to the nonvolatile memory device 110 through the input/output lines DQ. The first data input sequence S_P1in may include data of a first logical page. The first logical page may have a determination point DP1 between the erase state E and the lowest program state P1.

At T2, the nonvolatile memory device 110 may perform dumping based on the first data input sequence S_P1in. During the dumping of the nonvolatile memory device 110, the internal ready/busy signal iRnB and the ready/busy signal RnB may transition to the busy state of the low level. When the dumping is completed, at T3, the nonvolatile memory device 110 may make the ready/busy signal RnB transition to the ready state of the high level. The internal ready/busy signal iRnB may also transition to the ready state of the high level.

As the ready/busy signal RnB transitions to the ready state of the high level, the controller 120 may provide the confirm sequence S_CFM to the nonvolatile memory device 110 through the input/output lines DQ. At T4, the nonvolatile memory device 110 may initiate a program operation, and the internal ready/busy signal iRnB and the ready/busy signal RnB may transition to the busy state of the low level. The internal ready/busy signal iRnB may be maintained at a low level until the program operation is completed, and the ready/busy signal RnB may transition to the ready state of the high level when the nonvolatile memory device 110 is ready to receive data at time T5.

As the ready/busy signal RnB transitions to the high level, at T5, the controller 120 may provide a second data input sequence S_P2in to the nonvolatile memory device 110 through the input/output lines DQ. The second data input sequence S_P2in may include data of a second logical page. While the second data input sequence S_P2in progresses, the nonvolatile memory device 110 may perform a first program loop L1 and a second program loop L2 at T4 and T6, respectively.

As the second data input sequence S_P2in ends at T7, the ready/busy signal RnB may transition to a high state from a low state. Furthermore, the nonvolatile memory device 110 may perform a third program loop L3 based on the first data and the second data at time T7.

Figure 29:
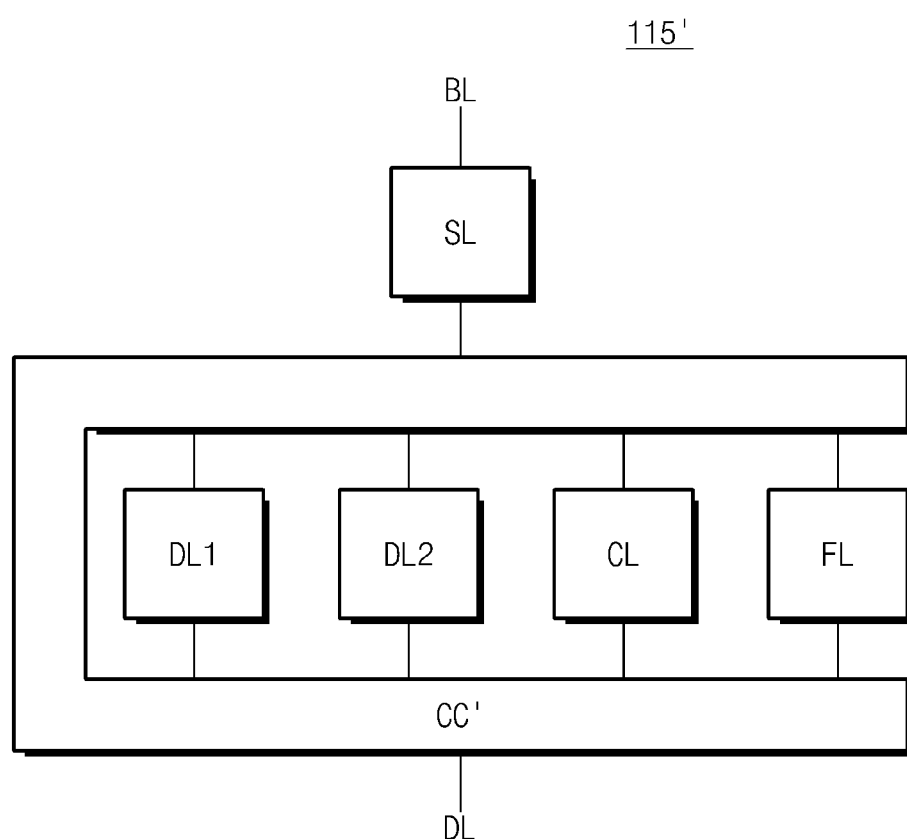
FIG. 29 is a block diagram illustrating an application of a page buffer circuit according to an embodiment of the disclosure.

FIG. 29 is a block diagram illustrating an application 115' of a page buffer circuit 115 according to an embodiment of the disclosure. Compared to the page buffer circuit 115 of FIG. 4, a page buffer circuit 115' of FIG. 29 may further include a force latch FL connected to a bit line and a control circuit CC' that differs from the control circuit CC of FIG. 4 in that control circuit CC' additionally controls the force latch FL. The nonvolatile memory device 110 may be configured to back first data up in the force latch FL.

Figure 30:
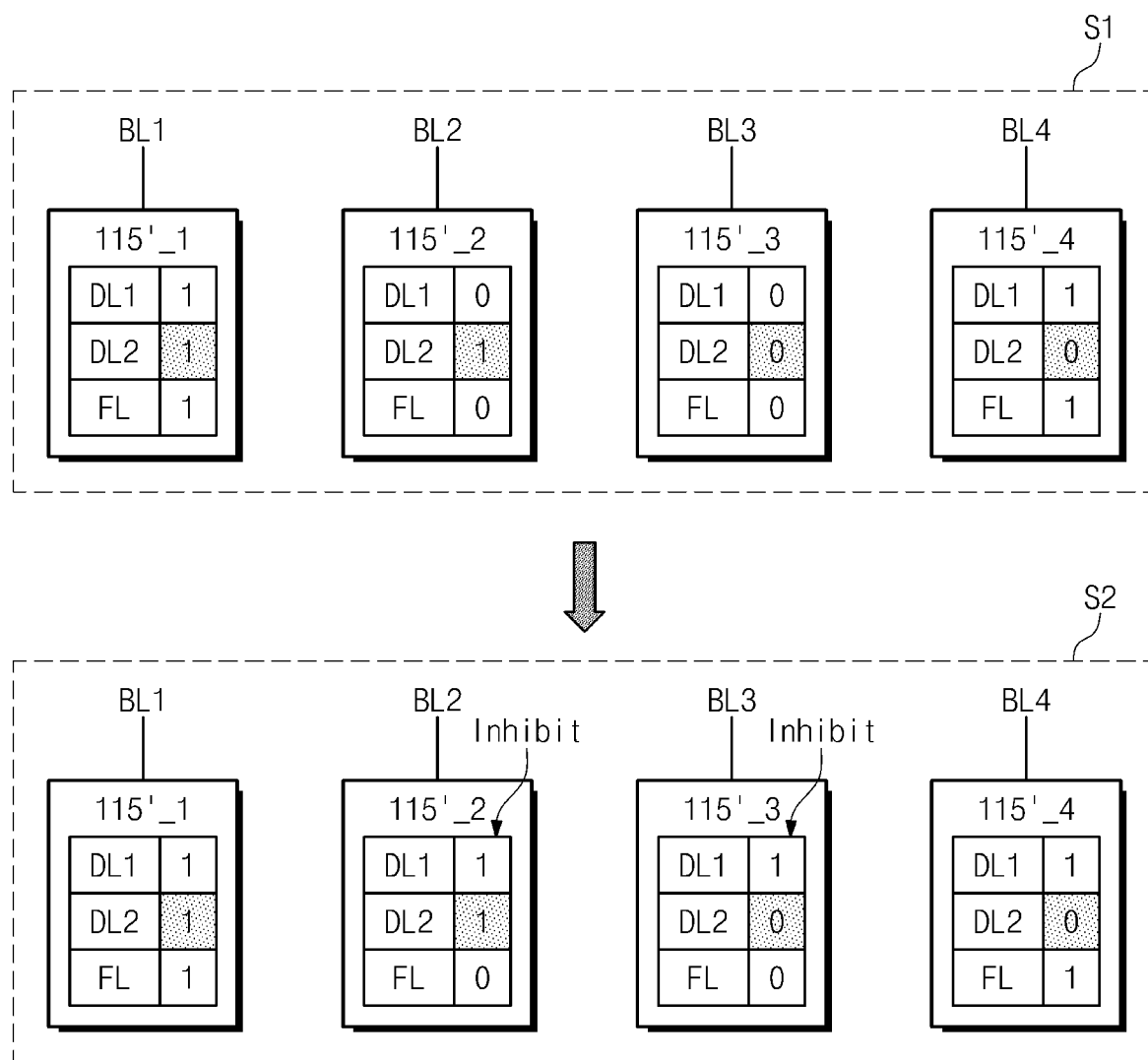
FIGS. 30 and 31 show examples in which data of a page buffer circuit is changed according to a program operation of FIG. 26.
Figure 31:
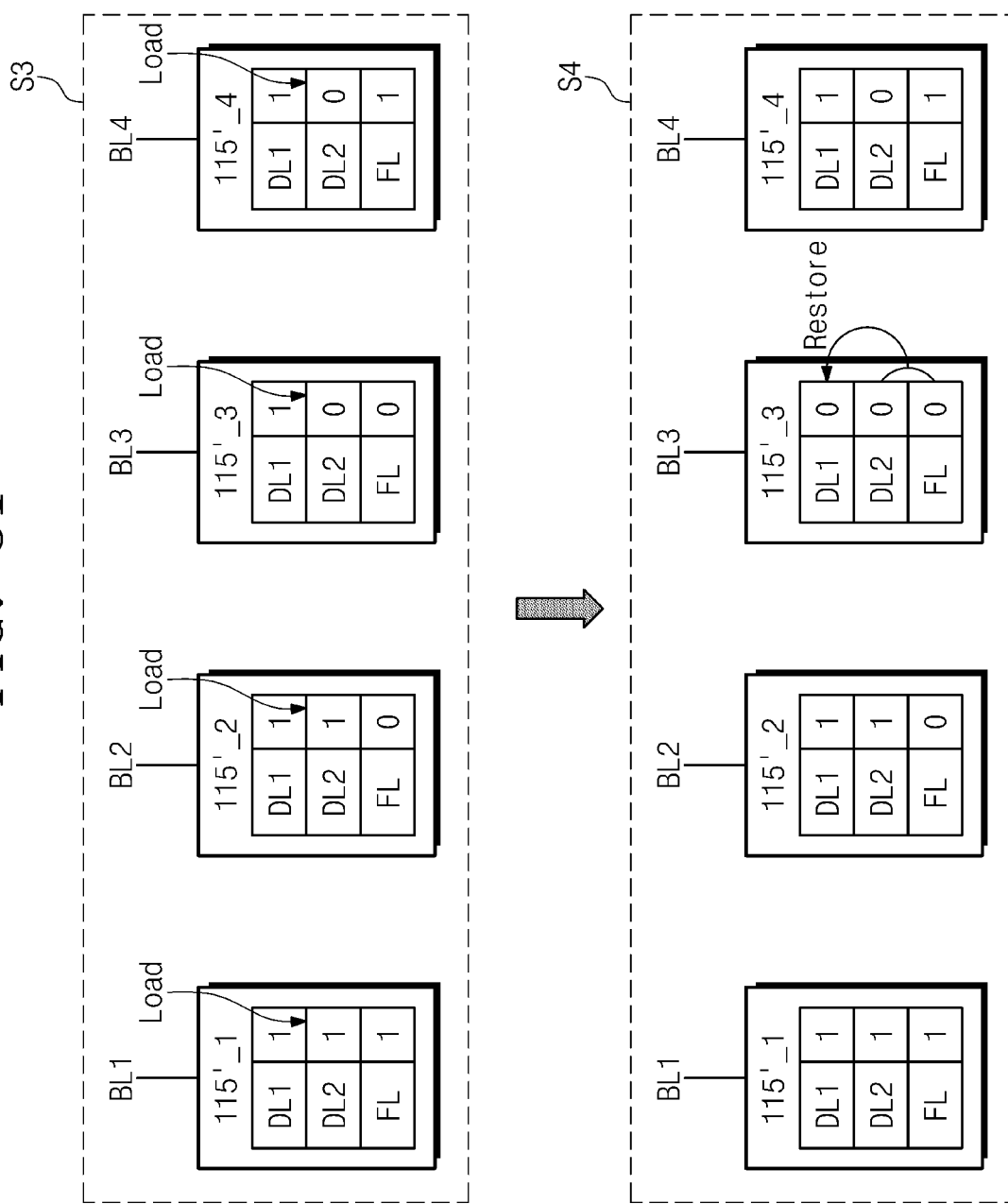

FIGS. 30 and 31 show examples in which data of a page buffer circuit 115' is changed according to a program operation of FIG. 26. In an embodiment, values of latches of circuits 115'_1 to 115'_4 corresponding to, respectively, first to fourth bit lines BL1 to BL4 are illustrated in FIGS. 30 and 31.

Referring to a first state S1 of FIG. 30, there may be assumed that "1" and "1" are respectively loaded on the first latch DL1 and the second latch DL2 associated with the first bit line BL1. There may be assumed that "0" and "1" are respectively loaded on the first latch DL1 and the second latch DL2 associated with the second bit line BL2. There may be assumed that "0" and "0" are respectively loaded on the first latch DL1 and the second latch DL2 associated with the third bit line BL3. There may be assumed that "1" and "0" are respectively loaded on the first latch DL1 and the second latch DL2 associated with the fourth bit line BL4.

A first state S1 may be a state in which only first data is loaded. For example, first data of "1001" may be loaded on the first data latches DL1 of the circuit 115'_1 to 115'_4. Second data may not be loaded on the second latches DL2 yet. Accordingly, bits of the second data latches DL2 are illustrated as being filled with dots and are illustrated for ease of reference.

The force latches FL of the circuits 115'_1 to 115'_4 may be configured to back the first data up. Accordingly, in the first state S1, bits of the force latches FL may be "1001" which is the same as that of the first data latches DL1.

In the first state S1, a program loop may be repeated based on bits of the first data latches DL1. As the program loop is repeated, threshold voltages of memory cells corresponding to, respectively, the first data latches DL1 each of which stores "0" may increase. For example, threshold voltages of memory cells corresponding to, respectively, the second and third bit lines BL2 and BL3 may increase. When threshold voltages of memory cells are higher than the first verification voltage VFY1, the memory cells may be program-inhibited. For example, a verification read result of a corresponding memory cell may be "1". The verification read result corresponding to "1" may be applied by a partial dump to the first data latch DL1. That is, in the second and third bit lines BL2 and BL3 corresponding to, respectively, memory cells to be programmed to the first and second program states P1 and P2, that is two or more program states, respectively, the verification read result according to the first verification voltage, that is one verification voltage, may be applied by the partial dump.

A second state S2 may illustrate an example in which verification read results corresponding to, respectively, the second and third bit lines are program-inhibited. For example, when threshold voltages of memory cells corresponding to, respectively, the second and third bit lines BL2 and BL3 are higher than the first verification voltage VFY1, a verification read result may indicate program inhibit. The verification read result may be applied by the partial dump to the first data latches DL1. In an embodiment, the first data latches DL1 associated with the second and third bit lines BL2 and BL3 may be updated with "1" indicating program inhibit.

Referring to a third state S3 of FIG. 31, second data may be loaded on the second data latches DL2. In the third state S3, dots of values of the second data latches DL2 are removed.

Afterwards, in a fourth state S4, data of the first data latches DL1 may be restored based on bits loaded on the second data latches DL2 and bits backed up in the force latches.

In an embodiment, in a program loop based on the first data, threshold voltages of memory cells corresponding to the first and second program states P1 and P2 may increase. Memory cells corresponding to the first and second program states P1 and P2 may be verified using the first verification voltage VFY1. That is, memory cells corresponding to the first and second program states P1 and P2 may be verified in a program loop based on the first data and may be program-inhibited. For example, a bit of the first data latch DL1 may be updated with "1".

When a bit of the first data latch DL1 of each of memory cells to be programmed to the second program state P2 is updated by the first verification voltage VFY1, memory cells to be programmed to the second program state P2 may not be normally programmed. For example, memory cells to be programmed to the second program state P2 may be program passed when they have a state in which they are programmed to the first program state P1.

According to embodiments of the disclosure, after bits are loaded on the second data latches DL2, bits of the first data latches DL1 may be restored or updated according to bits of the second data latches DL2 and bits of the force latches FL. For example, a bit of "1", a bit of "0", and a bit of "0" may be respectively stored in the first data latch DL1, the second data latch DL2, and the force latch FL which are associated with a memory cell, which is program-inhibited by the first verification voltage VFY1, from among memory cells to be programmed to the second program state P2. When a bit of "1", a bit of "0", and a bit of "0" are respectively stored in the first data latch DL1, the second data latch DL2, and the force latch FL, the page buffer circuit 115' may be configured to restore, update or invert a bit of the first data latch DL1 to "0", A bit of the first data latch DL1 associated with a memory cell, which is programmed based on the first data, is program-inhibited by a verification performed using the first verification voltage VFY1, and does not correspond to the first verification voltage VFY1, that is, a bit of the first data latch DL1 of the third bit line BL3 may be restored to an original bit or may be inverted. When a bit of the first data latch DL1 is inverted, in following program loops, a memory cell corresponding to the third bit line BL3 may be verified by the second verification voltage VFY2, not by the first verification voltage VFY1.

As described above, when a program loop is repeated based on the first data, threshold voltages of memory cells programmed with the first data may increase up to the first program state P1. When second data is loaded, data latches may be updated such that memory cells, which are program-inhibited at the first program state P1, from among memory cells to be programmed to a program state higher than the first program state P1 are further programmed. Furthermore, when the second data is loaded, memory cells, which are to be programmed to a program state, from among memory cells program-inhibited based on the first data may be set so as to be programmed. Accordingly, even though a program loop is repeated based on the first data, memory cells may be normally programmed to target states thereof when second data is loaded and a program loop is performed. Furthermore, since a time when the second data is loaded is shadowed by one or more program loops, operating speeds of the storage device 100 and the nonvolatile memory device 110 may be improved.

Figure 32:
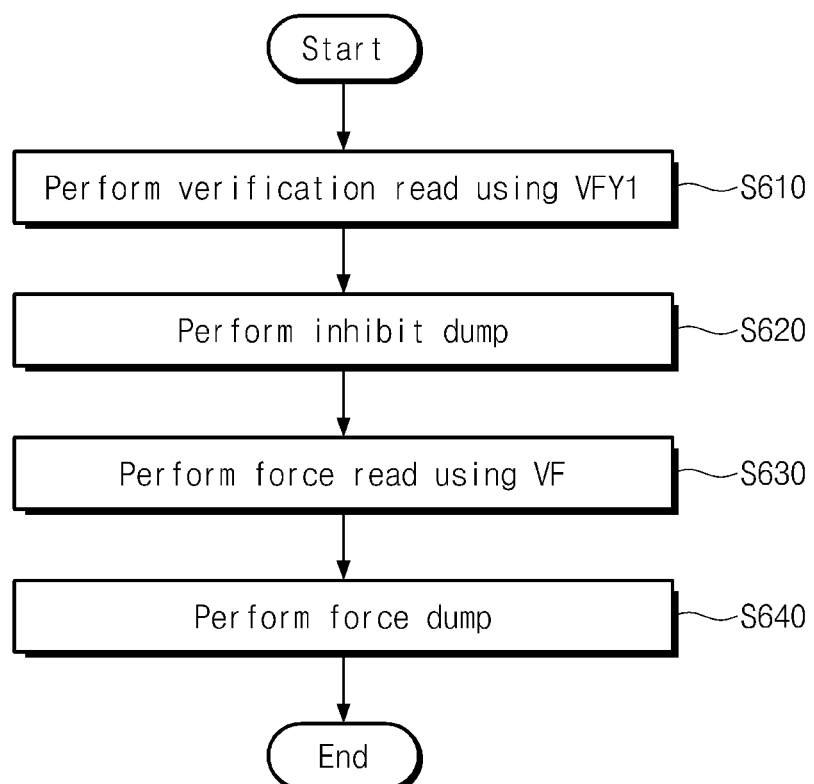
FIG. 32 shows an example in which a nonvolatile memory device stores information of first data in force latches through a read.

FIG. 32 shows an example in which a nonvolatile memory device stores information of first data in force latches FL through a read. In an embodiment, the nonvolatile memory device 110 may store information of first data in the force latches FL by performing an additional read (hereinafter referred to as "force read") during a verification read without backing the first data up in the force latches FL.

Referring to FIGS. 3, 26, 29, and 32, in step S610, the nonvolatile memory device 110 may perform a verification read using the first verification voltage VFY1. In step S620, the nonvolatile memory device 110 may apply a verification read result to the first data latches DL1 through an inhibit dump. In an embodiment, a program may be performed based on bits loaded on the first data latches DL1, and a selection dump may not be performed because bits are not loaded on the second data latches DL2.

In step S630, the nonvolatile memory device 110 may perform a force read using a force voltage VF. For example, the force voltage VF may be similar in level to the first verification voltage VFY1. For example, the force voltage VF may be lower in level than the first verification voltage VFY1.

In step S640, the nonvolatile memory device 110 may dump the force read result to the force latches FL through the force dump. The force read result dumped to the force latches FL may be used to restore bits of the first data latches DL1 as described with reference to FIGS. 30 and 31.

Figure 33:
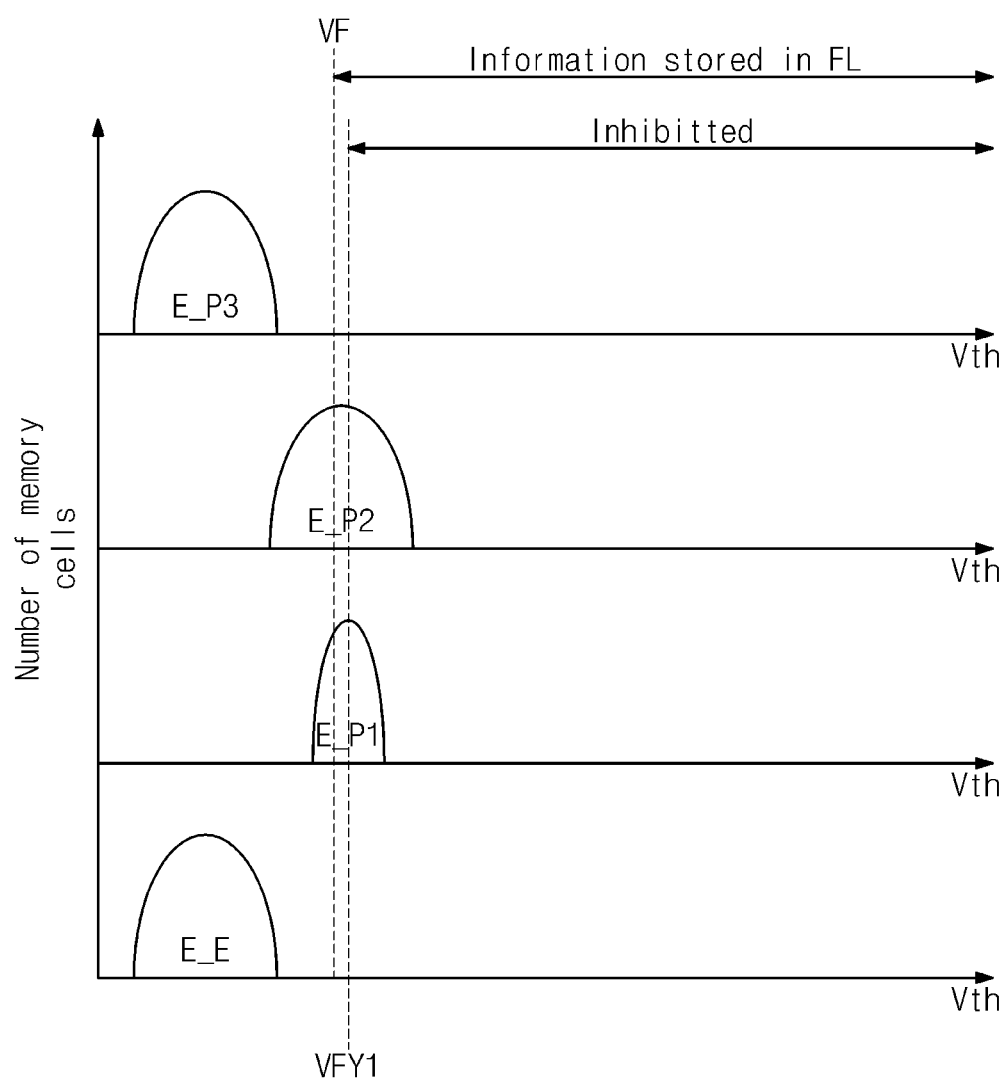

FIGS. 33 and 34 show an example in which bits of first data latches DL1 are restored using a force read result. In FIG. 33, the abscissa represents a threshold voltage, and the ordinate represents the number of memory cells.

Referring to FIGS. 3, 26, 29, and 32, a level of the force voltage VF may be lower than that of the first verification voltage VFY1. When a program loop is performed based on first data, threshold voltages of memory cells corresponding to, respectively, the first data latches DL1 each of which stores "0" may increase. Referring to FIG. 12, threshold voltages of memory cells E_P1 and E_P2 to be programmed to the first and second program states P1 and P2 may increase.

Bits of the first data latches DL1 corresponding to, respectively, memory cells, of which the threshold voltages are lower than the force voltage VF, from among the memory cells E_P1 and E_P2 to be programmed to the first and second program states P1 and P2 may be maintained with "0", and "0" may be dumped to force latches FL, respectively.

Bits of the first data latches DL1 corresponding to, respectively, memory cells, of which the threshold voltages are higher than the force voltage VF and lower than the first verification voltage VFY1, from among the memory cells E_P1 and E_P2 to be programmed to the first and second program states P1 and P2 may be maintained with "0", and "1" may be dumped to force latches FL, respectively.

Bits of the first data latches DL1 corresponding to, respectively, memory cells, of which the threshold voltages are higher than the first verification voltage VFY1, from among the memory cells E_P1 and E_P2 to be programmed to the first and second program states P1 and P2 may be updated with "1", and "1" may be dumped to force latches FL, respectively.

That is, information dumped to the force latches FL may include information of memory cells program-inhibited by the first verification voltage VFY1. When bits of the first data latches DL1 of memory cells, which correspond to, respectively, force latches FL in which bits of "1" are respectively stored and which correspond to, respectively, the second data latches DL2 on which "0" are respectively loaded, are updated with or restored to "0", that the memory cells E_P2 to be programmed to the second program state P2 are program-inhibited by the first verification voltage VFY1 may be restored. Furthermore, when bits of the first data latches DL1 of memory cells, which correspond to, respectively, force latches FL in which bits of "1" are respectively stored and correspond to, respectively, the second data latches DL2 on which "1" are respectively loaded, are maintained, a program inhibit of memory cells, which are to be program-inhibited by the first verification voltage VFY1, from among the memory cells E_P1 to be programmed to the first program state P1 may be maintained. Accordingly, even though a program loop is repeated based on the first data, a program operation of memory cells may be normally performed.

Figure 35:
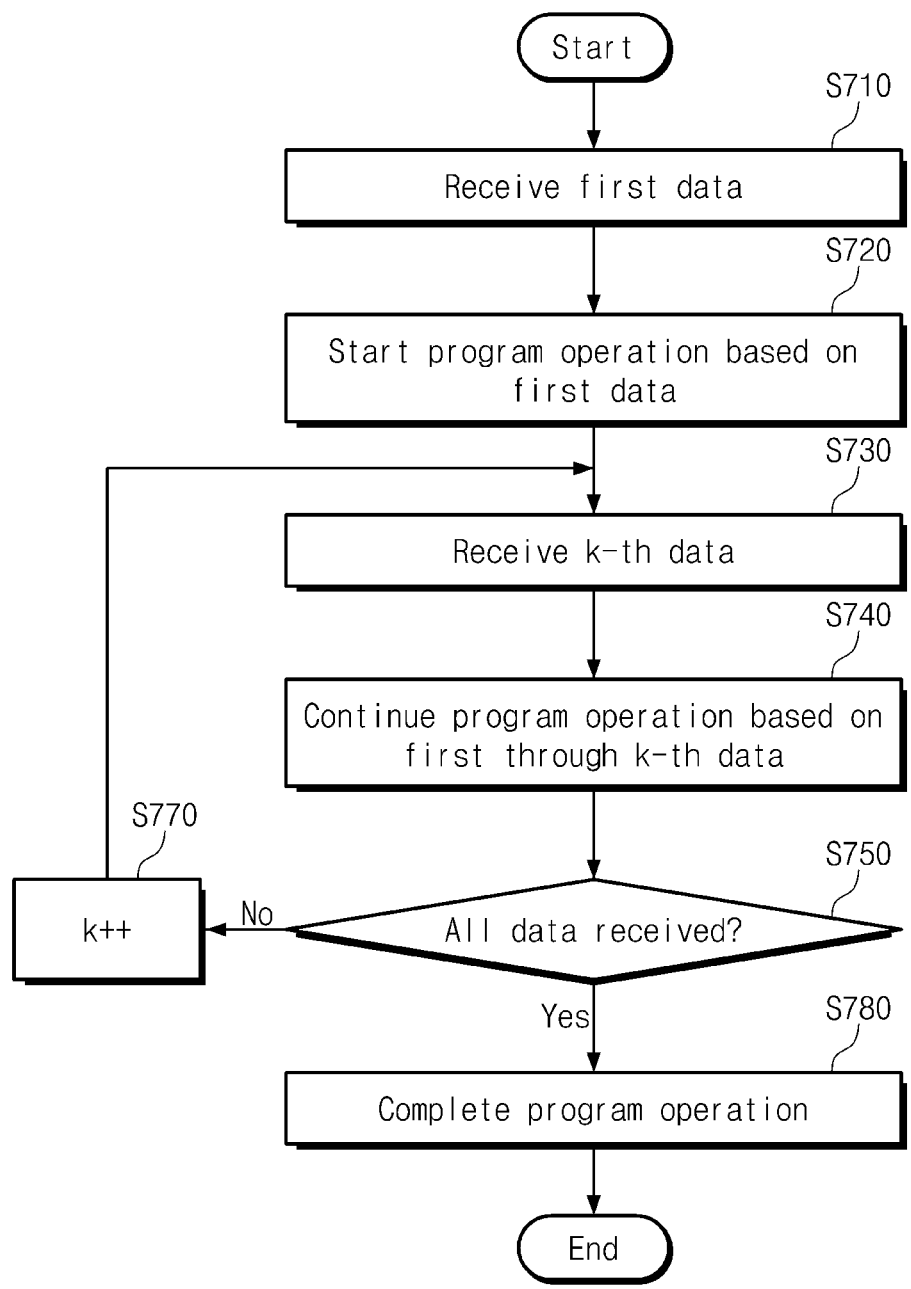
FIG. 35 is a flowchart illustrating another application of an operating method of a nonvolatile memory device according to an embodiment of the disclosure.

FIG. 35 is a flowchart illustrating another application of an operating method of a nonvolatile memory device according to an embodiment of the disclosure. In an embodiment, an example in which a program operation of FIG. 26 is applied to a nonvolatile memory device in which three or more bits are programmed at each memory cell is illustrated in FIG. 35, Referring to FIGS. 1, 3, 7, and 35, in step S710, the nonvolatile memory device 110 may receive first data from the controller 120. For example, data of a page may be loaded on the page buffer circuit 115 through the data input/output circuit 117. First data may have a determination point DP1 between the erase state E and the lowest program state P1.

In step S720, the nonvolatile memory device 110 may initiate a program operation based on the first data. For example, the nonvolatile memory device 110 may repeat a program loop based on the first data, until next data is received.

In step S730, k-th data (k being a positive integer of 2 or more) may be received, and the received data may be loaded on the page buffer circuit 115. In step S740, the nonvolatile memory device 110 may continue to perform the program operation based on the first to k-th data. For example, the nonvolatile memory device 110 may repeat the program loop based on the first to k-th data.

When all data is received, in step S750, the nonvolatile memory device 110 may repeat the program loop based on the received data and may complete the program operation in step S780. If all data is not received, in steps S770 and S730, the nonvolatile memory device 110 may receive next data and may continue to perform the program operation.

As described above, when the first data is received, the nonvolatile memory device 110 may initiate the program operation. When additional data is received, the nonvolatile memory device 110 may restore a part of the first data associated with program-inhibited memory cells and may continue to perform the program operation. Accordingly, a time when data is loaded on the nonvolatile memory device 110 may be shadowed by the program operation, thereby improving operating speeds of the nonvolatile memory device 110 and the storage device 100.

Figure 36:
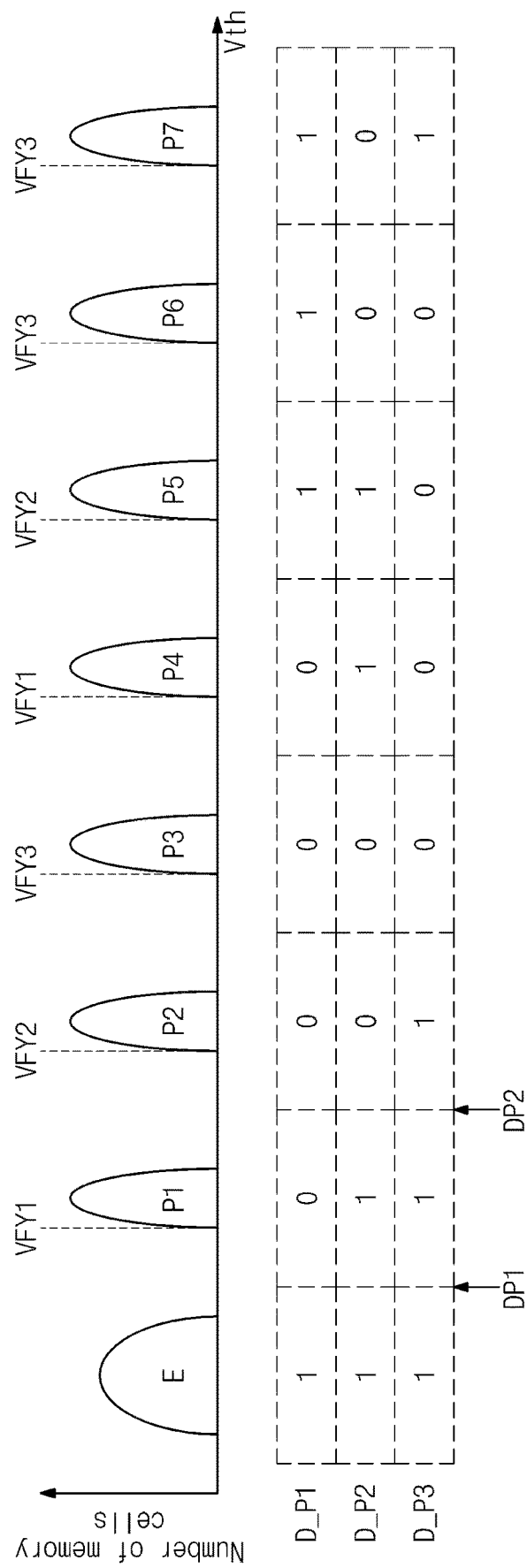
FIG. 36 shows an example in which bits are assigned to an erase state and first to seventh program states when three bits are programmed at each memory cell.

FIG. 36 shows an example in which bits are assigned to an erase state and first to seventh program states P1 to P7 when three bits are programmed at each memory cell. In FIG. 36, the abscissa represents a threshold voltage, and the ordinate represents the number of memory cells.

Referring to FIGS. 3 and 36, the first data D_P1 which is firstly loaded on the page buffer circuit 115 may have a determination point DP1 between the erase state and the first program state P1 as the lowest program state. Accordingly, the first data D_P1 may provide a function to control a program of memory cells by the first verification voltage VFY1, for example, a verification and a program inhibit.

The second data D_P2 which is secondly loaded on the page buffer circuit 115 may have a second determination point DP2 between the first program state P1 and the second program state P2. Accordingly, the second data D_P2 may support a selection dump between memory cells, which are to be verified by the first verification voltage VFY1 and to be program-inhibited, and memory cells, which are to be programmed higher in level than the first verification voltage VFY1, from among the result of performing a verification read using the first verification voltage VFY1. Furthermore, the second data D_P2 may provide a function to control a program of memory cells by the second verification voltage VFY2, for example, a verification and a program inhibit.

As described above, k-th data (k being a positive integer of 2 or more) loaded on the page buffer circuit 115 may be set to have a determination point between a (k−1)-th program state and a k-th program state. Accordingly, as described with reference to FIGS. 12 to 14, a program voltage may increase as a program loop is repeated, and thus operating speeds of the nonvolatile memory device 110 and the storage device 110 may be improved.

In an embodiment, in the first to third data D_P1 to D_P3, "111" may be assigned to the erase state E. In the first to third data D_P1 to D_P3, "011" may be assigned to the first program state P1. In the first to third data D_P1 to D_P3, "001" may be assigned to the second program state P2. In the first to third data D_P1 to D_P3, "000" may be assigned to the third program state P3. In the first to third data D_P1 to D_P3, "010" may be assigned to the fourth program state P4. In the first to third data D_P1 to D_P3, "110" may be assigned to the fifth program state P5. In the first to third data D_P1 to D_P3, "100" may be assigned to the sixth program state P6. In the first to third data D_P1 to D_P3, "101" may be assigned to the seventh program state P7.

Figure 37:
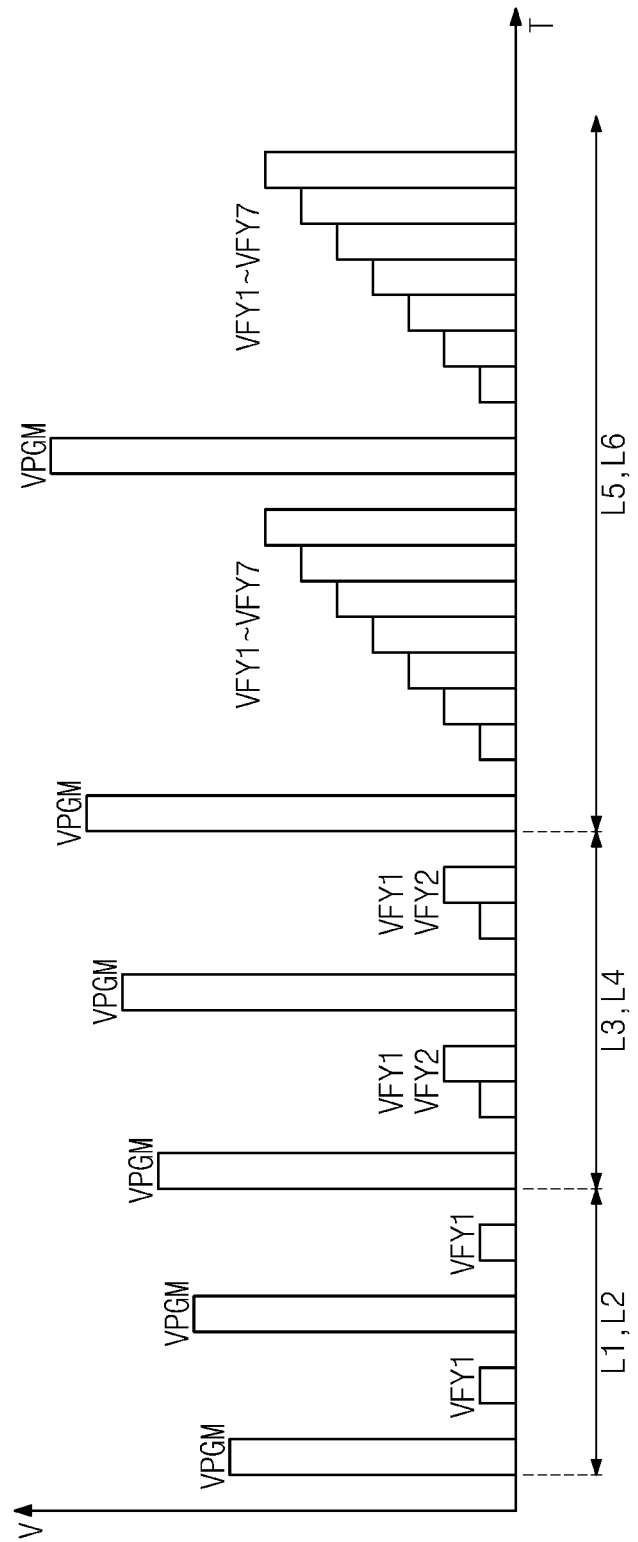
FIG. 37 is a diagram illustrating an example in which data is loaded and program loops are performed.

FIG. 37 is a diagram illustrating an example in which data is loaded and program loops are performed. In FIG. 37, the abscissa represents time T, and the ordinate represents a voltage V applied to a word line connected to selected memory cells.

Referring to FIGS. 3, 36, and 37, a program operation may start after the first data D_P1 is loaded. A first program loop L1 and a second program loop L2 may be performed based on the first data D_P1. A verification read may be performed using the first verification voltage VFY1 during verifications of the first and second program loops L1 and L2. While the first and second program loops L1 and L2 are performed, the second data D_P2 may be loaded on the page buffer circuit 115.

A third program loop L3 and a fourth program loop L4 may be performed based on the first data D_P1 and the second data D_P2. A verification read may be performed using the first verification voltage VFY1 and the second verification voltage VFY2 during verifications of the third and fourth program loops L3 and L4. While the third and fourth program loops L3 and L4 are performed, the third data D_P3 may be loaded on the page buffer circuit 115.

A fifth program loop L5 and a sixth program loop L6 may be performed based on the first data D_P1, the second data D_P2, and third data D_P3. Since all the first to third data D_P1 to D_P3 are loaded, a verification read may be performed using the first to seventh verification voltages VFY1 to VFY7 during verifications of the fifth and sixth program loops L5 and L6.

Figure 38:
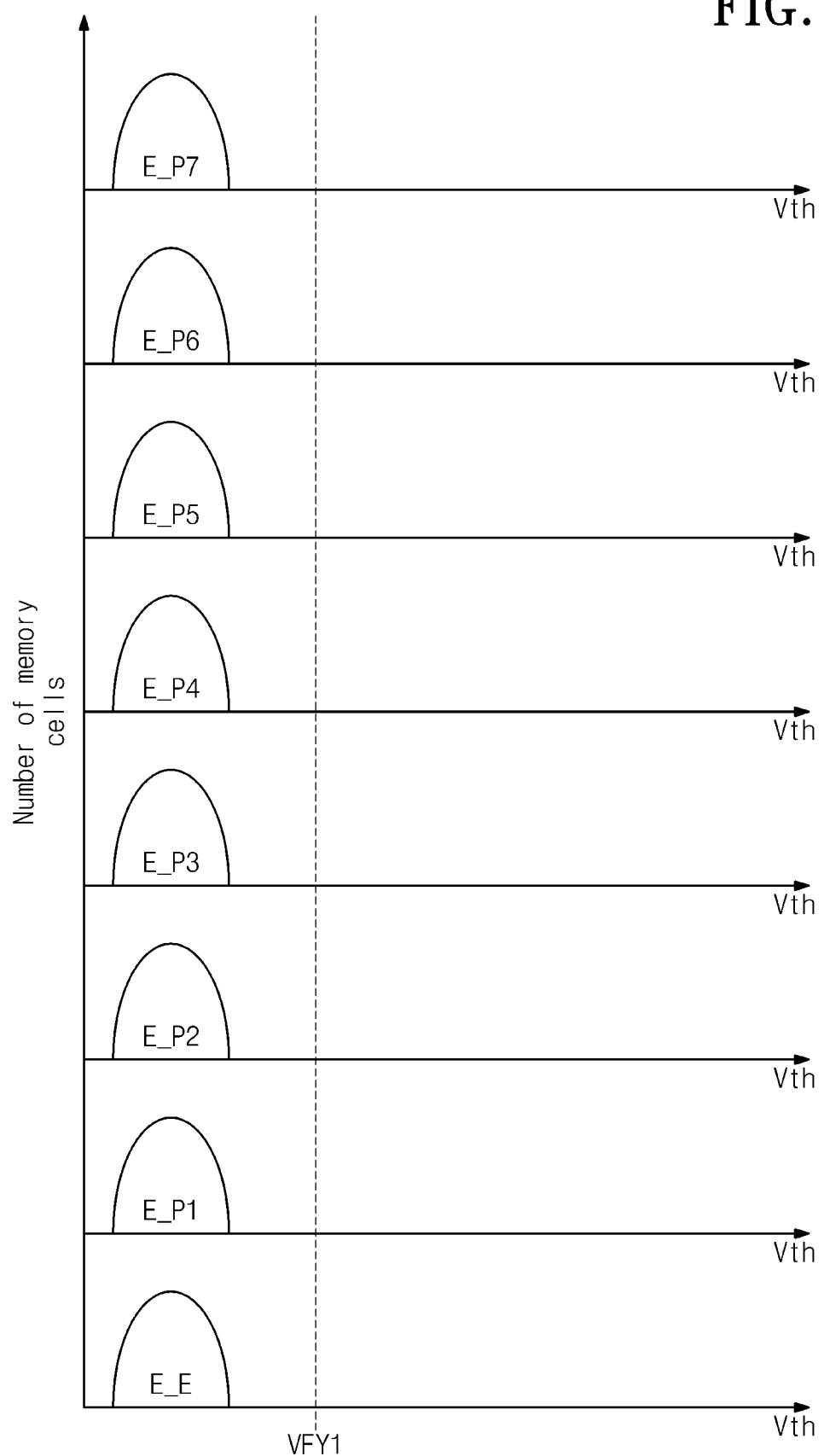
Figure 40:
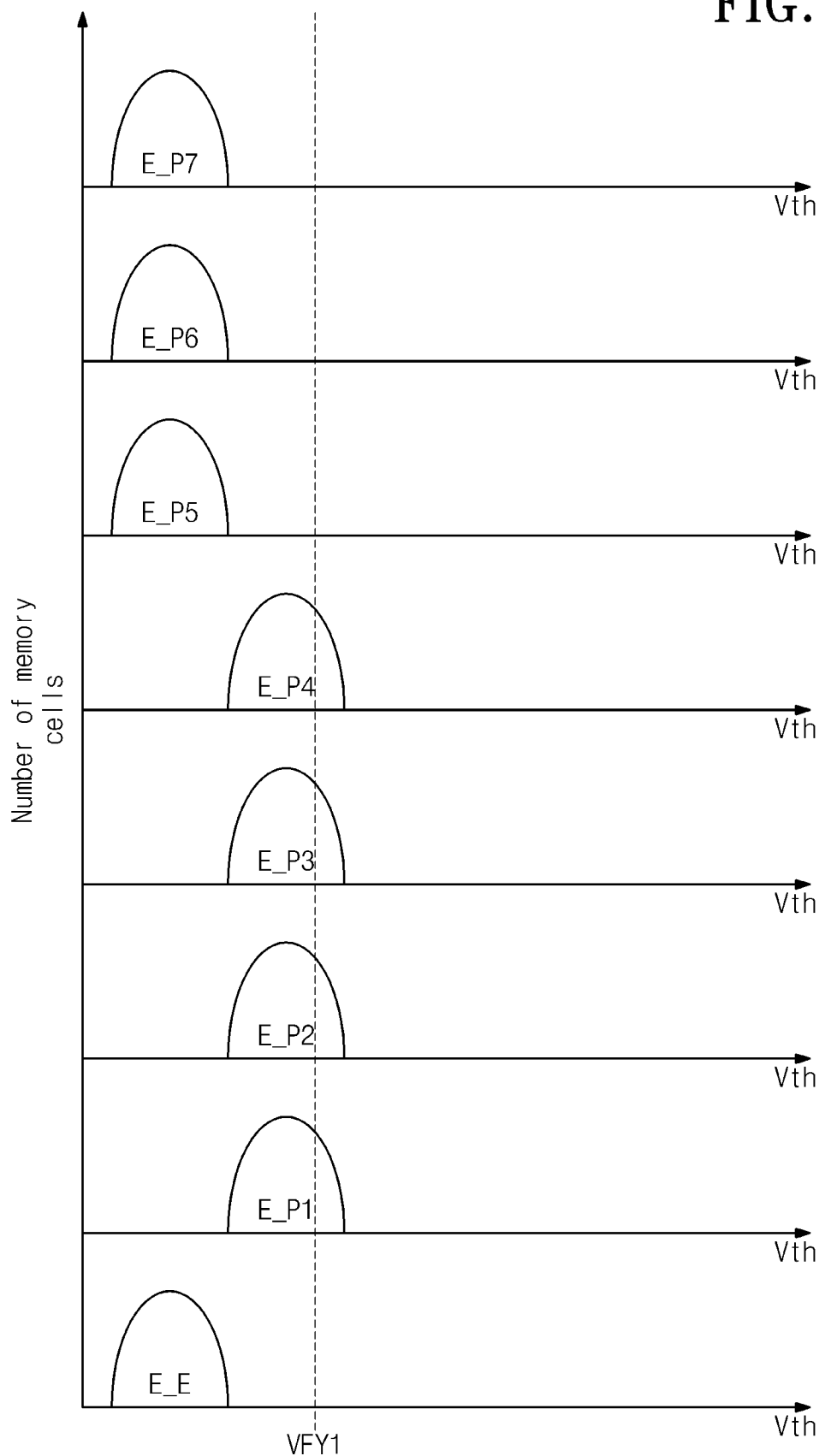
Figure 43:
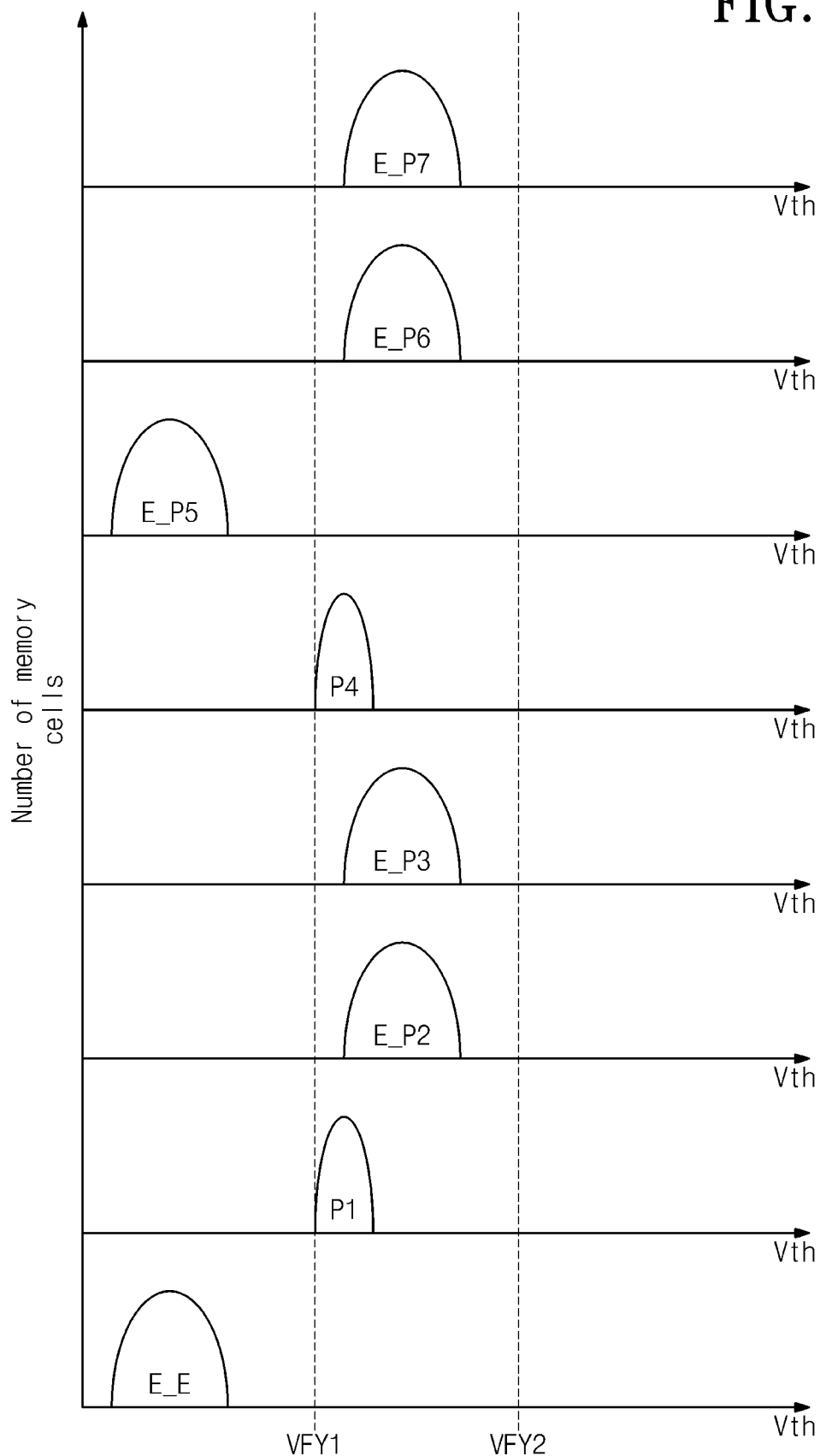

FIGS. 38 to 44 show an example in which threshold voltages of memory cells and bits stored in latches are changed while a program loop is repeated. In FIGS. 38, 41, and 43, the abscissa represents a threshold voltage, and the ordinate represents the number of memory cells.

Referring to FIGS. 3, 36, and 38, before a program operation is performed, memory cells E_E, which will maintain the erase state, and memory cells E_P1 to E_P7, which will be programmed to the first to seventh program states P1 to P7, may have an erase state.

Referring to FIGS. 3, 36, 39, and 40, first data D_P1 may be loaded on the page buffer circuit 115. For example, "10000111" corresponding to, respectively, eight states, that is, the erase state E and the first to seventh program states P1 to P7 may be loaded on the first data latches DL1 of the page buffer circuit 115.

Memory cells corresponding to, respectively, the first data latches DL1 in each of which "0" is stored may be programmed, and memory cells corresponding to, respectively, the first data latches DL1 in each of which "1" is stored may be program-inhibited. Accordingly, memory cells E_E and E_P5 to E_P7 corresponding to the erase state E and the fifth to seventh program states P5 to P7 may be program-inhibited from the beginning. Memory cells E_P1 and E_P4 corresponding to the first to fourth program states P1 and P4 may be programmed. Memory cells programmed may be verified by the first verification voltage VFY1 and may be program-inhibited. When threshold voltages to be programmed to the first to fourth program states P1 to P4 are verified as being higher than the first verification voltage VFY1, a bit of a data latch corresponding to each of the verified memory cell may be updated from "0" to "1".

Referring to FIGS. 3, 36, and 41, second data D_P2 may be loaded on the page buffer circuit 115. For example, "11001100" corresponding to, respectively, eight states, that is, the erase state E and the first to seventh program states P1 to P7 may be loaded on the second data latches DL2 of the page buffer circuit 115. Restoration may be performed as the second data D_P2 is loaded on the second data latches DL2. For example, memory cells program-inhibited by a verification performed using the first verification voltage VFY1 may be detected using force latches FL (refer to FIG. 29). In FIG. 41, boxes filled with dots indicate detected memory cells.

There may be determined memory cells which are to be programmed to states including the second program state P2 and program states higher than the second program state P2. In an embodiment, memory cells corresponding to, respectively, the second data latches DL2 in each of which "0" is stored may be determined. The first data latches DL1 of the determined memory cells may be updated or restored with or to "0.

In an embodiment, when the first data D_P1 and the second data D_P2 are loaded on the page buffer circuit 115, bits of the first and second data latches DL1 and DL2 corresponding to the first program state P1 and bits of the first and second data latches DL1 and DL2 corresponding to the fourth program state P4 may be set with the same value, for example, "01". Accordingly, the first data latches DL1 of memory cells to be programmed to the fourth program state P4 as well as the first program state P1 may not be restored.

Referring to FIGS. 3, 36, 42, and 43, a program loop may continue after the first data latches DL1 are restored. Memory cells E_E and E_P5 which correspond to the first and second data latches DL1 and DL2 in which "11" is stored and which are to be programmed to the fifth program state P5 and to be maintained at the erase state E may be program-inhibited from the beginning Memory cells E_P1 and E_P4 which correspond to the first and second data latches DL1 and DL2 in which "01" is stored and are to be programmed to the first and fourth program states P1 and P4 may be program-inhibited at the first program state P1. Memory cells E_P2 and E_P3 which correspond to the first and second data latches DL1 and D12 in which "00" is stored and are to be programmed to the second and third program states P2 and P3 may be program-inhibited at the second program state P2. Memory cells E_P6 and E_P7 which correspond to the first and second data latches DL1 and DL2 in which "10" is stored and are to be programmed to the sixth and seventh program states P6 and P7 may not be verified when the second data D_P2 is loaded and may not be program-inhibited. Corresponding memory cells may be programmed to have threshold voltages higher in level than the second verification voltage VFY2.

Referring to FIGS. 3, 36, and 44, third data D_P3 may be loaded on the page buffer circuit 115. For example, "11100001" corresponding to, respectively, eight states, that is, the erase state E and the first to seventh program states P1 to P7 may be loaded on the third data latches DL3 of the page buffer circuit 115. Restoration may be performed as the third data D_P3 is loaded on the second data latches DL3. For example, memory cells program-inhibited by a verification performed using the first verification voltage VFY1 and the second verification voltage VFY2 may be detected using force latches FL (refer to FIG. 29). In FIG. 41, boxes filled with dots indicate detected memory cells.

There may be determined memory cells which are to be programmed to states including the second program state P2 and program states higher than the second program state P2. In an embodiment, memory cells corresponding to, respectively, the third data latches DL3 in each of which "0" is stored may be determined. The first and second data latches DL1 and DL2 of memory cells, which are to be programmed to the third program state P3, from among the determined memory cells may be updated or restored with or to "00.

Furthermore, values of the first and second data latches DL1 and DL2 of memory cells, which are to be programmed to the fourth program state P4, from among the determined memory cells may be restored to "01". In an embodiment, memory cells to be programmed to the third and fourth program states P3 and P4 may be determined by backing bits of the second data latches DL2 up in the force latches FL or by performing a force read using a force voltage of which the level is lower than that of the second verification voltage VFY2.

Referring to FIGS. 43 and 44, until the third data D_P3 is loaded and restoration is made, memory cells E_P1 to be programmed to the first program state P1 may be verified using the first verification voltage VFY1 and, afterwards, may be also verified using the first verification voltage VFY1. Accordingly, the memory cells E_P1 to be programmed to the first program state P1 may be normally programmed.

Until the second data D_P2 is loaded and restoration is made, memory cells E_P2 to be programmed to the second program state P2 may be verified using the first verification voltage VFY1. Until the third data D_P3 is loaded and restoration is made, the memory cells E_P2 to be programmed to the second program state P2 may be verified using the second verification voltage VFY2 and, afterwards, may be also verified using the second verification voltage VFY2. Accordingly, the memory cells E_P2 to be programmed to the second program state P2 may be normally programmed.

Until the second data D_P2 is loaded and restoration is made, memory cells E_P3 to be programmed to the third program state P3 may be verified using the first verification voltage VFY1. Until the third data D_P3 is loaded and restoration is made, the memory cells E_P3 to be programmed to the third program state P3 may be verified using the second verification voltage VFY2 and, afterwards, may be verified using the third verification voltage VFY3. Accordingly, the memory cells E_P3 to be programmed to the third program state P3 may be normally programmed.

Until the third data D_P3 is loaded and restoration is made, the memory cells E_P4 to be programmed to the fourth program state P4 may be verified using the first verification voltage VFY1 and, afterwards, may be verified using the fourth verification voltage VFY4. Accordingly, the memory cells E_P4 to be programmed to the fourth program state P4 may be normally programmed.

Until the third data D_P3 is loaded and restoration is made, memory cells E_P5 to be programmed to the fifth program state P5 may be maintained at the erase state E and, afterwards, may be verified using the fifth verification voltage VFY5. Accordingly, the memory cells E_P5 to be programmed to the fifth program state P5 may be normally programmed.

Until the second data D_P2 is loaded and restoration is made, memory cells E_P6 to be programmed to the sixth program state P6 may be maintained at the erase state E. Until the third data D_P3 is loaded and restoration is made, memory cells E_P6 to be programmed to the sixth program state P6 may not be verified and, afterwards, may be verified using the sixth verification voltage VFY6. A time taken to load the third data D_P3 may be shorter than a time taken for threshold voltages of the memory cells E_P6 to reach the sixth verification voltage VFY6. Accordingly, the memory cells E_P3 to be programmed to the sixth program state P6 may be normally programmed.

Until the second data D_P2 is loaded and restoration is made, memory cells E_P7 to be programmed to the seventh program state P7 may be maintained at the erase state E. Until the third data D_P3 is loaded and restoration is made, memory cells E_P7 to be programmed to the sixth program state P7 may not be verified and, afterwards, may be verified using the seventh verification voltage VFY7. A time taken to load the third data D_P3 may be shorter than a time taken for threshold voltages of the memory cells E_P7 to reach the seventh verification voltage VFY7. Accordingly, the memory cells E_P7 to be programmed to the seventh program state P7 may be normally programmed.

Figure 45:
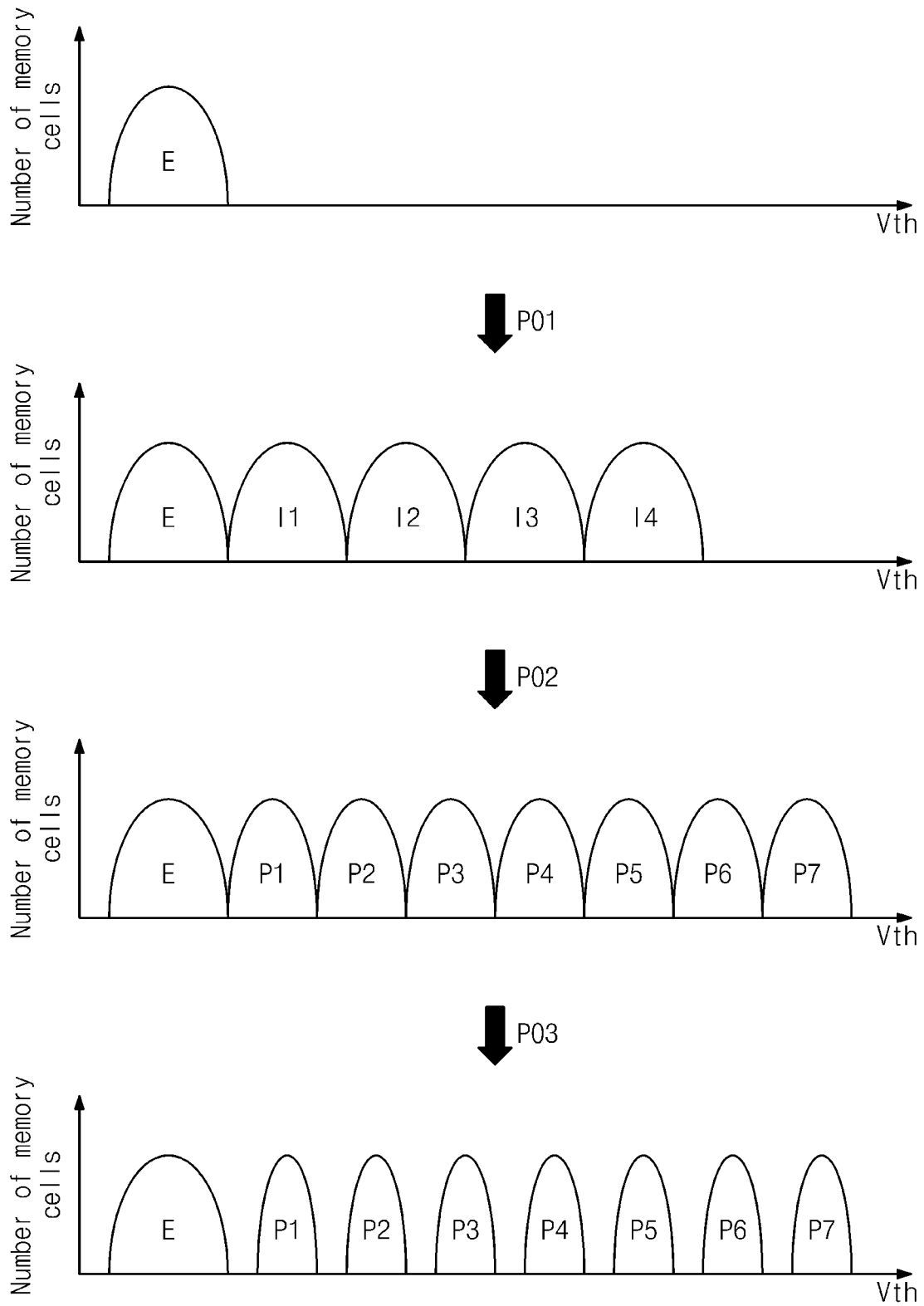
FIG. 45 shows an example in which memory cells are programmed through two or more program operations.

FIG. 45 shows an example in which memory cells are programmed through two or more program operations. In FIG. 45, the abscissa represents a threshold voltage, and the ordinate represents the number of memory cells.

Referring to FIGS. 3 and 45, memory cells may be completely programmed through three program operations P01 to P03. In FIG. 45, it may be assumed that three bits are programmed at each memory cell.

During the first program operation P01, memory cells may be programmed from the erase state E to the erase state E and the first to fourth intermediate program states I1 to I4. Data of at least two pages may be required to perform the first program operation P01. As described with reference to FIGS. 1 to 19, a program operation may start after data of one page of the at least two pages is loaded on the page buffer circuit 115. Data of the remaining page may be loaded on the page buffer circuit 115 while a program of a first program loop of the program operation is performed.

In an embodiment, after the program operation starts, data of a second page may be loaded on the page buffer circuit 115. Afterwards, a verification of the first program loop may be performed. In an embodiment, data of a third page may be loaded on the page buffer circuit 115 while the program operation continues after the verification of the first program loop. Since not used for the first program operation P01, the data of the third page may be loaded on the page buffer circuit 115 in parallel with the program operation.

The first program operation P01 may be coarsely performed. For example, since memory cells where the first program operation P01 is performed are not memory cells to be read, the first program operation P01 may be coarsely performed without considering a read error.

Data of at least two pages loaded on the page buffer circuit 115 may be programmed separately at a backup area. For example, a bit may be programmed at each of memory cells of the backup area.

During the second program operation P02, memory cells may be programmed to the erase state E and the first to seventh program states P1 to P7. In an embodiment, when data of a third page is not loaded during the first program operation P01, data of the third page may be loaded when the second program operation P02 starts. The second program operation P02 may be performed based on data programmed at the backup area or both data programmed at the backup area and data of the third page loaded on the page buffer circuit 115 from the controller 120 (refer to FIG. 1).

The second program operation P02 may be coarsely performed. For example, since memory cells where the second program operation P02 is performed are not memory cells to be read, the second program operation P02 may be coarsely performed without considering a read error.

During the third program operation P03, a threshold voltage distribution of memory cells may be finely programmed. The third program operation P03 may be performed based on data programmed at the backup area. Memory cells may be completely programmed as the third program operation P03 is performed.

Figure 46:
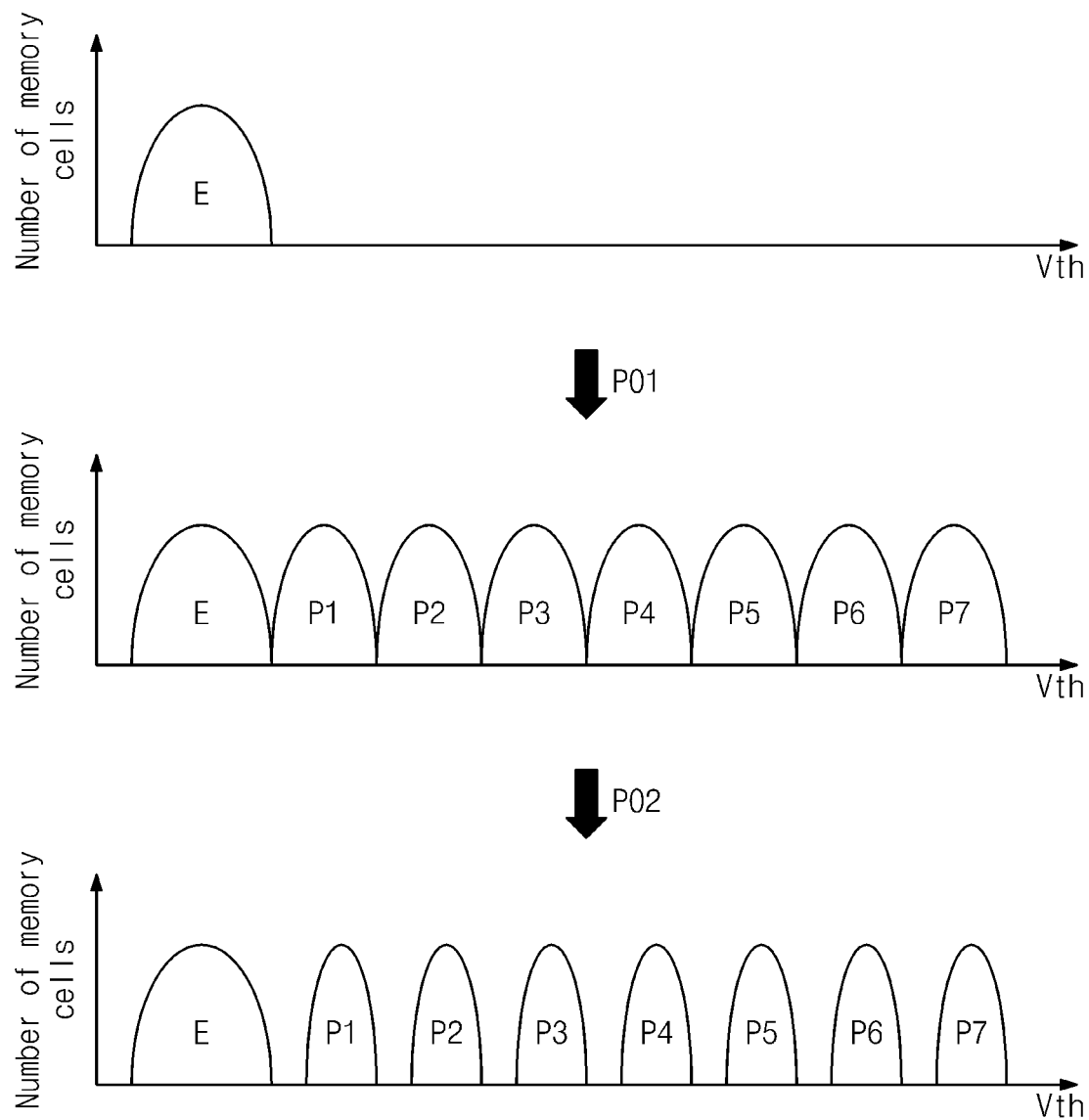
FIG. 46 shows another example in which memory cells are programmed through two or more program operations.

FIG. 46 shows another example in which memory cells are programmed through two or more program operations. In FIG. 46, the abscissa represents a threshold voltage, and the ordinate represents the number of memory cells.

Referring to FIGS. 3 and 46, memory cells may be completely programmed by performing two program operations P01 and P02. In FIG. 46, it may be assumed that three bits are programmed at each memory cell.

During the first program operation P01, memory cells may be programmed from the erase state E to the erase state E and the first to seventh program states P1 to P7. In an embodiment, the first program operation P01 may correspond to the second program operation P02 of FIG. 45.

A program operation may start after data of a first page is loaded on the page buffer circuit 115. Data of the remaining pages may be loaded on the page buffer circuit 115 while a program of a first program loop is performed.

The second program operation P02 may be performed after the first program operation P01 is performed. The second program operation P02 may correspond to the third program operation P03 of FIG. 45. Memory cells may be completely programmed as the second program operation P02 is performed.

Figure 47:
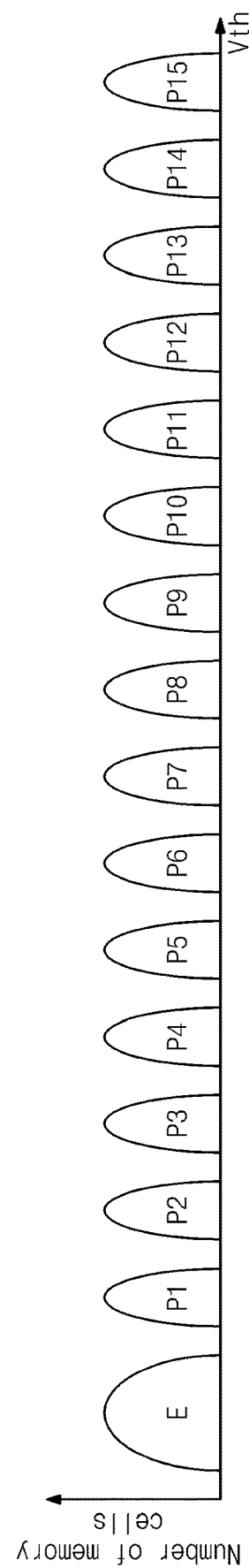
FIG. 47 is a diagram illustrating threshold voltages of memory cells when four bits are programmed at each memory cell.

FIG. 47 is a diagram illustrating threshold voltages of memory cells when four bits are programmed at each memory cell. In FIG. 47, the abscissa represents a threshold voltage, and the ordinate represents the number of memory cells.

Referring to FIGS. 3 and 47, each memory cell may have one of an erase state E and 1st to 15th program states P1 to P15. To program memory cells, data corresponding to four pages may be loaded on the page buffer circuit 115. Four data latches DL (refer to FIG. 4) may be connected to one bit line BL. Four bits corresponding to, respectively, four pages may be loaded on four data latches DL, respectively.

A program operation may be performed after data of a first page is loaded on the page buffer circuit 115. Data of the remaining pages or data of a part of the remaining pages may be loaded on the page buffer circuit 115 while a program of a first program loop is performed.

FIG. 48 is a circuit diagram illustrating a memory block BLKa according to an embodiment of the disclosure. Referring to FIG. 58, a memory block BLKa may include a plurality of cell strings CS11 to CS21 and CS12 to CS22. The plurality of cell strings CS11 to CS21 and CS12 to CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may contain a plurality of cell transistors. The cell transistors may include ground selection transistors GST, memory cells MC1 to MC6, and string selection transistors SSTa and SSTb. The ground selection transistor GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

A plurality of cell transistors may be charge trap type cell transistors of which the threshold voltage changes according to the amount of charges trapped in an insulating layer thereof.

Sources of the lowermost ground selection transistors GST may be connected in common to a common source line CSL.

Control gates of ground selection transistors GST of the cell strings CS11 and CS12 in a first row may be connected in common to a ground selection line GSL1, and control gates of ground selection transistors GST of the cell strings CS21 and CS22 in a second row may be connected in common to a ground selection line GSL2. That is, cell strings in different rows may be connected to different ground selection lines.

Connected in common to a word line are control gates of memory cells that are placed at the same height (or order) from the substrate (or the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

Cell strings in different rows may be connected to different string selection lines SSL1a and SSL2a or SSL1b and SSL2b. String selection transistors SSTa or SSTb, having the same height (or, order), of cell strings in the same row may be connected to the same string selection line. String selection transistors SSTa and SSTb, having different heights (or, orders), of cell strings in the same row may be connected to different string selection lines.

Columns of the cell strings CS11 to CS21 and CS12 to CS22 may be connected to different bit lines BL1 and BL2. For example, string selection transistors SSTb of the cell strings CS11 to CS21 in the first column may be connected in common to a bit line BL1. The string selection transistors SSTb of the cell strings CS12 and CS22 may be connected in common to the bit line BL2.

In an embodiment, memory cells MC in a physical page may correspond to at least three logical pages. For example, k bits (k being an integer of 2 or more) may be programmed in a memory cell MC. Memory cells MC of a physical page may store k logical pages each of which is composed of n-th bits programmed at memory cells MC respectively.

As described above, the memory block BLKa may be provided at a three-dimensional memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the disclosure, the 3D memory array includes vertical NAND strings (or cell strings) that are vertically oriented such that at least one memory cell is located over another memory cell. The at least one memory cell MC may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 49:
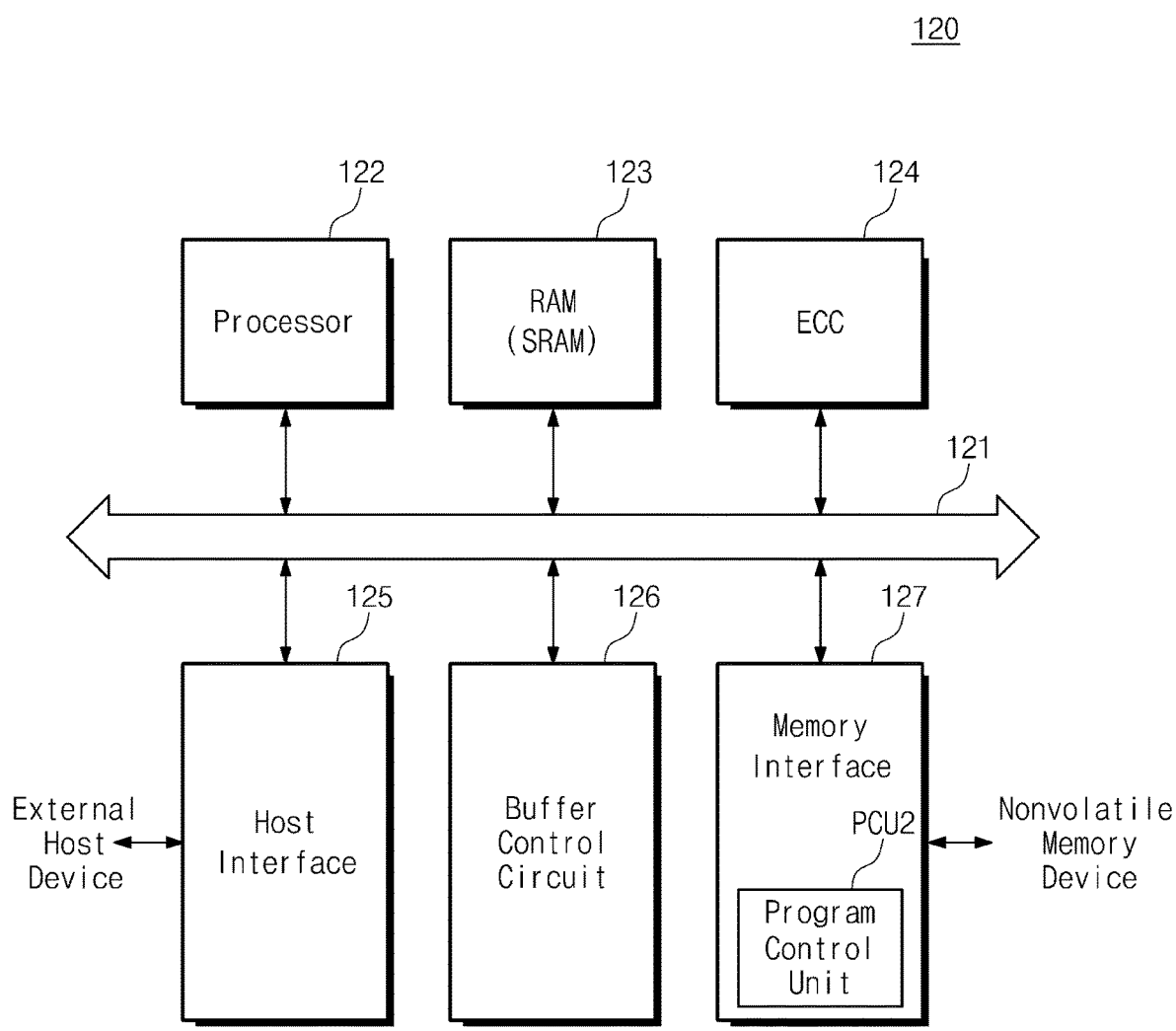
FIG. 49 is a block diagram illustrating a controller according to an embodiment of the disclosure.

FIG. 49 is a block diagram illustrating a controller 120 according to an embodiment of the disclosure. Referring to FIG. 49, the controller 120 may include a bus 121, a processor 122, a RAM 123, an ECC block 124, a host interface 125, a buffer control circuit 126, and a memory interface 127.

The bus 121 may be configured to provide a channel among components of the controller 120.

The processor 122 may control an overall operation of the controller 120 and may execute a logical operation. The processor 122 may communicate with an external host device through the host interface 125, may communicate with the nonvolatile memory device 110 through the memory interface 127, and may communicate with the RAM 130 through the buffer control circuit 126. The processor 122 may control the storage device 100 using the RAM 123 as a working memory, a cache memory, or a buffer memory.

The RAM 123 may be used as a working memory, a cache memory, or a buffer memory of the processor 122.

The error correction block 124 may perform an error correction operation. The ECC block 124 may perform error correction encoding based on data to be written at the nonvolatile memory device 110 through the memory interface 127. The ECC block 124 may perform error correction decoding on data received through the memory interface 127 from the nonvolatile memory package 110.

The host interface 125 may communicate with the external host device under control of the processor 122. The buffer control circuit 126 may control the RAM 130 under a control of the processor 122. The memory interface 127 may communicate with the nonvolatile memory device 110 in response to control of the processor 122. The memory interface 127 may include the program control unit PCU2 according to an embodiment of the disclosure. The program control unit PCU2 may control timing when a command, an address, or data is provided to the nonvolatile memory device 110 during a program operation. For example, the program control unit PCU2 may be configured to provide the nonvolatile memory device 110 with sequences as described with reference to FIGS. 5 and 6 or FIG. 17.

Figure 50:
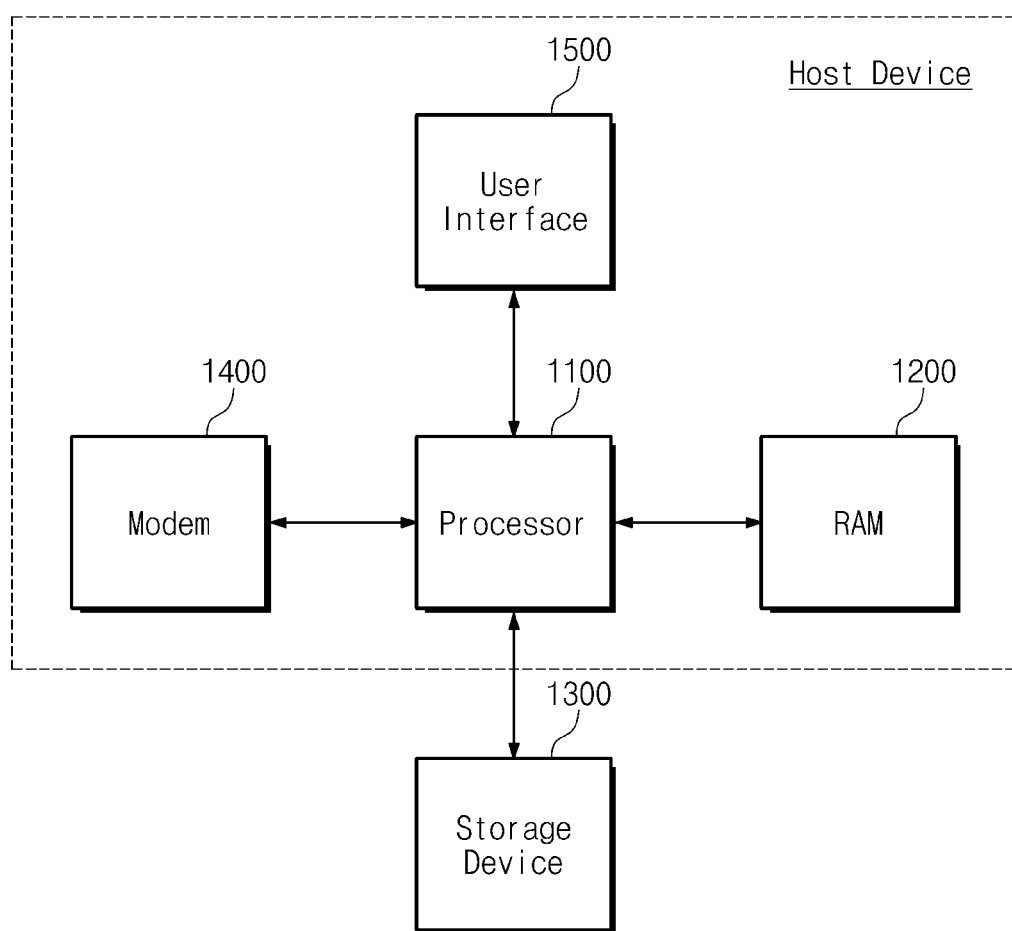
FIG. 50 is a block diagram illustrating a computing device according to an embodiment of the disclosure.

FIG. 50 is a block diagram illustrating a computing device 1000 according to an embodiment of the disclosure. Referring to FIG. 50, a computing device 1000 may include a processor 1100, a RAM 1200, a storage device 1300, a modem 1400, and a user interface 1500.

The processor 1100 may control an overall operation of the computing device 1000 and may perform a logical operation. The processor 1100 may be a hardware-based data processing device which includes a circuit physically configured to execute operations expressed by commands included in a code or program.

The RAM 1200 may communicate with the processor 1100. The RAM 1200 may be a main memory of the processor 1100 or the computing device 1000. The storage device 1300 may communicate with the processor 1100. The storage device 1300 may be used to store data for a long time.

The modem 1400 may communicate with an external device under control of the processor 1100. For example, the modem 1400 may communicate with the external device in a wired or wireless manner. The user interface 1500 may communicate with a user under control of the processor 1100.

The storage device 1300 may include one of the storage devices 100, 200, and 300 according to embodiments of the disclosure. The processor 1100, RAM 1200, modem 1400, and user interface 1500 may constitute a host device that communicates with the storage device.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A method for operating a nonvolatile memory device including memory cells and a page buffer connected to the memory cells, the method comprising:
receiving, by the nonvolatile memory device, a first data input command;
receiving, by the nonvolatile memory device, a first page data to store the first page data into first latches of the page buffer in response to the first data input command;
receiving, by the nonvolatile memory device, a dump command after receiving the first page data;
dumping, by the nonvolatile memory device, the first page data stored in the first latches into second latches of the page buffer while outputting a ready and busy signal indicating a busy state in response to the dump command;
adjusting the ready and busy signal to indicate a ready state after dumping the first page data;
receiving, by the nonvolatile memory device, a confirm command after adjusting the ready and busy signal to indicate the ready state;
applying, by the nonvolatile memory device, a first program pulse to the memory cells in response to the confirm command;

receiving, by the nonvolatile memory device, a second data input command while applying the first program pulse to the memory cells;

receiving, by the nonvolatile memory device, second page data in response to the second data input command to store the second page data into the first latches while applying the first program pulse to the memory cells; and applying, by the nonvolatile memory device, verification voltages to the memory cells while receiving the second page data.

2. The method of claim 1, further comprising:
maintaining, by the nonvolatile memory device, the applying the verification voltages to the memory cells to verify the memory cells based on the first page data and the second page data after receiving the second page data.

3. The method of claim 1, further comprising:
adjusting, by the nonvolatile memory device, the ready and busy signal to indicate the busy state and then ready state while applying the first program pulse to the memory cells.

4. The method of claim 1, further comprising:
dumping, by the nonvolatile memory device, a result of a verification of each of the verification voltages into the first latches and the second latched after receiving the second page data.

5. The method of claim 1, further comprising:
applying, by the nonvolatile memory device, a second program pulse to the memory cells after receiving the second page data; and applying, by the nonvolatile memory device, second verification voltages including the verification voltages to the memory cells after applying the second program pulse.

6. The method of claim 5, further comprising:
dumping, by the nonvolatile memory device, a result of a verification of the verification voltage to the first latches and the second latches after receiving the second page data.

7. The method of claim 1, further comprising:
applying, by the nonvolatile memory device, a second program pulse to the memory cells while receiving the second page data; and applying, by the nonvolatile memory device, second verification voltages including the verification voltages to the memory cells after applying the second program pulse.

8. The method of claim 1, further comprising:
receiving, by the nonvolatile memory device, a second dump command after receiving the second page data;
dumping, by the nonvolatile memory device, the second page data stored in the first latches into third latches of the page buffer.

9. The method of claim 8, further comprising:
receiving, by the nonvolatile memory device, a third data input command after dumping the second page data;
receiving, by the nonvolatile memory device, a third page data to store the third page data into the first latches in response to the third data input command; and
applying, by the nonvolatile memory device, second verification voltages to the memory cells to verify the memory cells based on the first page data, the second page data and the third page data after receiving the third page data.

10. The method of claim 9, further comprising:
adjusting, by the nonvolatile memory device, the ready and busy signal to the busy state and then the ready state after receiving the second page data; and
adjusting, by the nonvolatile memory device, the ready and busy signal to the busy state after receiving the third page data.

11. The method of claim 1, further comprising:
adjusting, by the nonvolatile memory device, the ready and busy signal to indicate the busy state after applying the first program pulse to the memory cells.

12. The method of claim 1, wherein the memory cells are to be programmed to a plurality of program states, and
a memory cell, among the memory cells, to be programmed to a program state among the plurality of program states are program-inhibited while applying the first program pulse to the memory cells.

13. The method of claim 1, wherein the first page data and the second page data are to be programmed to the memory cells during a single program operation for the memory cells responsive to the confirm command, and wherein the memory cells are to be programmed to two or more different program states higher than an erase state in threshold voltages.

14. The method of claim 1, further comprising:
biasing, by the nonvolatile memory device, bit lines connected to the memory cells based on the first page data before applying the first program pulse.

15. The method of claim 1, further comprising:
biasing, by the nonvolatile memory device, bit lines connected to the memory cells based on the first page data and the second page data after receiving the second page data.

16. A method for operating a nonvolatile memory device including memory cells and a page buffer connected to the memory cells, the method comprising: receiving a first data input command; receiving a first page data; storing the first page data in a first latches of the nonvolatile memory device; receiving a confirm command; applying a first program pulse to the memory cells after receiving the confirm command; receiving a second data input command while applying the first program pulse to the memory cells; receiving a second page data while applying the first program pulse to the memory cells; applying a verification voltage to the memory cells; and applying a second program pulse to the memory cells, wherein the memory cells are to be programmed to a plurality of program states, and a memory cell, among the memory cells, to be programmed to a program state among the plurality of program states are program-inhibited while applying the first program pulse to the memory cells.

17. The method of claim 16, further comprising:
storing the second page data stored in the first latches;
receiving a third data input command;
receiving a third page data; and
applying a third program pulse while receiving the third page data.

18. The method of claim 17, further comprising:
applying verification voltages including the verification voltage to the memory cells.

19. A method for operating a nonvolatile memory device including memory cells and a page buffer connected to the memory cells, the method comprising: receiving, by the nonvolatile memory device, a first data input command; receiving, by the nonvolatile memory device, a first page data to store the first page data into first latches of the page buffer in response to the first data input command; receiving, by the nonvolatile memory device, a first dump command after receiving the first page data; dumping, by the nonvolatile memory device, the first page data stored in the first latches into second latches of the page buffer while outputting a ready and busy signal indicating a busy state in response to the first dump command; adjusting the ready and busy signal to indicate a ready state after dumping the first page data; receiving, by the nonvolatile memory device, a confirm command after adjusting the ready and busy signal to indicate the ready state; applying, by the nonvolatile memory device, a first program pulse to the memory cells in response to the confirm command; adjusting, by the nonvolatile memory device, the ready and busy signal to indicate the busy state and then ready state while applying the first program pulse to the memory cells; receiving, by the nonvolatile memory device, a second data input command while applying the first program pulse to the memory cells after adjusting the ready and busy signal to indicate the busy state and then ready state; receiving, by the nonvolatile memory device, second page data in response to the second data input command to store the second page data into the first latches while applying the first program pulse to the memory cells; receiving, by the nonvolatile memory device, a second dump command after receiving the second page data; dumping, by the nonvolatile memory device, the second page data stored in the first latches into third latches of the page buffer in response to the second dump command; receiving, by the nonvolatile memory device, a third data input command after receiving the second page data; receiving, by the nonvolatile memory device, a third page data in response to the third data input command to store the third page data into the first latches while applying the first program pulse to the memory cells; applying, by the nonvolatile memory device, a verification voltage to the memory cells to verify the memory cells based on the first page data, the second page data and the third page data, wherein the memory cells are to be programmed to a plurality of program states, and a memory cell, among the memory cells, to be programmed to a program state among the plurality of program states are program-inhibited while applying the first program pulse to the memory cells.

20. The method of claim 19, further comprising:
adjusting, by the nonvolatile memory device, the ready and busy signal to the busy state and then the ready state after receiving the second page data; and
adjusting, by the nonvolatile memory device, the ready and busy signal to the busy state after receiving the third page data.

* * * * *